US007928933B2

(12) United States Patent
Kimura

(10) Patent No.: US 7,928,933 B2
(45) Date of Patent: Apr. 19, 2011

(54) SEMICONDUCTOR DEVICE AND DRIVING METHOD THEREOF

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 858 days.

(21) Appl. No.: 11/779,315

(22) Filed: Jul. 18, 2007

(65) Prior Publication Data
US 2007/0262978 A1 Nov. 15, 2007

Related U.S. Application Data

(63) Continuation of application No. 10/787,347, filed on Feb. 27, 2004, now Pat. No. 7,253,665.

(30) Foreign Application Priority Data

Feb. 28, 2003 (JP) ................................ 2003-055018

(51) Int. Cl.
G09G 3/30 (2006.01)
(52) U.S. Cl. .............. 345/76; 345/77; 345/82; 345/204; 313/483; 315/169.3
(58) Field of Classification Search .................... 345/76, 345/77, 82, 204; 313/483; 315/169.3; 327/108–112; 326/82–83
See application file for complete search history.

(56) References Cited

U.S. PATENT DOCUMENTS

| 5,877,654 | A | 3/1999 | Fong | |
|---|---|---|---|---|
| 6,229,506 | B1 | 5/2001 | Dawson | |
| 6,297,675 | B1 * | 10/2001 | Akamatsu et al. | ............ 327/108 |
| 6,373,454 | B1 | 4/2002 | Knapp | |
| 6,525,574 | B1 | 2/2003 | Herrera | |
| 6,633,136 | B2 | 10/2003 | Kim | |
| 6,710,995 | B2 | 3/2004 | Knoedgen | |
| 6,870,553 | B2 | 3/2005 | Kondo et al. | |
| 6,943,760 | B2 | 9/2005 | Bae et al. | |

(Continued)

FOREIGN PATENT DOCUMENTS
EP 1 103 946 5/2001
(Continued)

OTHER PUBLICATIONS

Supplementary European Search Report from related European Application No. 04713646.0 dated Oct. 29, 2008 (3 total pages).

(Continued)

Primary Examiner — Alexander Eisen
Assistant Examiner — Priyank Shah
(74) Attorney, Agent, or Firm — Fish & Richardson P.C.

(57) ABSTRACT

The invention provides a semiconductor device which performs a write operation of a signal current rapidly to a current input type pixel. Before inputting a signal current, a precharge operation is performed by flowing a large current. After that, a signal current is inputted to perform the set operation. A predetermined potential can be obtained rapidly as the precharge operation is performed before the set operation. The predetermined potential is approximately equal to a potential after completing the set operation. Therefore, the set operation can be rapidly performed and a write operation of a signal current can be rapidly performed. By using two transistors, a gate width W can be long or a gate length L can be short in the precharge operation or the gate width W can be short and the gate length L can be long in the set operation.

27 Claims, 79 Drawing Sheets

U.S. PATENT DOCUMENTS

| | | |
|---|---|---|
| 6,992,663 B2 | 1/2006 | Nakamura et al. |
| 7,154,454 B2 | 12/2006 | Okabe et al. |
| 7,193,619 B2 | 3/2007 | Kimura |
| 7,209,101 B2 | 4/2007 | Abe |
| 7,253,665 B2 * | 8/2007 | Kimura ............... 327/108 |
| 7,256,756 B2 | 8/2007 | Abe |
| 7,554,362 B2 * | 6/2009 | Kimura ............... 326/83 |
| 2002/0008543 A1 | 1/2002 | Nasu |
| 2002/0153844 A1 | 10/2002 | Koyama |
| 2002/0180369 A1 | 12/2002 | Koyama |
| 2002/0195964 A1 | 12/2002 | Yumoto |
| 2003/0016190 A1 | 1/2003 | Kondo |
| 2003/0020705 A1 | 1/2003 | Kondo et al. |
| 2003/0030382 A1 | 2/2003 | Koyama |
| 2003/0030602 A1 * | 2/2003 | Kasai ............... 345/76 |
| 2003/0062524 A1 | 4/2003 | Kimura |
| 2003/0128200 A1 | 7/2003 | Yumoto |
| 2004/0227749 A1 | 11/2004 | Kimura |
| 2005/0007181 A1 * | 1/2005 | Kimura ............... 327/524 |
| 2005/0052209 A1 | 3/2005 | Jacobs |
| 2005/0190177 A1 | 9/2005 | Yumoto |
| 2006/0187730 A1 | 8/2006 | Kimura |
| 2008/0197777 A1 | 8/2008 | Koyama |

FOREIGN PATENT DOCUMENTS

| | | |
|---|---|---|
| EP | 1 130 565 | 9/2001 |
| EP | 1598938 A | 11/2005 |
| JP | 2001-005426 | 1/2001 |
| JP | 2002-514320 | 5/2002 |
| JP | 2002-517806 | 6/2002 |
| KR | 2002-0046756 A | 6/2002 |
| WO | WO 01/06484 | 1/2001 |
| WO | WO 02/39420 | 5/2002 |
| WO | WO 02/075710 | 9/2002 |
| WO | WO 03/038793 | 5/2003 |
| WO | WO 03/038794 | 5/2003 |
| WO | WO 03/038795 | 5/2003 |
| WO | WO 03/038796 | 5/2003 |
| WO | WO 03/038797 | 5/2003 |

OTHER PUBLICATIONS

Office Action, Korean Application No. 2005-7015898; PCTKR07008, dated Aug. 24, 2010, 11 pages with English translation.

* cited by examiner

601 : Source Signsl Line
602 : 1st Gate Signal Line
603 : 2nd Gate Signal Line
604 : 3rd Gate Signal Line
605 : Current Supply Line
606~609: TFT
610 : Capacitor
611 : EL Element
612 : Current Source
 for Inputting
 a Signal Current (A) SIGNAL INPUTTING PERIOD (B) SIGNAL INPUTTING COMPLETED PERIOD (C) LIGHT EMITTING PERIOD

SEMICONDUCTOR DEVICE AND DRIVING METHOD THEREOF

TECHNICAL FIELD

The present invention relates to a semiconductor device provided with a function to control by a transistor a current to be supplied to a load, and more particularly to a semiconductor device including a pixel formed of a current drive type light emitting element which changes its luminance according to a current, and a signal line driver circuit thereof.

BACKGROUND ART

In recent years, a self-luminous type display device of which pixel is formed of a light emitting element such as a light emitting diode (LED) is attracting attention. As a light emitting element used in such a self-luminous type display device, an organic light emitting diode (OLED), an organic EL element, and an electroluminescence (EL) element are attracting attention and becoming to be used in an organic EL display and the like.

Being self-luminous type, such a light emitting element as an OLED has a high visibility of a pixel and provides a rapid response without a need of a backlight as compared to a liquid crystal display. Further, the luminance of a light emitting element is controlled by a current value flowing through it.

In a display device using such a self-luminous light emitting element, a passive matrix method and an active matrix method are known as its driving method. The former has a simple structure, but has a problem such that a realization of a large and high definition display is difficult. Therefore, the active matrix method is actively developed in recent years in which a current flowing to the light emitting element is controlled by a thin film transistor (TFT) provided in a pixel circuit.

In the case of a display device of the active matrix method, there is a problem that a current flowing to a light emitting element varies due to a variation in current characteristics of driving TFTs, which varies a luminance.

That is, in the case of a display device of the active matrix method, a driving TFT which drives a current flowing to the light emitting element is used in a pixel circuit. When characteristics of these driving TFTs vary, a current flowing to the light emitting element varies, which varies a luminance. Then, various circuits are suggested in which a current flowing to a light emitting element does not vary even when characteristics of driving TFTs in a pixel circuit vary to suppress a variation in luminance.

[Patent Document 1]
Published Japanese Translation of PCT International Publication for Patent Application No. 2002-517806
[Patent Document 2]
International Publication WO01/06484
[Patent Document 3]
Published Japanese Translation of PCT International Publication for Patent Application No. 2002-514320
[Patent Document 4]
International Publication WO02/39420

Patent Documents 1 to 4 all disclose a structure of an active matrix type display device. Patent Documents 1 to 3 disclose a circuit configuration in which a current flowing to a light emitting element does not vary due to a variation in characteristics of driving TFTs arranged in a pixel circuit. This configuration is referred to as a current write type pixel or a current input type pixel. Patent Document 4 discloses a circuit configuration for suppressing variations of a signal current due to variations of TFTs in a source driver circuit.

FIG. 6 shows a first configuration example of a conventional active matrix type display device disclosed in Patent Document 1. The pixel shown in FIG. 6 comprises a source signal line 601, first to third gate signal lines 602 to 604, a current supply line 605, TFTs 606 to 609, a capacitor 610, an EL element 611, and a current source 612 for inputting a signal current.

A gate electrode of the TFT 606 is connected to the first gate signal line 602, a first electrode thereof is connected to the source signal line 601, and a second electrode thereof is connected to a first electrode of the TFT 607, a first electrode of the TFT 608, and a first electrode of the TFT 609. A gate electrode of the TFT 607 is connected to the second gate signal line 603 and a second electrode thereof is connected to a gate electrode of the TFT 608. A second electrode of the TFT 608 is connected to the current supply line 605. A gate electrode of the TFT 609 is connected to the third gate signal line 604 and a second electrode thereof is connected to an anode of the EL element 611. The capacitor 610 is connected between the gate electrode of the TFT 608 and the current supply line 605 and holds a gate-source voltage of the TFT 608. The current supply line 605 and a cathode of the EL element 611 are inputted with predetermined potentials respectively and have a potential difference to each other.

An operation from a write of a signal current to a light emission is described with reference to FIG. 7. Reference numerals denoting each portion in the drawing corresponds to those in FIG. 6. FIGS. 7(A) to 7(C) each schematically shows a current flow. FIG. 7(D) shows a relationship of a current flowing each path when writing a signal current. FIG. 7(E) shows a voltage accumulated in the capacitor 610 when writing a signal current, that is a gate-source voltage of the TFT 608.

First, a pulse is inputted to the first gate signal line 602 and the second gate signal line 603 and the TFTs 606 and 607 are turned ON. At this time, a current flowing through the source signal line, that is a signal current is denoted as Idata.

As the current Idata flows through the source signal line, the current path is divided into I1 and I2 as shown in FIG. 7(A). These relationships are shown in FIG. 7(D). It is needless to say that Idata=I1+I2 is satisfied.

A charge is not held in the capacitor 610 at the moment the TFT 606 is turned ON, therefore, the TFT 608 is OFF. Therefore, I2=0 and Idata=I1 are satisfied. In other words, current only flows into the capacitor 610 to be accumulated in the meantime.

After that, as the charge is gradually accumulated in the capacitor 610, a potential difference starts to generate between both electrodes (FIG. 7(E)). When the potential difference between the both electrodes reaches Vth (a point A in FIG. 7(E)), the TFT 608 is turned ON and I2 generates. As described above, as Idata=I1+I2 is satisfied, current still flows and a charge is accumulated in the capacitor while I1 decreases gradually.

The charge keeps being accumulated in the capacitor 610 until the potential difference between the both electrodes, that is a gate-source voltage of the TFT 608 reaches a desired voltage, that is a voltage (VGS) which can make the TFT 608 flow the current Idata. When the charge stops being accumulated (a point B in FIG. 7(E)), the current I1 stops flowing and the TFT 608 flows a current corresponding to VGS at that time and Idata=I2 is satisfied (FIG. 7(B)). Thus, a write operation of a signal is terminated. At last, selections of the first gate signal line 602 and the second gate signal line 603 are terminated to turn OFF the TFTs 606 and 607.

Subsequently, a light emitting operation starts. A pulse is inputted to the third gate signal line 604 to turn ON the TFT 609. As the capacitor 610 holds VGS which is written before, the TFT 608 is ON and the current Idata flows from the current supply line 605. Thus, the EL element 611 emits light. Provided that the TFT 608 is set to operate in a saturation region, Idata keeps flowing without changing even when a source-drain voltage of the TFT 608 changes.

In this manner, an operation to output a set current is hereinafter referred to as an output operation. As a merit of the current write type pixel of which example is shown above, a desired current can be accurately supplied to an EL element because a gate-source voltage required to flow the current Idata is held in the capacitor 610 even when the TFTs 608 have variations in characteristics and the like. Therefore, a luminance variation due to the variations in characteristics of TFTs can be suppressed.

The aforementioned examples relate to a technology for correcting a change of current due to variations of driving TFTs, however, the same problem occurs in a source driver circuit as well. Patent Document 4 discloses a circuit configuration for preventing a change of a signal current due to variations of the TFTs in the source driver circuit generated in fabrication.

DISCLOSURE OF THE INVENTION

Problems to be Solved by the Invention

In this manner, a conventional current drive circuit and a display device using it have configurations such that a signal current and a current for driving a TFT, or a signal current and a current which flows to a light emitting element when it emits light are equal to each other or in proportion to each other.

Therefore, in the case where a drive current of a driving TFT for driving a light emitting element is small or the case of performing a display of a dark gray scale by a light emitting element, the signal current becomes small proportionately. Therefore, as a parasitic capacitance of a wiring used for supplying a signal current to a driving TFT and a light emitting element is quite large, there is a problem that a time constant of charging the parasitic capacitance becomes large when the signal current is small and a signal write speed becomes slow. That is, when a current is supplied to a transistor, a problem is that a speed at which a voltage required for the transistor to flow the current generates at a gate terminal becomes slow.

The invention is made in view of the aforementioned problems and provides a current drive circuit which is capable of improving a write speed of a signal and an element drive speed even when a signal current is small, and a display device using it.

Means for Solving the Problems

According to the invention, in order to complete the set operation rapidly, a potential of a gate terminal of a transistor is set to be a predetermined potential in advance before performing the set operation. The predetermined potential is approximately equal to a potential obtained when the set operation is completed (when a steady state is obtained). Therefore, the set operation can be performed rapidly. Note that the set operation in the invention is an operation for supplying a current to a transistor and generating at a gate terminal thereof a voltage required for the transistor to flow the current.

Further, an operation for making a potential of a gate terminal of a transistor to be a predetermined potential so that the set operation is completed rapidly is referred to as a precharge operation, and a circuit having such a function is referred to as a precharge means.

The invention is a semiconductor device having a transistor for supplying a first current to a load and a precharge means for setting a potential of a gate terminal of the transistor at a predetermined potential by flowing a second current to the transistor.

That is to say, in the case of performing a set operation to the transistor, a steady state is not easily obtained and a write operation of a current is not completed when a current value is small. Then, a precharge operation is performed before performing the set operation. By performing the precharge operation, a potential which is approximately equal to a potential when the steady state is obtained after performing the set operation. That is, a potential of a gate terminal of the transistor is rapidly charged by performing the precharge operation. Therefore, by performing the set operation after the precharge operation, the operation can be completed more rapidly.

Note that the precharge operation is performed by flowing a larger current than that in the set operation. Therefore, a potential of a gate terminal of the transistor is rapidly charged.

The invention provides a semiconductor device comprising a display element, a transistor for supplying a current to the light emitting element and a precharge means for making a potential of a gate terminal of the transistor at a predetermined potential.

A semiconductor device wherein the signal line driving circuit comprises a transistor, and a precharge means for making a potential of a gate terminal of the transistor at a predetermined potential. The invention provides a semiconductor device comprising a signal line driver circuit comprising a signal line, a transistor for supplying a current to the signal line, and a precharge means for making a potential of a gate terminal of the transistor at a predetermined potential.

Furthermore, the invention is a semiconductor device having the steps of supplying a first current to a transistor for supplying a current to a load and generating at a gate terminal thereof a voltage required for the transistor to flow the first current, and then supplying a second current to the transistor and generating at a gate terminal thereof a voltage required for the transistor to flow the second current.

Further, the invention is a semiconductor device having the steps of making a potential of a gate terminal of a transistor for supplying a current to a load at a predetermined potential that the transistor can be a steady state, and then supplying a current to the transistor and generating at a gate terminal thereof a voltage required for the transistor to flow the current.

The invention is a semiconductor device according to the aforementioned configuration in which the first current is larger than the second current.

Note that a kind of a transistor which is applicable to the invention is not limited. For example, it may be a thin film transistor (TFT).

It may be a TFT of which semiconductor layer is amorphous, polycrystal, or single crystal. As other transistors, it may be a transistor formed on a single crystalline substrate, a transistor formed on an SOI substrate, a transistor formed on a glass substrate, a transistor formed on a plastic substrate, or a transistor formed on any substrates. Besides, it may be a transistor formed of organic material or carbon nanotube. It may be a MOS transistor or a bipolar transistor.

Note that a connection means an electrical connection in the invention. Therefore, other elements, a switch and the like may be disposed in-between.

EFFECT OF THE INVENTION

According to the invention, the precharge operation is performed before the set operation. Therefore, the set operation can be performed rapidly even with a small current value. Accordingly, an accurate current can be outputted in the output operation.

BEST MODE FOR CARRYING OUT THE INVENTION

Although the present invention will be described by way of example with reference to the accompanying drawings, it is to be understood that various changes and modifications will be apparent to those skilled in the art. Therefore, unless such changes and modifications depart from the scope of the present invention, they should be construed as being included therein.

Embodiment Mode 1

The invention can be applied not only to a pixel having a light emitting element such as an EL element, but to various analog circuits having a current source. First, in this embodiment mode, a basic principle of the invention is described.

Figure 1:
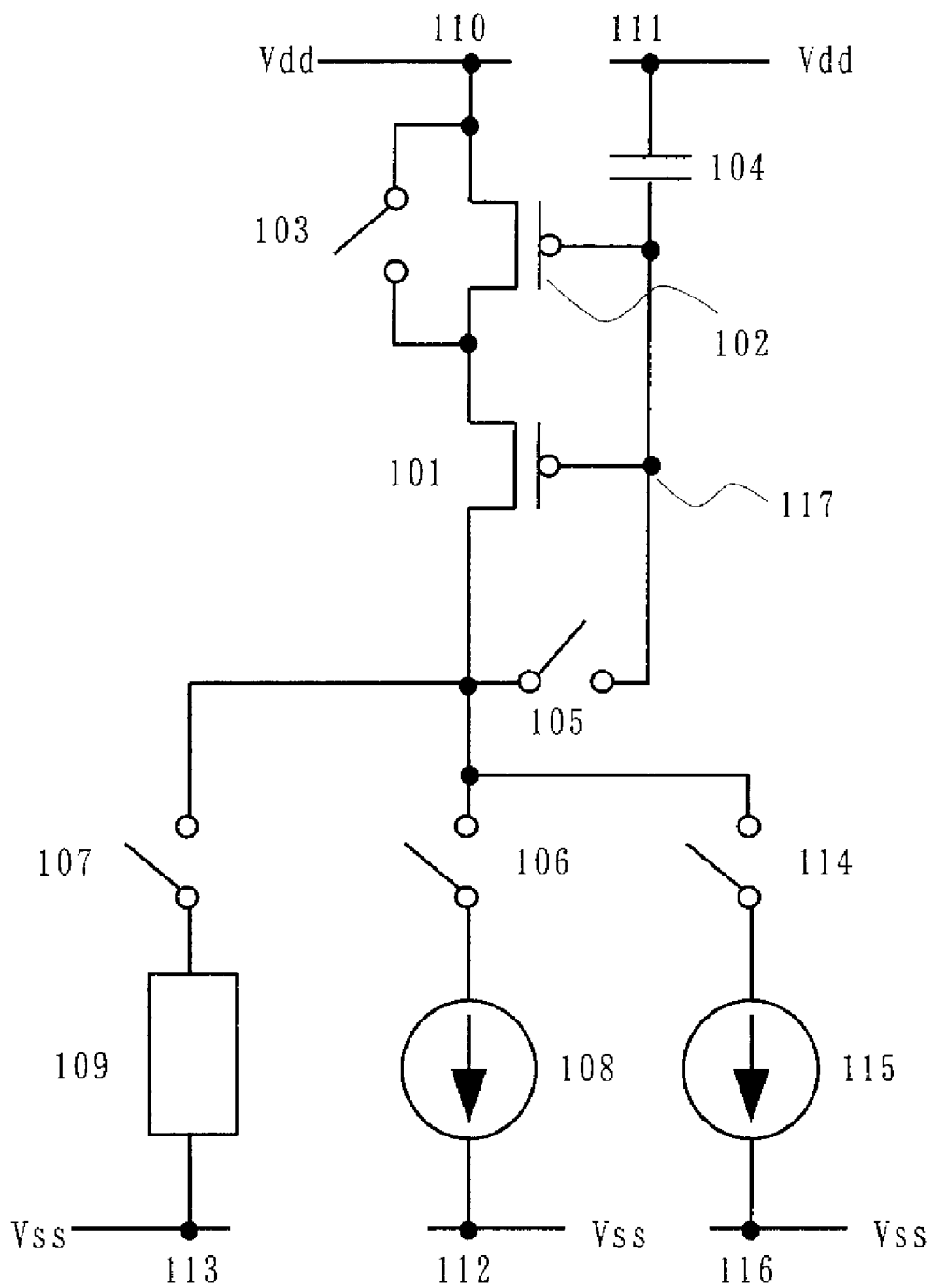
FIG. 1 is a diagram showing a configuration of the current source circuit of the invention.

First, FIG. 1 shows a configuration of the current source circuit based on the basic principle of the invention. A current source transistor 101 which constantly operates as a current source (or a part of it) and a switching transistor 102 of which operation changes according to the circumstance of a circuit are provided, and the current source transistor 101, the switching transistor 102, and a wiring 110 are connected in series.

A gate terminal of the current source transistor 101 is connected to one terminal of a capacitor 104. The other terminal of the capacitor 104 is connected to a wiring 111. Therefore, it is possible to hold a potential of the gate terminal of the current source transistor 101. Further, the gate terminal and a drain terminal of the current source transistor 101 are connected to each other via a switch 105 and the capacitor 104 can be controlled to hold a charge by ON/OFF of the switch 105. The current source transistor 101 and a wiring 112 are connected to each other via a basic current source 108 and a switch 106. In parallel with the aforementioned, the current source transistor 101 and a wiring 116 are connected to a second basic current source 115 via a switch 114. Similarly, in parallel with the aforementioned, the current source transistor 101 and a wiring 113 are connected to each other via a load 109 and a switch 107.

Further, the switching transistor 102 is connected to a means for switching to operate as a current source (or a part of it) or to operate not to flow a current between a source and drain thereof (or to operate as a switch) according to the circumstance. Here, the case where the switching transistor 102 operates as a current source (or a part of it) is referred to as a current source operation. Moreover, the case where the switching transistor 102 operates not to flow a current between the source and drain thereof (or the case of operating as a switch) or the case of operating with a small source-drain voltage is referred to as a short-circuit operation.

In order to perform the current source operation and the short-circuit operation to the switching transistor 102, various configurations can be employed.

In this embodiment mode, FIG. 1 shows a configuration example. In FIG. 1, the source terminal and the drain terminal of the switching transistor 102 are designed to be connected via a switch 103. Then, the gate terminal of the switching transistor 102 is connected to the gate terminal of the current source transistor 101. The operation of the switching transistor 102 can be switched between the current source operation and the short-circuit operation by using the switch 103.

By using a circuit having such a configuration as FIG. 1, the precharge operation can be performed. Therefore, by performing the set operation after performing the precharge operation, a steady state can be obtained rapidly. That is, the set operation can be completed rapidly.

Figure 2:
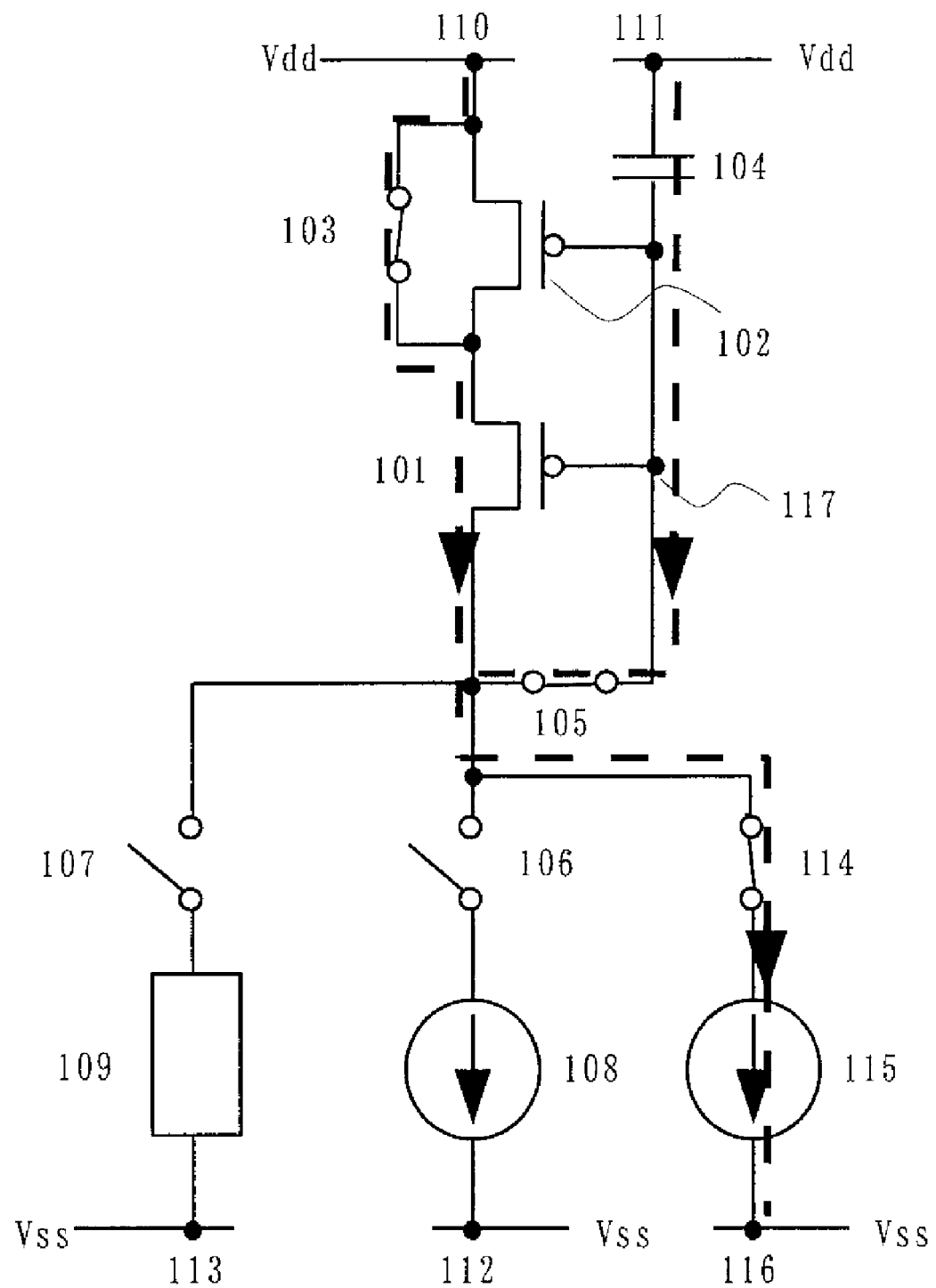
FIG. 2 is a diagram showing an operation of the current source circuit of the invention.

The operation of FIG. 1 is described now. First, the switches 103, 105 and 114 are turned ON and the switches 107 and 106 are turned OFF as shown in FIG. 2. Then, the source terminal and the drain terminal of the switching transistor 102 have approximately the same potentials. That is to say, hardly any current flows between the source and drain of the switching transistor 102 while a current flows to the switch 103. Therefore, a current Ib2 of the second basic current source 115 flows to the capacitor 104 or the current source transistor 101. Then, the current stops flowing to the capacitor 104 when the current flowing between the source and drain of the current source transistor 101 and the current Ib2 of the second basic current source 115 become equal. That is, a steady state is obtained. The potential of the gate terminal at that time is accumulated in the capacitor 104. That is, a voltage required to flow the current Ib2 between the source and drain of the current source transistor 101 is applied to the gate terminal. The aforementioned operation corresponds to a precharge operation. At that time, the switching transistor 102 performs the short-circuit operation.

Figure 3:
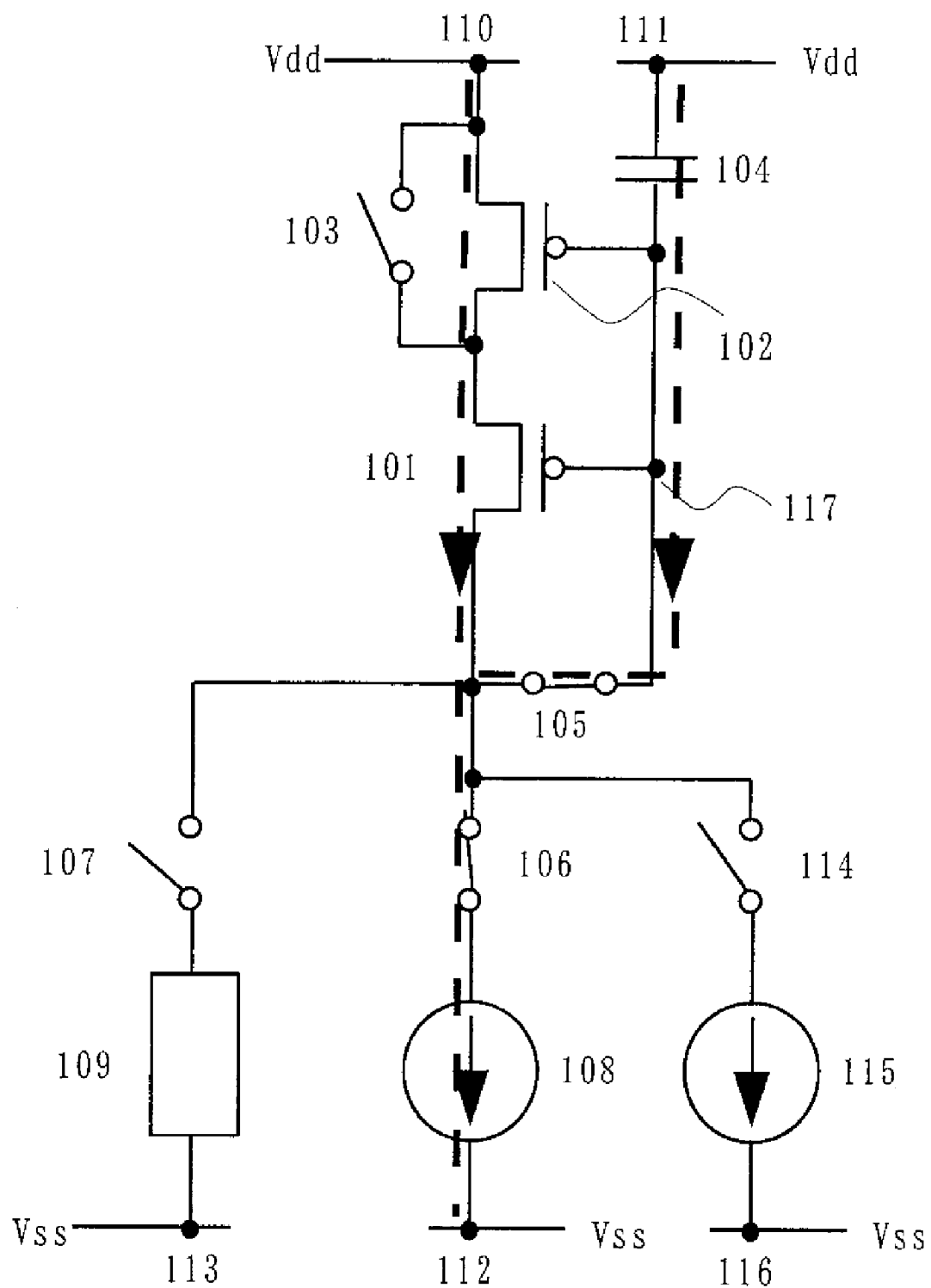
FIG. 3 is a diagram showing an operation of the current source circuit of the invention.

Next, the switches 105 and 106 are turned ON and the switches 103, 107, and 114 are turned OFF as shown in FIG. 3. Then, a current flows between the source and drain of the switching transistor 102 as the switch 103 is OFF. Therefore, a current Ib1 of the basic current source 108 flows to the capacitor 104, the current source transistor 101, and the switching transistor 102. At this time, gate terminals of the current source transistor 101 and the switching transistor 102 are connected to each other. Therefore, they operate together as a multi-gate transistor. A gate length L of the multi-gate transistor is longer than L of the current source transistor 101. Generally, as the gate length L of a transistor becomes longer, a current flowing through it becomes smaller.

When the current flowing between the source and drain of the multi-gate transistor and the current Ib1 of the basic current source 108 become equal, a current stops flowing to the capacitor 104. That is, a steady state is obtained. A potential of the gate terminal at that time is accumulated in the capacitor 104. That is, a voltage required to flow the current Ib1 between the source and drain of the multi-gate transistor (current source transistor 101 and the switching transistor 102) is applied to the gate terminal. The aforementioned operation corresponds to the set operation. At that time, the switching transistor 102 performs the current source operation.

Note that a charge accumulated in the capacitor 104, that is a potential of the gate terminal of the current source transistor 101 is set to be approximately equal voltage in the precharge operation and the set operation by appropriately setting the current Ib1 of the basic current source 108, the current Ib2 of the second basic current source 115, and transistor size (gate width, gate length and the like) of the current source transistor 101 and the switching transistor 102.

Then, in the case where the current Ib2 of the second basic current source 115 has a larger current value than the current Ib1 of the basic current source 108, the capacitor 104 can be charged rapidly by the precharge operation and the steady state can be obtained. After that, even when the current Ib1 of the basic current source 108 is small in the set operation, the steady state can be obtained rapidly. This is because the capacitor 104 is almost charged by the precharge operation.

Figure 4:
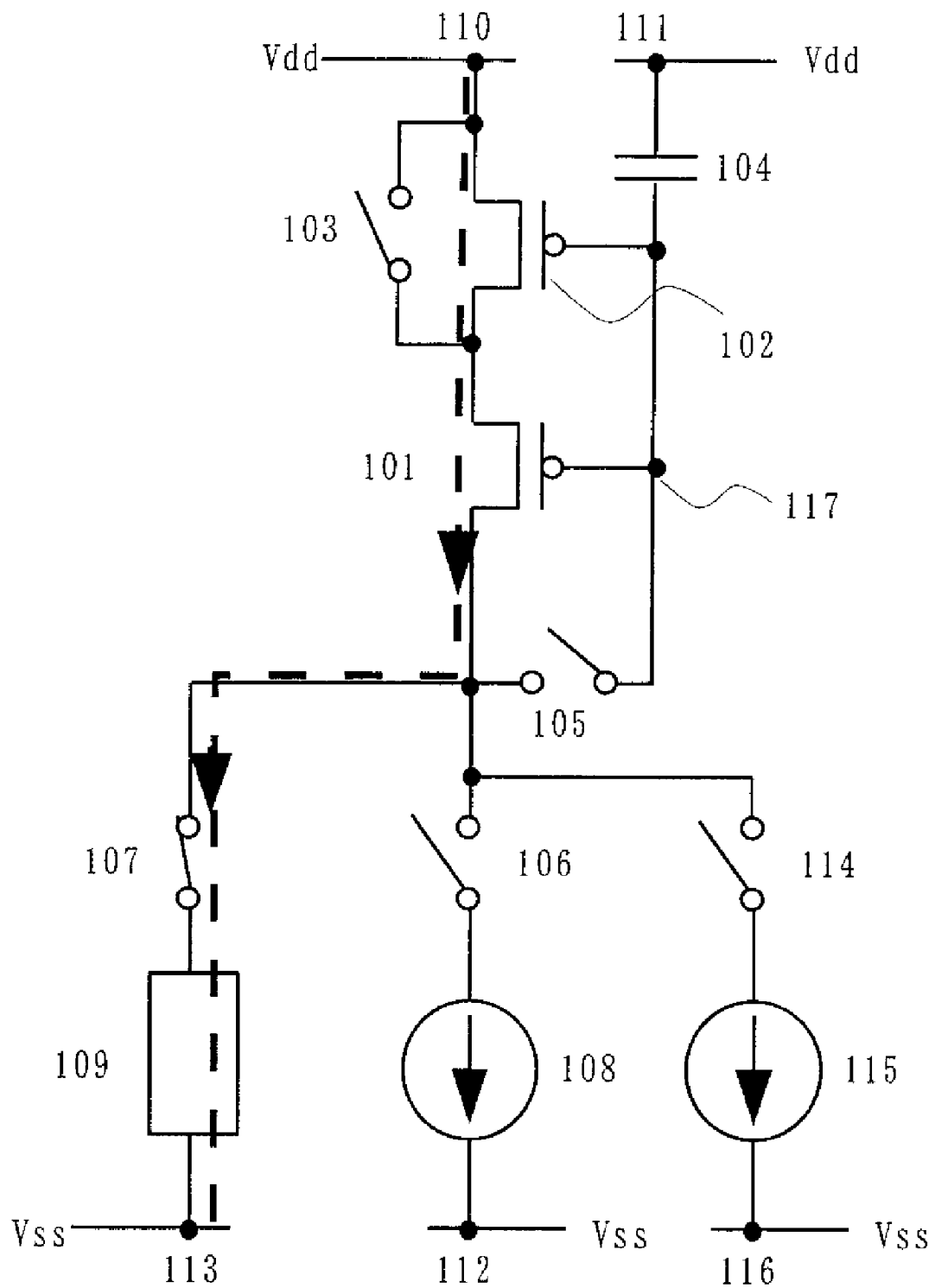
FIG. 4 is a diagram showing an operation of the current source circuit of the invention.

Next, the switches 103, 105, 106, and 114 are turned OFF and the switch 107 is turned ON as shown in FIG. 4. Then, a current flows to the load 109. The aforementioned operation corresponds to an output operation.

In this manner, by controlling ON/OFF of the switch 103, a current flowing in the precharge operation can be large, which enables the steady state to be obtained rapidly. That is to say, an effect of a load which is parasitic on a wiring through which a current flows (wiring resistance, intersection capacitance and the like) is lessened and the steady state can be obtained rapidly. At that time, almost the same state is already obtained as that in the set operation. Therefore, the steady state can be rapidly obtained in the set operation after the precharge operation.

Therefore, for example, provided that the load 109 is an EL element, a signal can be written rapidly when writing a signal in the case where the EL element emits light in a low gray scale, that is the case where a current value is small in the set operation.

Figure 5:
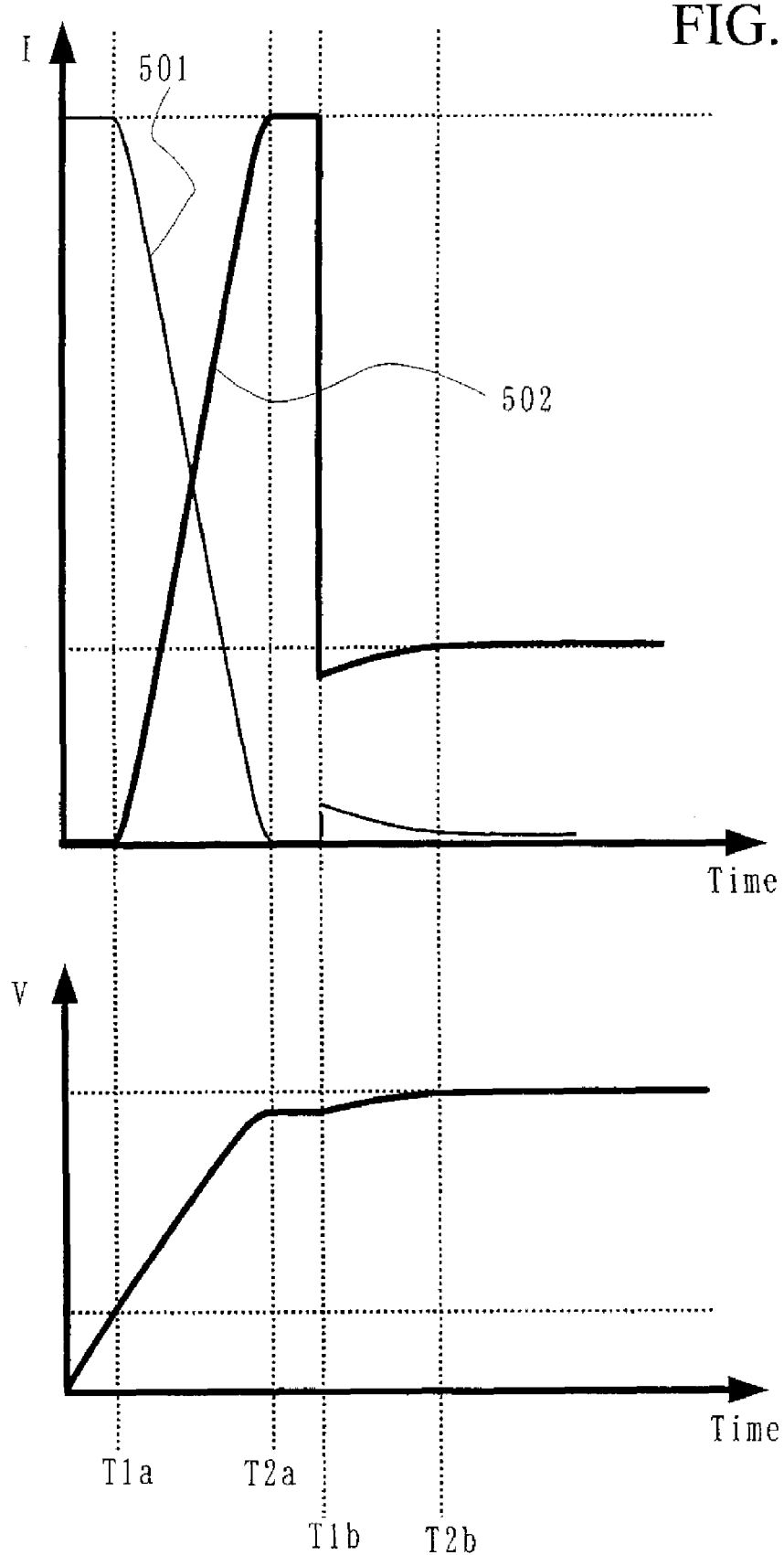
FIG. 5 is a diagram showing a change with time of a current and a voltage of the current source circuit of the invention.
Figure 6:
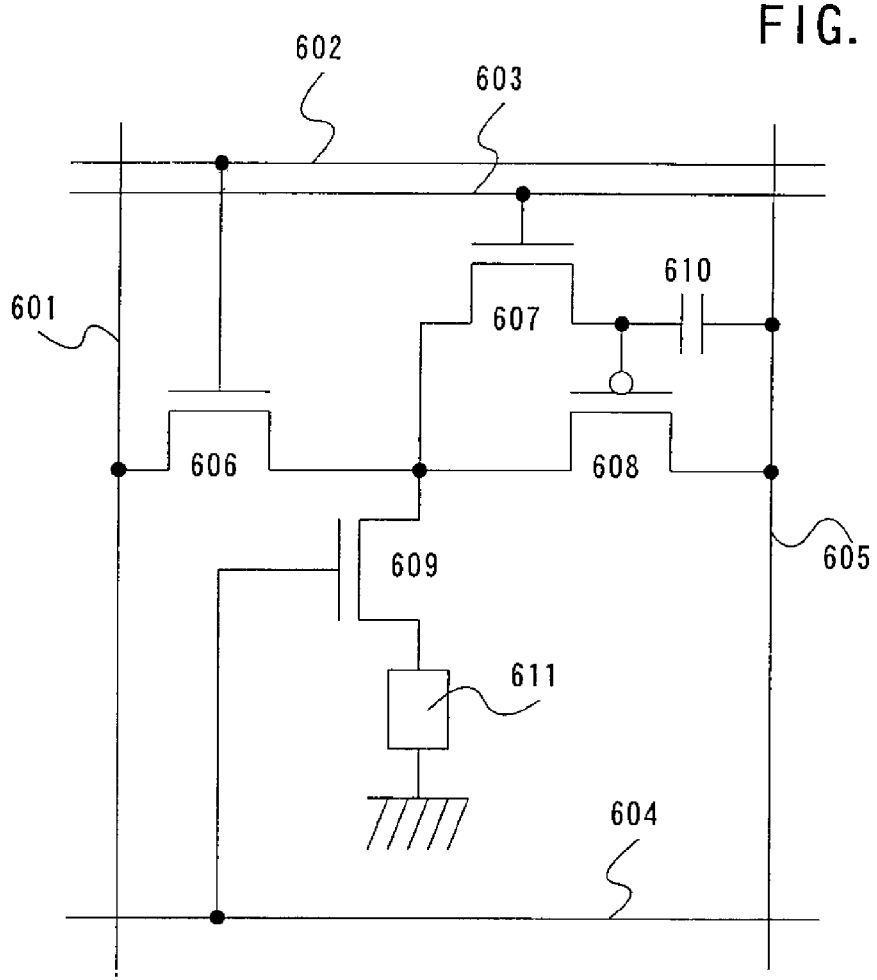
FIG. 6 is a diagram showing a configuration of a conventional pixel.
Figure 6:
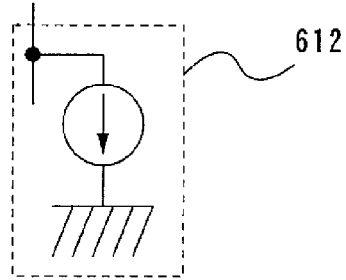
Figure 7:
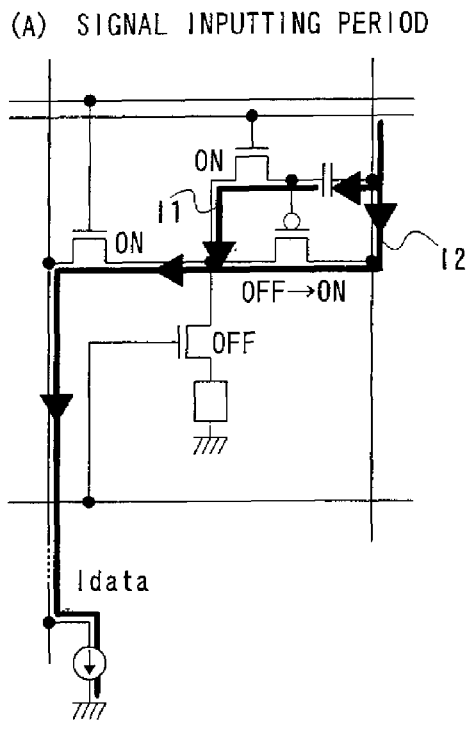
FIGS. 7(A) to 7(E) show diagrams showing configurations of a conventional pixel.
Figure 7:
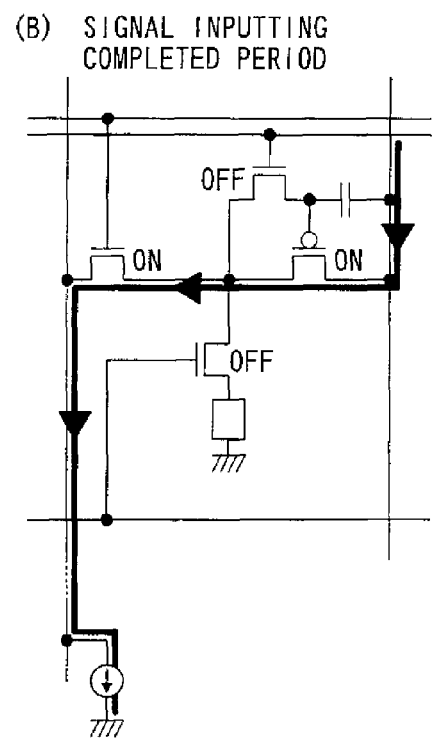
Figure 7:
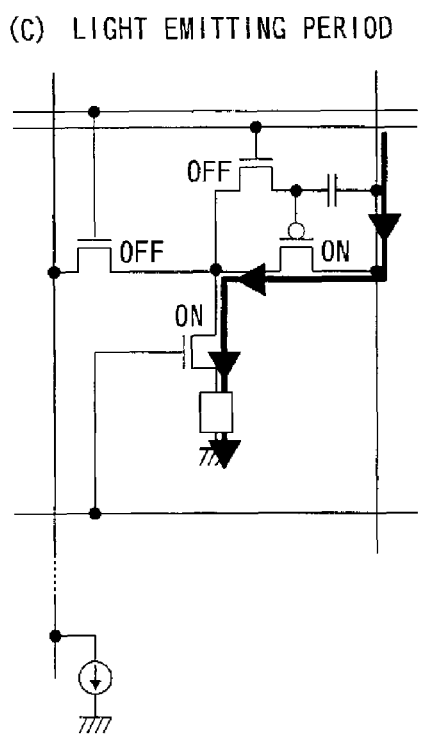
Figure 7:
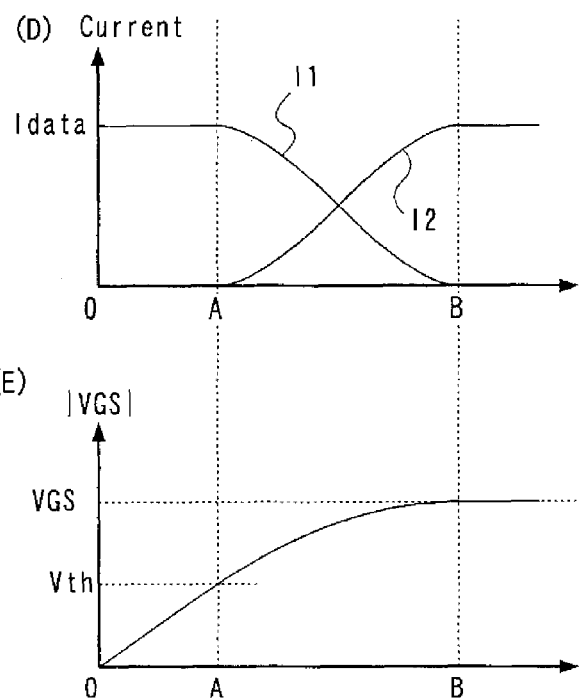

Next, a change of a current and a voltage in the aforementioned operation is shown in FIG. 5. FIG. 5 shows time by the abscissa, and a current (I) and a voltage (V) by the ordinate similarly to FIGS. 7(D) and 7(E). A graph 501 shows an amount of a current $I_1$ which flows to the capacitor 104 and the like while a graph 502 shows an amount of a current $I_2$ which flows to the current source transistor 101.

An operation as shown in FIG. 2 is performed up to a time T1b, which is the precharge operation. Then, an operation as shown in FIG. 3 is performed from a time T1b up to a time T2b, which is the set operation.

In FIG. 5, when the precharge operation is performed, a steady state is obtained in a time T2a. Further, when the set operation is performed, a steady state is obtained in a time T2b. Therefore, provided that the size (gate width W and gate length L) of each transistor is designed so that a potential of the gate terminal of the current source transistor 101 is set to be approximately equal to a potential in the time T2b, the set operation can be performed rapidly.

Now, a condition whereby the voltage accumulated in the capacitor 104, that is the potential of the gate terminal of the current source transistor 101 becomes approximately equal in the precharge operation and the set operation is described. First, it is assumed that a gate width of the current source transistor 101 is Wa, a gate length thereof is La, and a gate width of the switching transistor 102 is Wb, and a gate length thereof is Lb. Note that Wa=Wb is satisfied here for simplicity. It is assumed that the current flowing in the set operation (the current Ib of the basic current source 108 in FIG. 3) times A equals to the current flowing in the precharge operation (the current Ib2 of the second basic current source 115 in FIG. 2).

Generally, a current flowing between a source and drain of a transistor is in proportion to a ratio of a channel width and a channel length: W/L. Therefore, a ratio of a gate width and a gate length: Wa/La in the precharge operation and a ratio of a gate width and a gate length: Wa/(La+Lb) in the set operation are considered. Then, the current Ib1 of the basic current source 108 times A equals to the current Tb2 of the second basic current source 115, therefore, each value may be set so that Wa/(La+Lb) times A equals to Wa/La. Accordingly, provided that current characteristics of the current source transistor 101 and the switching transistor 102 are approximately the same, a potential of the gate terminal of the current source transistor 101 becomes approximately equal to the potential in the time T2b.

In FIG. 5, the potential of the gate terminal of the current source transistor 101 in the time T2a is shown so as to have a difference from that in the time T2b, however, this is shown for the purpose of making the description easy to understand. Therefore, it is not limited to FIG. 5.

Figure 8:
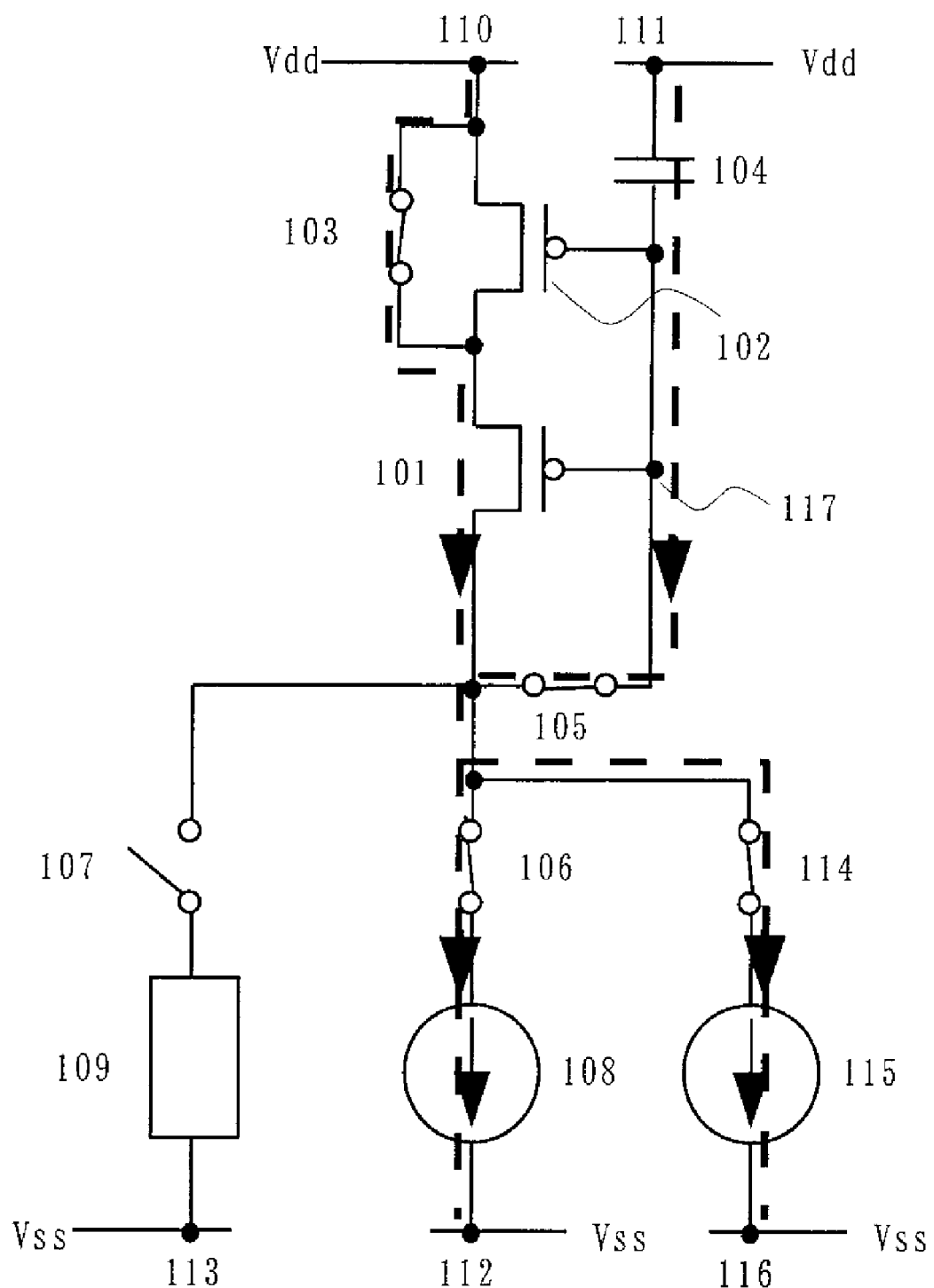
FIG. 8 is a diagram showing an operation of the current source circuit of the invention.

Note that in FIG. 2 the switches 103, 105 and 114 are turned ON and the switches 107 and 106 are turned OFF in the precharge operation, and a current of the second basic current source 115 flows and a current of the basic current source 108 does not flow, however, the invention is not limited to this. For example, as shown in FIG. 8, the switches 103, 105, 114, and 106 may be turned ON and the switch 107 may be turned OFF to flow currents of the second basic current source 115 and of the basic current source 108.

Figure 9:
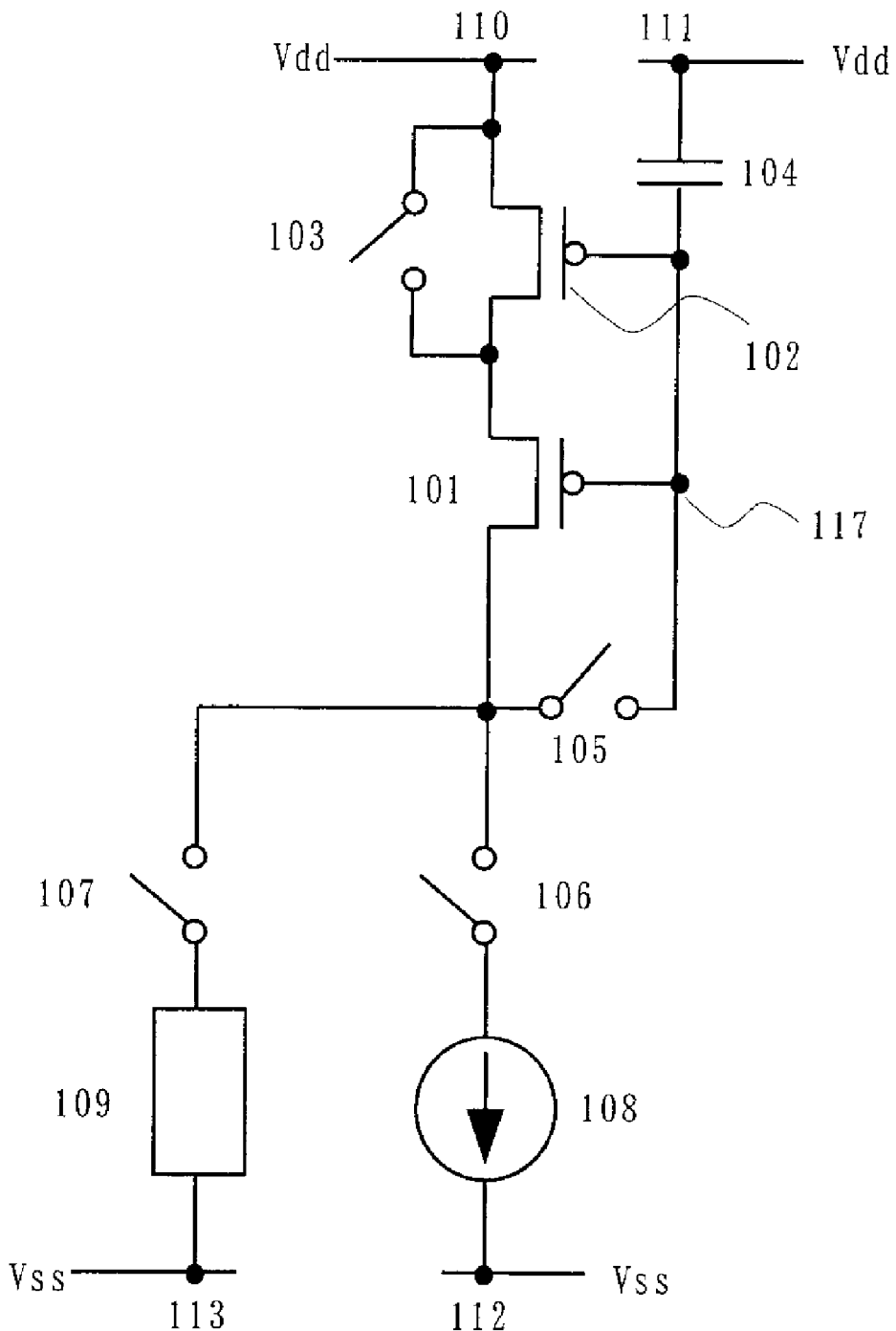
FIG. 9 is a diagram showing a configuration of the current source circuit of the invention.
Figure 10:
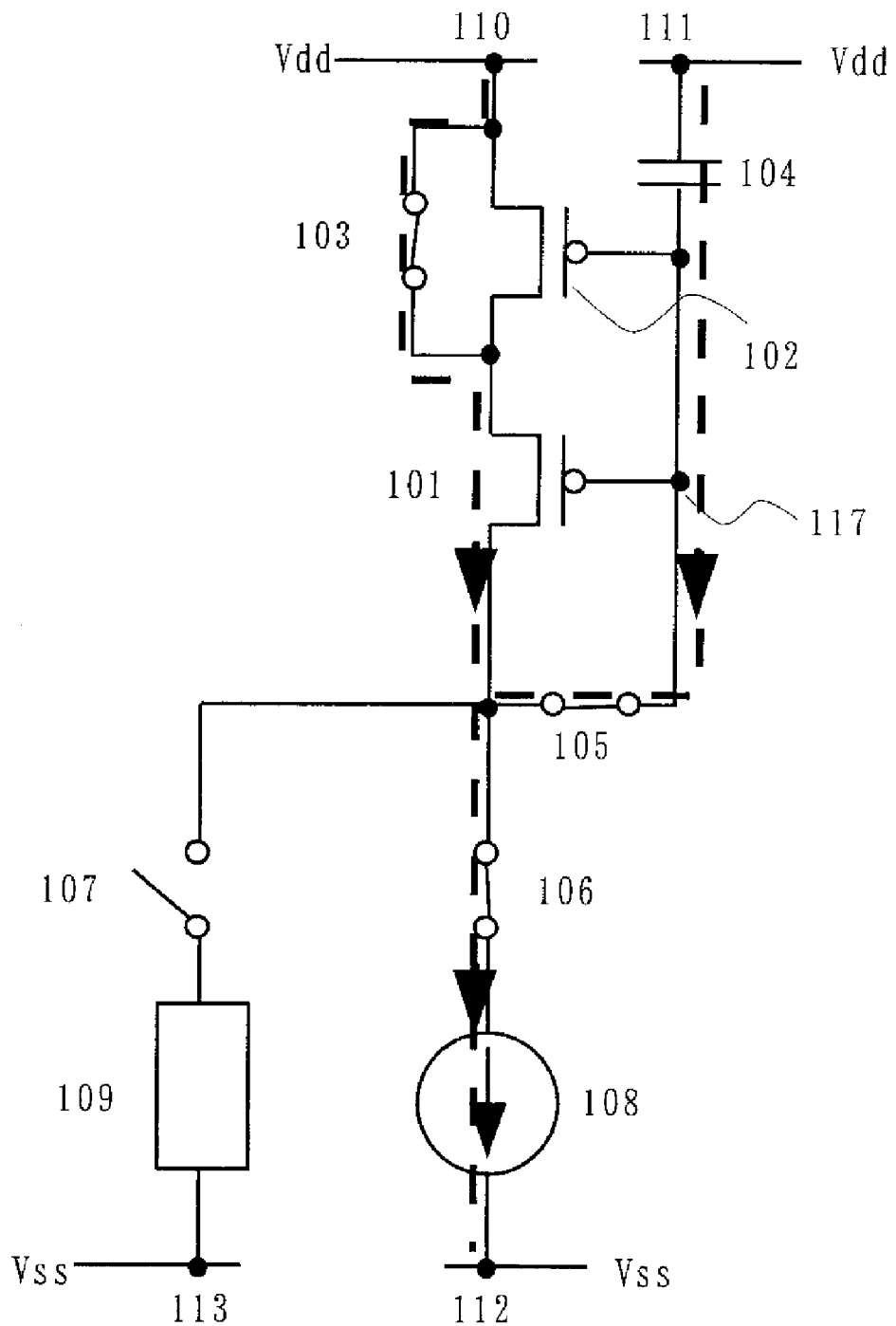
FIG. 10 is a diagram showing an operation of the current source circuit of the invention.
Figure 11:
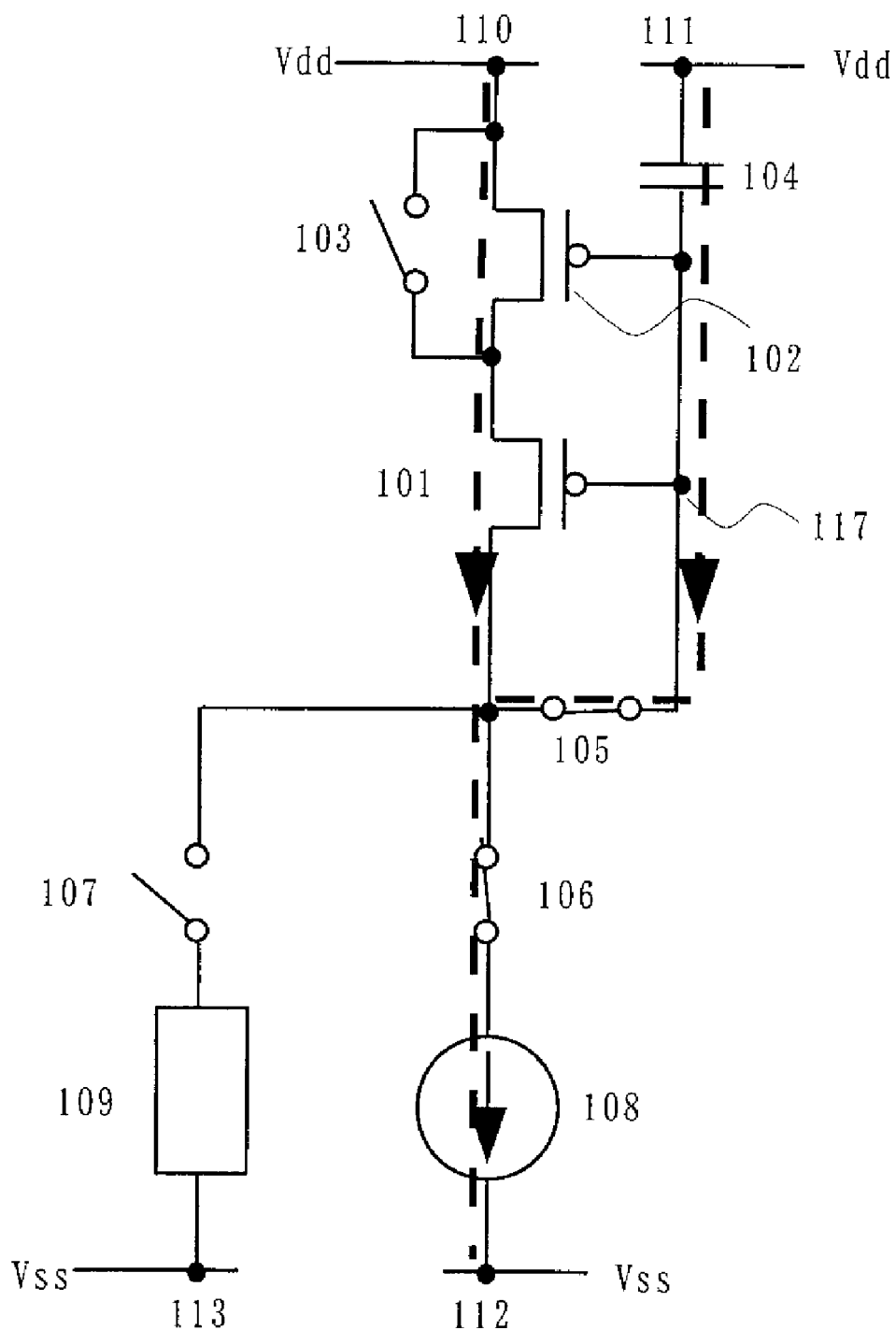
FIG. 11 is a diagram showing an operation of the current source circuit of the invention.
Figure 12:
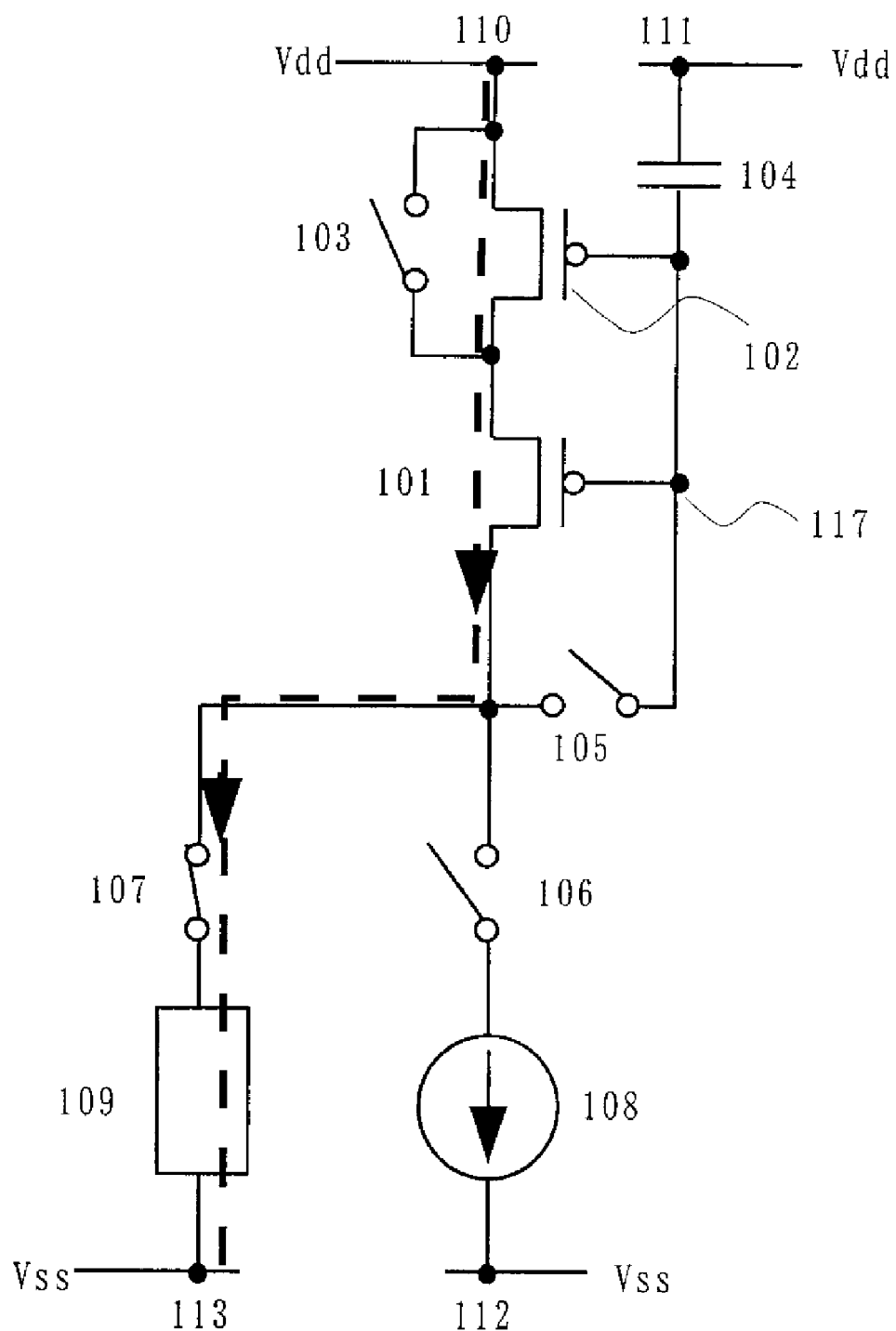
FIG. 12 is a diagram showing an operation of the current source circuit of the invention.

Further, in FIG. 1, two current sources of the second basic current source 115 and the basic current source 108 and two switches are used for controlling whether to flow each current in order to change the amount of current flowing in the precharge operation and the amount of current flowing in the set operation, however, the invention is not limited to this. For example, as shown in FIG. 9, the basic current source 108 only may be used for controlling. An operation in the configuration shown in FIG. 9 is shown in FIGS. 10 to 12. In this case, however, the current of the basic current source 108 in the precharge operation (FIG. 10) and the set operation (FIG. 11) has a value corresponding to the operation and normally has a different value.

Note that the load 109 may be anything. It may be an element such as a resistor, a transistor, an EL element, or a current source circuit formed by a transistor, a capacitor, a switch and the like. It may be a signal line or a signal line and a pixel connected to it. The pixel may include any kind of display element such as an EL element or an element used in an FED.

Note that the capacitor 104 can be substituted by gate capacitance of the current source transistor 101, the switching transistor 102 and the like. In that case, the capacitor 104 can be omitted.

Note that the wiring 110 and the wiring 111 are supplied with a power supply on the high potential side Vdd, however, the invention is not limited to this. Each wring may have the same potential or a different potential. The wiring 111 is only required to be capable of storing a charge of the capacitor 104. Further, the wiring 110 or the wiring 111 is not required to keep the same potential constantly. They may have different potentials between the set operation and the output operation as long as they operate normally.

Note that the wiring 113, the wiring 112, and the wiring 116 are supplied with a power supply on the low potential side Vss, however, the invention is not limited to this. Each wring may have the same potential or a different potential. The wiring 112, the wiring 113, and the wiring 116 are not required to keep the same potentials constantly. They may have different potentials between the set operation and the output operation as long as they operate normally.

Note that the capacitor 104 is connected to the gate terminal of the current source transistor 101 and the wiring 111, however, the invention is not limited to this. It is most desirable that the capacitor 104 be connected to the gate terminal and the source terminal of the current source transistor 101. This is because the operation of a transistor is not easily influenced by other effects (an effect of a voltage drop and the like due to a wiring resistance and the like) as long as a voltage is maintained between the gate terminal and the source terminal since the operation of the transistor is determined by a gate-source voltage. Provided that the capacitor 104 is disposed between the gate terminal of the current source transistor 101 and another wiring, a potential of the gate terminal of the current source transistor 101 may change depending on the level of voltage drop of that another wiring.

Note that the current source transistor 101 and the switching transistor 102 operate as a multi-gate transistor in the current source operation, therefore, these transistors preferably have the same polarity (have the same conductivity).

Note that the current source transistor 101 and the switching transistor 102 operate as a multi-gate transistor in the current source operation, however, a gate width W of each transistor may be either the same or different. Similarly, a gate length L may be either the same or different. However, the gate width W is preferably the same since the gate width W can be considered to be the same as a typical multi-gate transistor. As the gate length L of the switching transistor 102 becomes longer, a current flowing in the set operation and the output operation becomes smaller. Therefore, an appropriate design may be carried out according to the circumstance.

Such switches as 103, 105, 106, 107, and 114 may be any switch such as an electrical switch or a mechanical switch. It may be anything as far as it can control a current flow. It may be a transistor, a diode, or a logic circuit configured with them. Therefore, in the case of applying a transistor as a switch, a polarity (conductivity) thereof is not particularly limited because it operates just as a switch. However, when an off-current is preferred to be small, a transistor of a polarity with a small off-current is favorably used. For example, a transistor which provides an LDD region and the like have a small off-current. Further, it is desirable that an n-channel type transistor be employed when a potential of a source terminal of the transistor as a switch is closer to the power supply on the low potential side (Vss, Vgnd, 0V and the like), and a p-channel type transistor be employed when the potential of the source terminal is closer to the power supply on the high potential side (Vdd and the like). This helps the switch operate efficiently as an absolute value of a gate-source voltage of the transistor can be increased. It is to be noted that a CMOS type switch can also be applied by using both n-channel type and p-channel type transistors.

Note that FIG. 1 is shown as a circuit of the invention, however, the invention is not limited to this configuration. By changing an arrangement and the number of switches, polarity of each transistor, the number and arrangement of the current source transistor 101, the number and arrangement of the switching transistor 102, a potential of each wiring, a direction of current flow and the like, various circuits can be employed in the configuration. Further, by combining each change also, a configuration using various circuits can be achieved.

For example, such switches as 103, 105, 106, 107, and 114 may be disposed anywhere as long as it can control ON/OFF of a target current. Specifically, the switch 107 which controls a current flowing to the load 109 is only required to be disposed to be in series to the load 109. Similarly, the switches 106 and 114 which control a current flowing to the basic current source 108 and the second basic current source 115 are only required to be disposed in series to the basic current source 108. Further, the switch 103 which controls a current flowing to the switching transistor 102 is only required to be disposed in parallel to the switching transistor 102. The switch 105 is only required to be disposed so as to control a charge in the capacitor 104.

Figure 13:
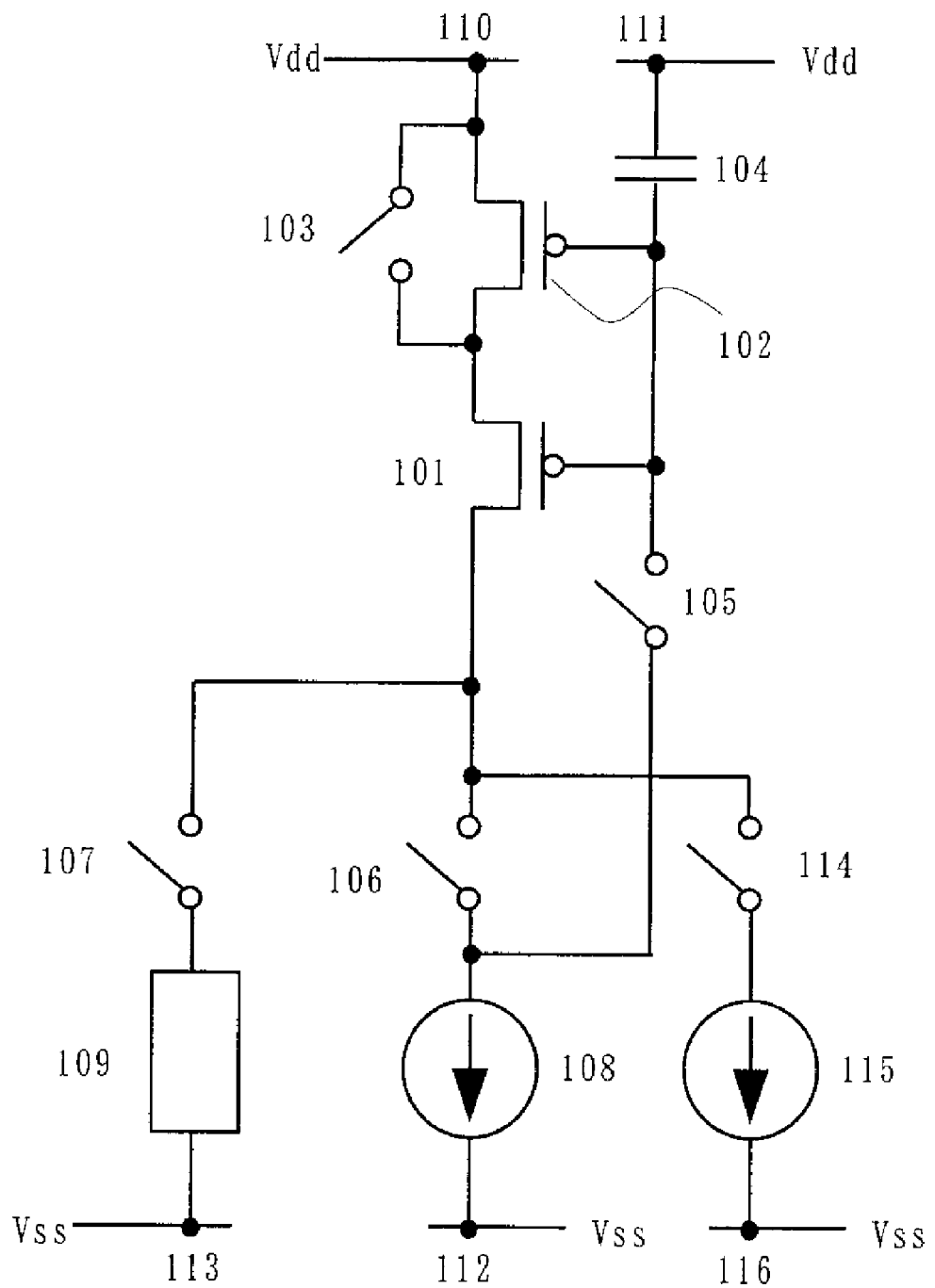
FIG. 13 is a diagram showing a configuration of the current source circuit of the invention.
Figure 14:
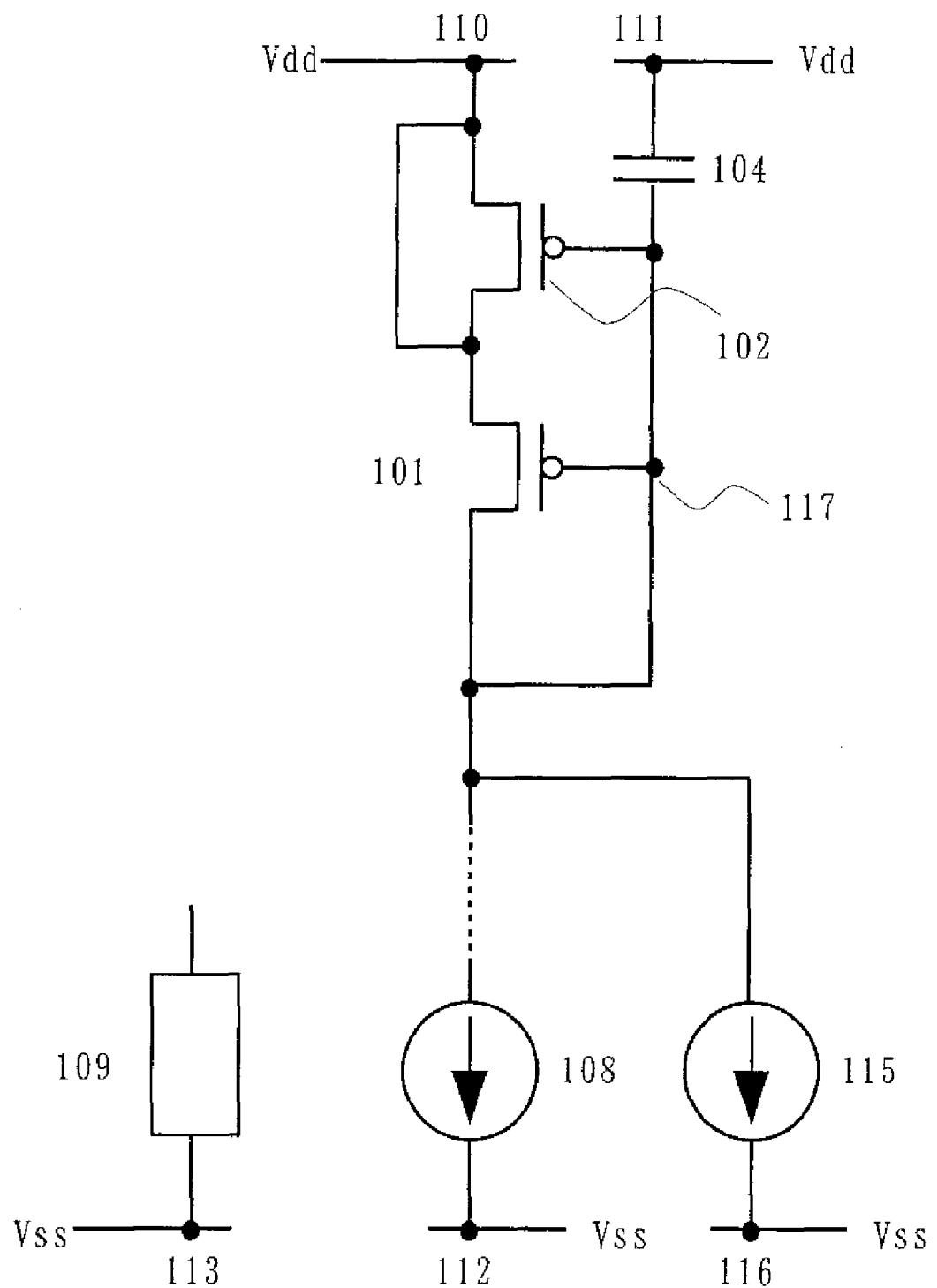
FIG. 14 is a diagram showing a connection of a certain operation of the current source circuit of the invention.
Figure 15:
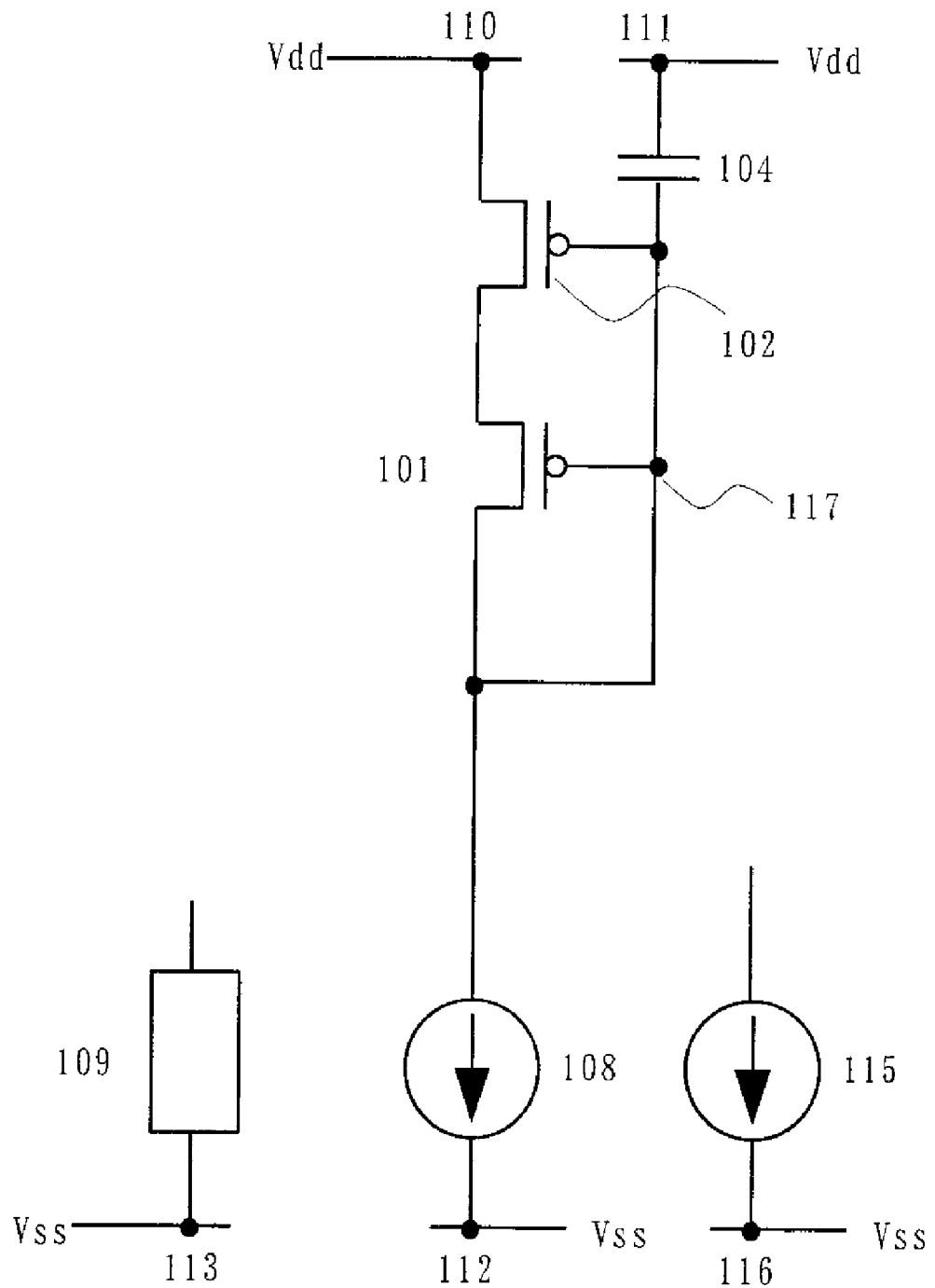
FIG. 15 is a diagram showing a connection of a certain operation of the current source circuit of the invention.
Figure 16:
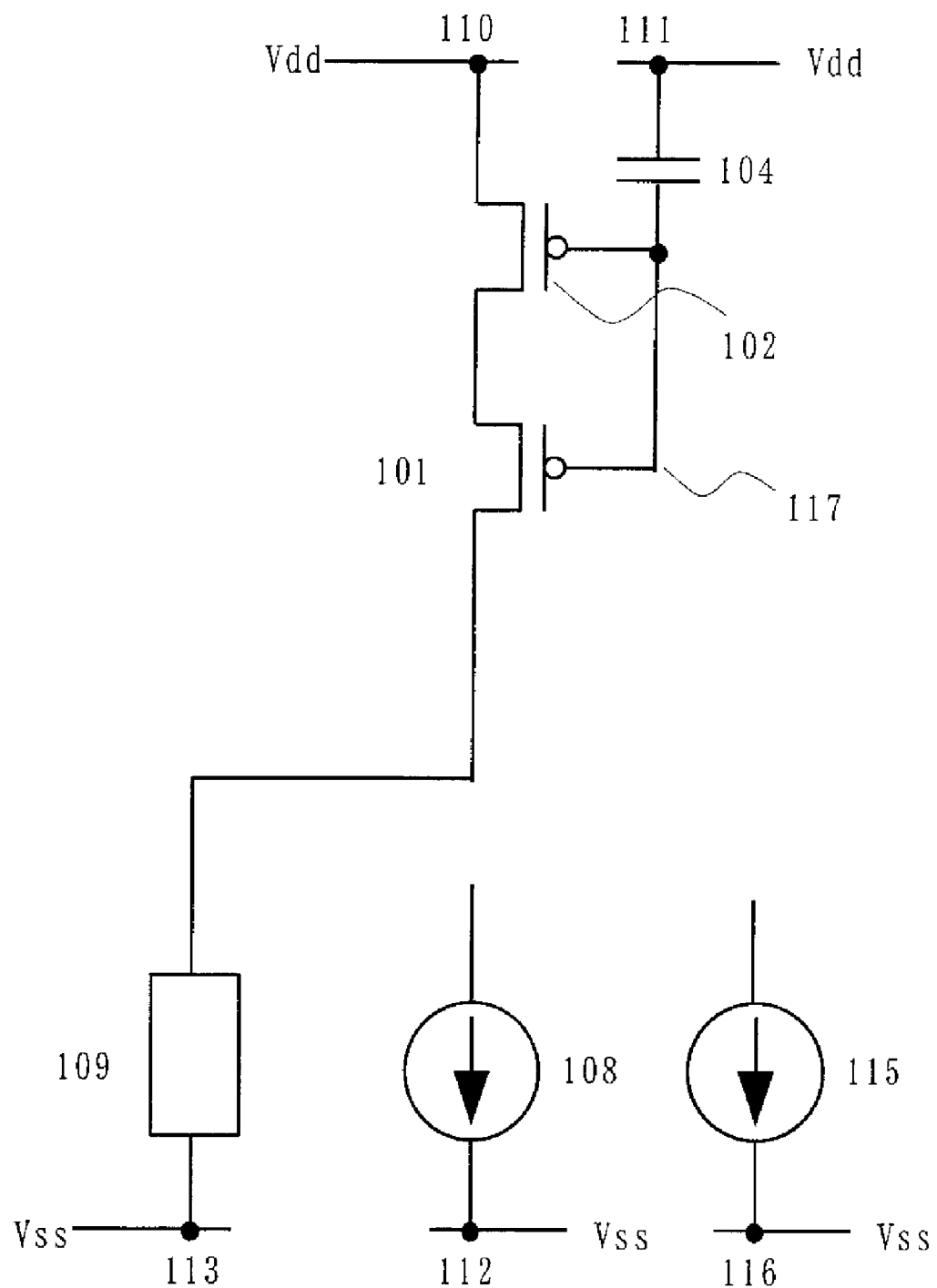
FIG. 16 is a diagram showing a connection of a certain operation of the current source circuit of the invention.

FIG. 13 shows an example in the case where the switch 105 is disposed differently. That is, such switches as 103, 105, 106, 107, and 114 may be disposed anywhere as long as they are connected as shown in FIG. 14 in the precharge operation, the current Ib2 of the second basic current source 115 flows to the current source transistor 101, and the switching transistor 102 perform the short-circuit operation. Note that the basic current source 108 may be connected. Therefore, a wiring is shown by a dotted line in FIG. 14. Next, in the set operation, the switches may be disposed anywhere as long as they are connected as shown in FIG. 15, the switching transistor 102 performs the current source operation, and a current flowing to the switching transistor 102 and the current source transistor 101 flows to the basic current source 108. In the output operation, the switches may be disposed anywhere as long as they are connected as shown in FIG. 16, a gate potential of the switching transistor 102 and the current source transistor 101 is held by the capacitor 104, and a current flowing to the switching transistor 102 and the current source transistor 101 flows to the load 109. Such switches as 103, 105, 106, 107, and 114 may be disposed anywhere as long as they are connected as described above.

Figure 17:
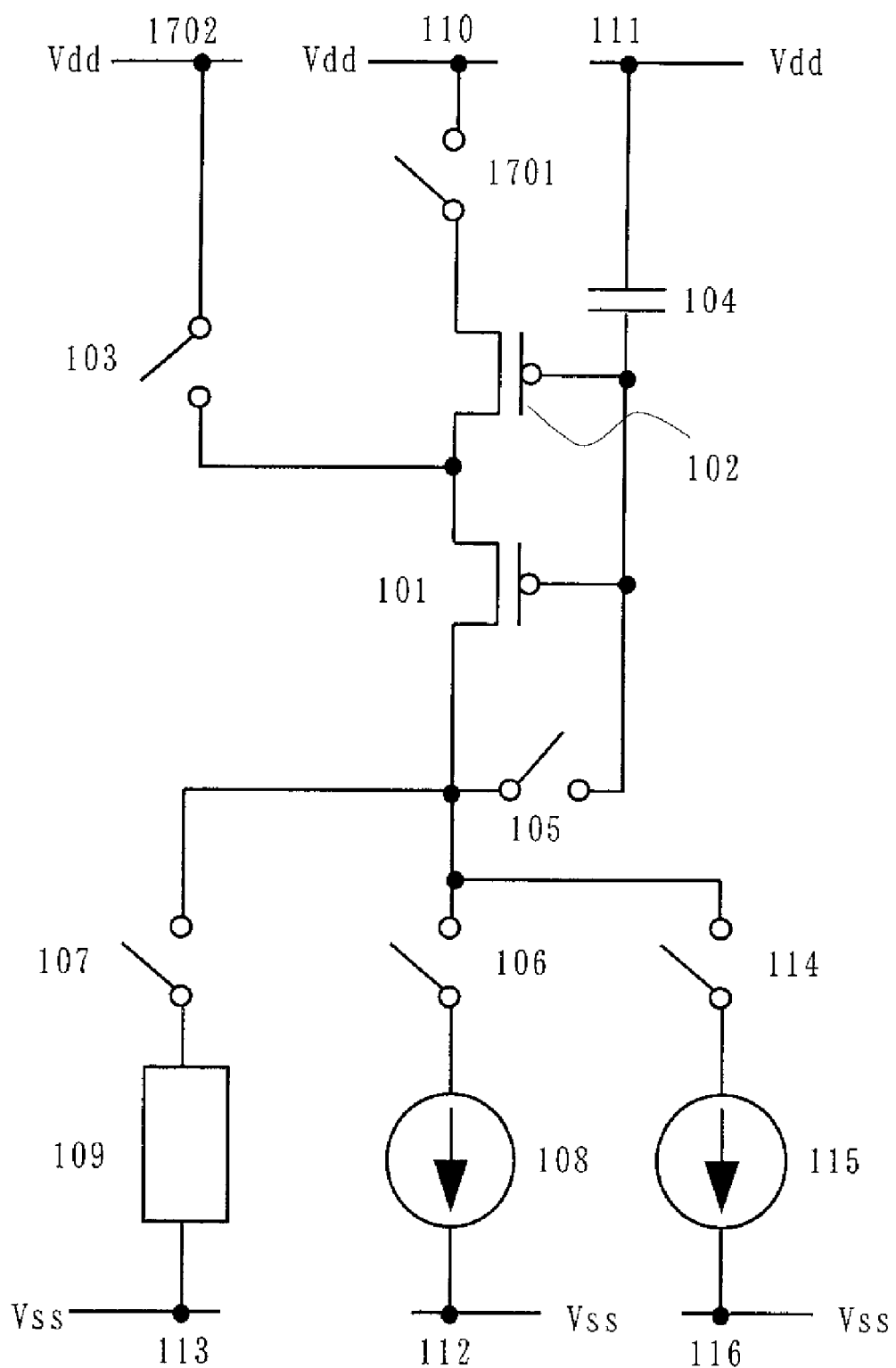
FIG. 17 is a diagram showing a configuration of the current source circuit of the invention.

Next, FIG. 17 shows an example in the case where the switch 103 is disposed differently. The switch 103 is connected to a wiring 1702. A potential of the wiring 1702 may be Vdd or another value. In the case of FIG. 17, a switch 1701 may be provided additionally or may not be provided as well. The switch 1701 may be disposed either on a source terminal side or a drain terminal side of the switching transistor 102. The switch 1701 is only required to be turned ON/OFF inversely to the switch 103.

Figure 18:
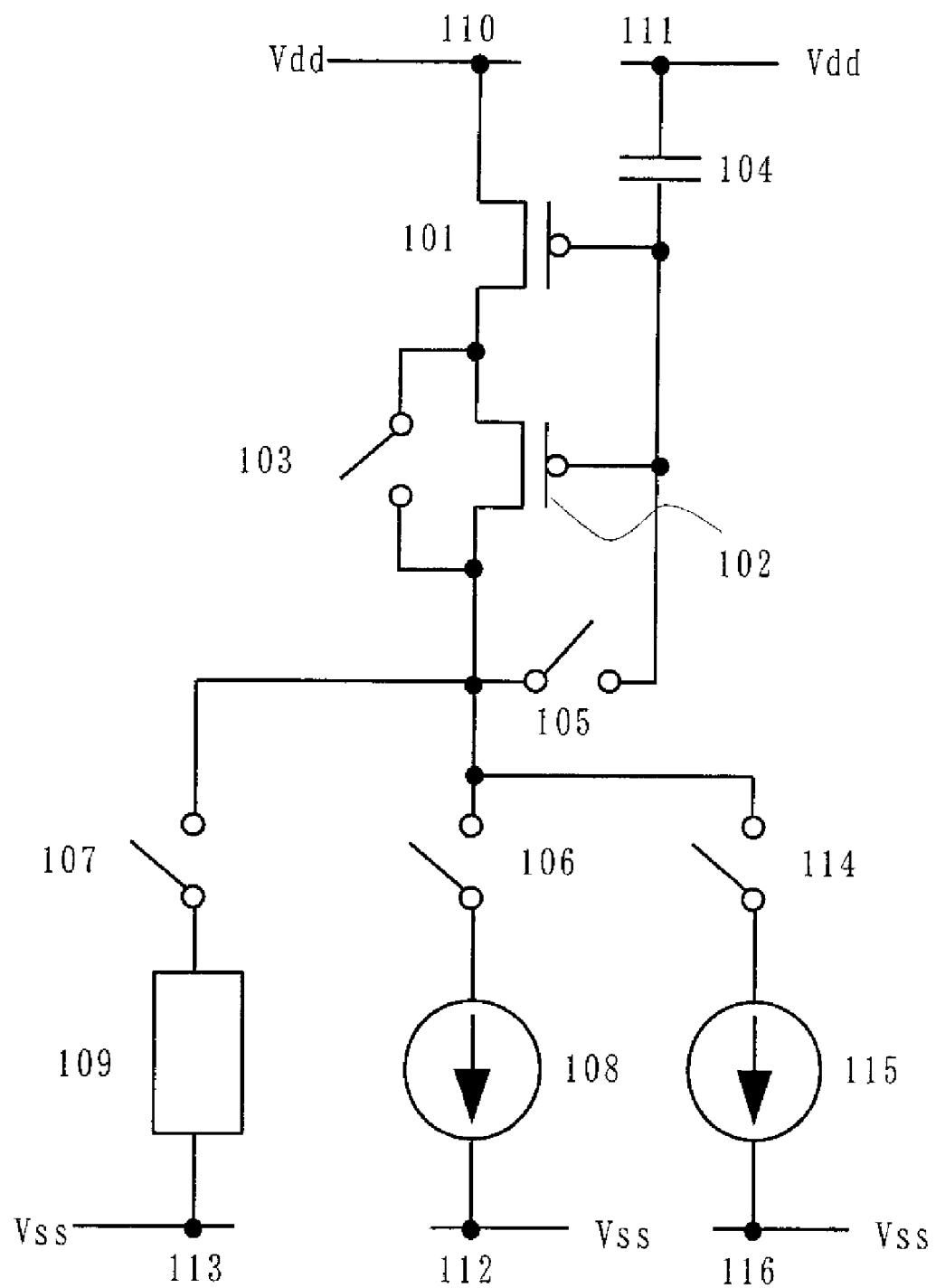
FIG. 18 is a diagram showing a configuration of the current source circuit of the invention.

Next, FIG. 18 shows the case where dispositions of the current source transistor 101 and the switching transistor 102 are exchanged. In FIG. 1, the wiring 110, the switching transistor 102, and the current source transistor 101 are disposed in this order, however, the wiring 110, the current source transistor 101 and the switching transistor 102 are disposed in this order in FIG. 18.

Here, the circuit in FIG. 1 and the circuit in FIG. 18 are compared. In FIG. 1, when the switching transistor 102 performs the short-circuit operation, there is a potential difference between a gate terminal and a source terminal (drain terminal) of the switching transistor 102. Therefore, a charge is stored in the gate capacitance of the switching transistor 102. Then, in the current source operation as well, the charge remains stored in the gate capacitance. Therefore, a potential of the gate terminal of the current source transistor 101 hardly changes between in the short-circuit operation (precharge operation) and the current source operation (set operation).

In FIG. 18, on the other hand, when the switching transistor 102 performs a short-circuit operation, there is hardly any potential difference between the gate terminal and the source terminal (drain terminal) of the switching transistor 102. Therefore, a charge is not stored in the gate capacitance of the switching transistor 102. Then, as the switch 103 is turned OFF in the current source operation, a charge is accumulated in the gate capacitance of the switching transistor 102, which operates as a part of a current source. The charge at this time is the one accumulated in the capacitor 104 or the gate capacitance of the current source transistor 101. This charge moves to the gate portion of the switching transistor 102. Therefore, the potential of the gate terminal of the current source transistor 101 changes by the moved charge between in the short-circuit operation (precharge operation) and the current source operation (set operation). As a result, an absolute value of a gate-source voltage of the current source transistor 101 and the switching transistor 102 becomes small in the set operation.

Based on the aforementioned, the arrangement of the current source transistor 101 and the switching transistor 102 may be designed according to circumstances. For example, in the case where an absolute value of a gate-source voltage of the multi-gate transistor (the current source transistor 101 and the switching transistor 102) is preferably small when the precharge operation changes to the set operation, the configuration shown in FIG. 18 may be employed.

As an example, there is a case where the current of the basic current source 108 in the set operation is small. This is because there is a case where time until a steady state is obtained can be shortened in the case of FIG. 18. That is, in the case where the current of the basic current source 108 is small in the set operation, there is a case where the capacitor 104 has to be discharged by flowing the charge in the capacitor 104 to the current source transistor 101 and the switching transistor 102, instead of charging the capacitor 104. In that case, as the current of the basic current source 108 is small in the set operation, absolute values of gate-source voltages of the current source transistor 101 and the switching transistor 102 are small. Therefore, the current source transistor 101 and the switching transistor 102 hardly flow a current. As a result, it takes a long time to discharge the charge in the capacitor 104 to obtain the steady state. In the case of FIG. 18, when the current source transistor 101 and the switching transistor 102 operate as a multi-gate transistor when the precharge operation changes to the set operation, absolute values of gate-source voltages become small. Therefore, the capacitor 104 is not discharged but charged and the absolute values of the gate-source voltages become large and the steady state can be obtained.

In FIG. 1, the current source transistor 101 and the switching transistor 102 are disposed one each, however, a plurality of either or both may be disposed as well. Further, the arrangement thereof may be selected arbitrarily.

Figure 19:
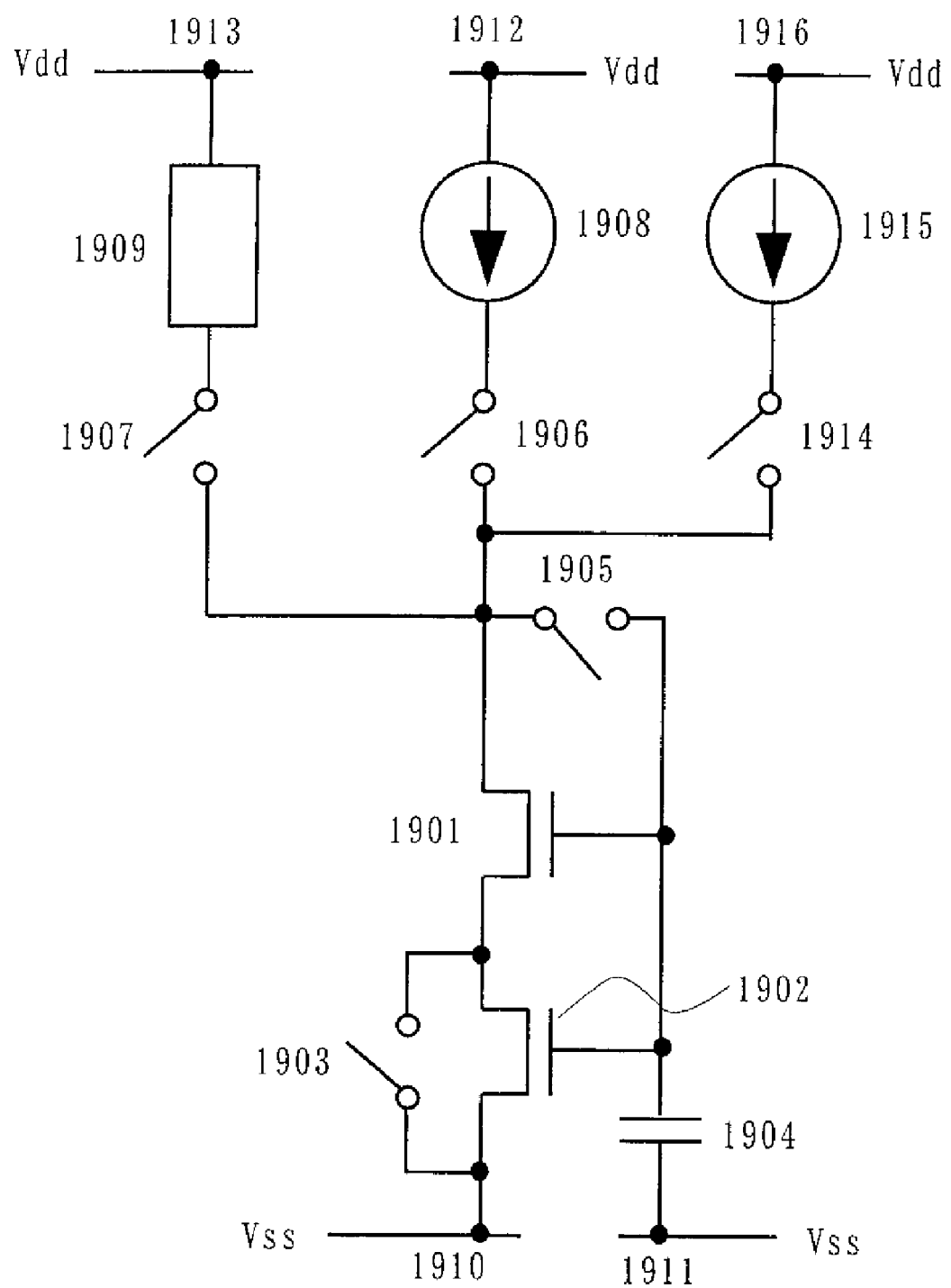
FIG. 19 is a diagram showing a configuration of the current source circuit of the invention.

Note that the current source transistor 101 and the switching transistor 102 are p-channel type transistors in FIG. 1, however, the invention is not limited to this. FIG. 19 shows an example of the case where the polarity (conductivity) of the current source transistor 101 and the switching transistor 102 are changed and the connecting structure of the circuit is not changed in FIG. 1. When FIG. 1 and FIG. 19 are compared, it is clear that the change is easily done by changing potentials of the wirings 112, 113, 110, 111, and 116 to the ones of wirings 1912, 1913, 1910, 1911, and 1916 and changing the direction of current of the basic current source 108 and the second basic current source 115. The connections of a current source transistor 1901, a switching transistor 1902, switches 1903, 1905, 1906, and 1907, a basic current source 1908, a load 1909 and the like are not changed.

Figure 20:
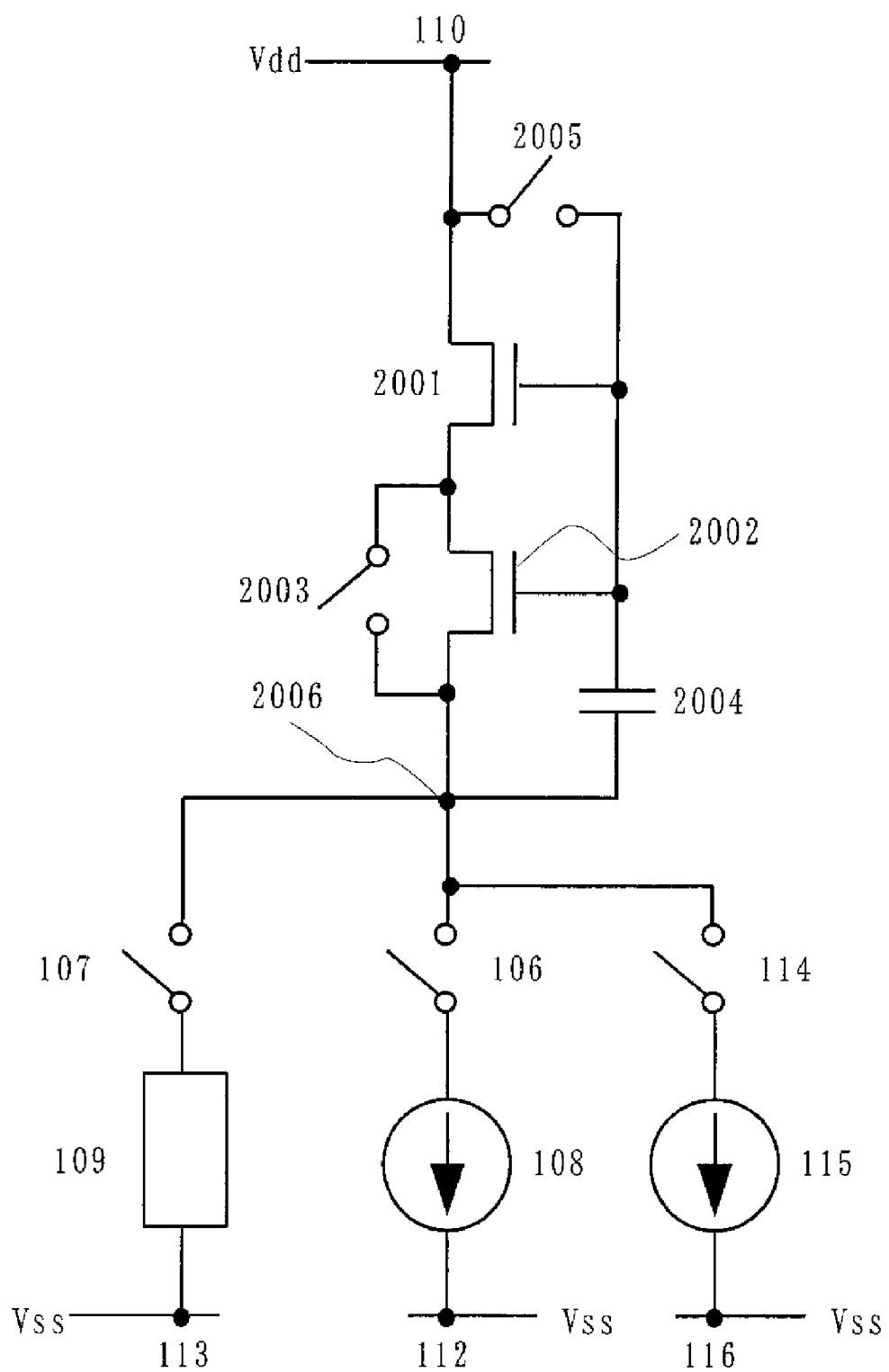
FIG. 20 is a diagram showing a configuration of the current source circuit of the invention.

Further, FIG. 20 shows an example of the case where the polarity (conductivity) of the current source transistor 101 and the switching transistor 102 are changed by changing the connecting structure of the circuit without changing the direction of current in the circuit of FIG. 1.

There are a current source transistor 2001 which constantly operates as a current source (or a part of it) and a switching transistor 2002 of which operation changes according to the circumstance. The current source transistor 2001, the switching transistor 2002, and the wiring 110 are connected in series. A gate terminal of the current source transistor 2001 is connected to one of the terminals of a capacitor 2004. The other terminal 2006 of the capacitor 2004 is connected to a source terminal of the switching transistor 2002 (the current source transistor 2001). Therefore, a gate-source voltage of the current source transistor 2001 can be held. Further, the gate terminal and a drain terminal of the current source transistor 2001 are connected via a switch 2005. The capacitor 2004 can be controlled to hold a charge by ON/OFF of the switch 2005.

An operation of FIG. 20 is described. However, as it is similar to the operation of FIG. 1, the description will be made briefly. First, the switches 2003, 2005, and 114 are turned ON and switches 107 and 106 are turned OFF. Then, when a steady state is obtained, a current stops flowing to the capacitor 2004. Then, a gate-source voltage of the current source transistor 2001 is accumulated in the capacitor 2004. That is, a voltage required to flow the current Ib2 between the source and drain of the current source transistor 2001 is applied between the gate and source thereof. The aforementioned operation corresponds to the set operation. At that time, the switching transistor 2002 performs the short-circuit operation.

Next, the switches 2005 and 106 are turned ON and the switches 2003, 107, and 114 are turned OFF. Then, the current source transistor 2001 and the switching transistor 2002 operate as a multi-gate transistor. Then, when a steady state is obtained, a current stops flowing to the capacitor 2004. At that time, a gate-source voltage of the multi-gate transistor is accumulated in the capacitor 2004. That is, a voltage required to flow the current Ib1 between the source and drain of the multi-gate transistor is applied between the gate and source thereof. The aforementioned operation corresponds to the set operation. At that time, the switching transistor 2002 performs the current source operation.

Next, the switch 107 is turned ON and the switches 2003, 2005, 106, and 114 are turned OFF. Then, a current flows to the load 109. The aforementioned operation corresponds to the output operation. At that time, the switching transistor 2002 performs the current source operation.

Note that a potential of the terminal 2006 of the capacitor 2004 is different between the set operation and the output operation in many cases. However, voltages of both ends of the capacitor 2004 (potential difference) does not change, therefore, a gate-source voltage of a transistor does not change and a desired current flows to the load 109.

Figure 21:
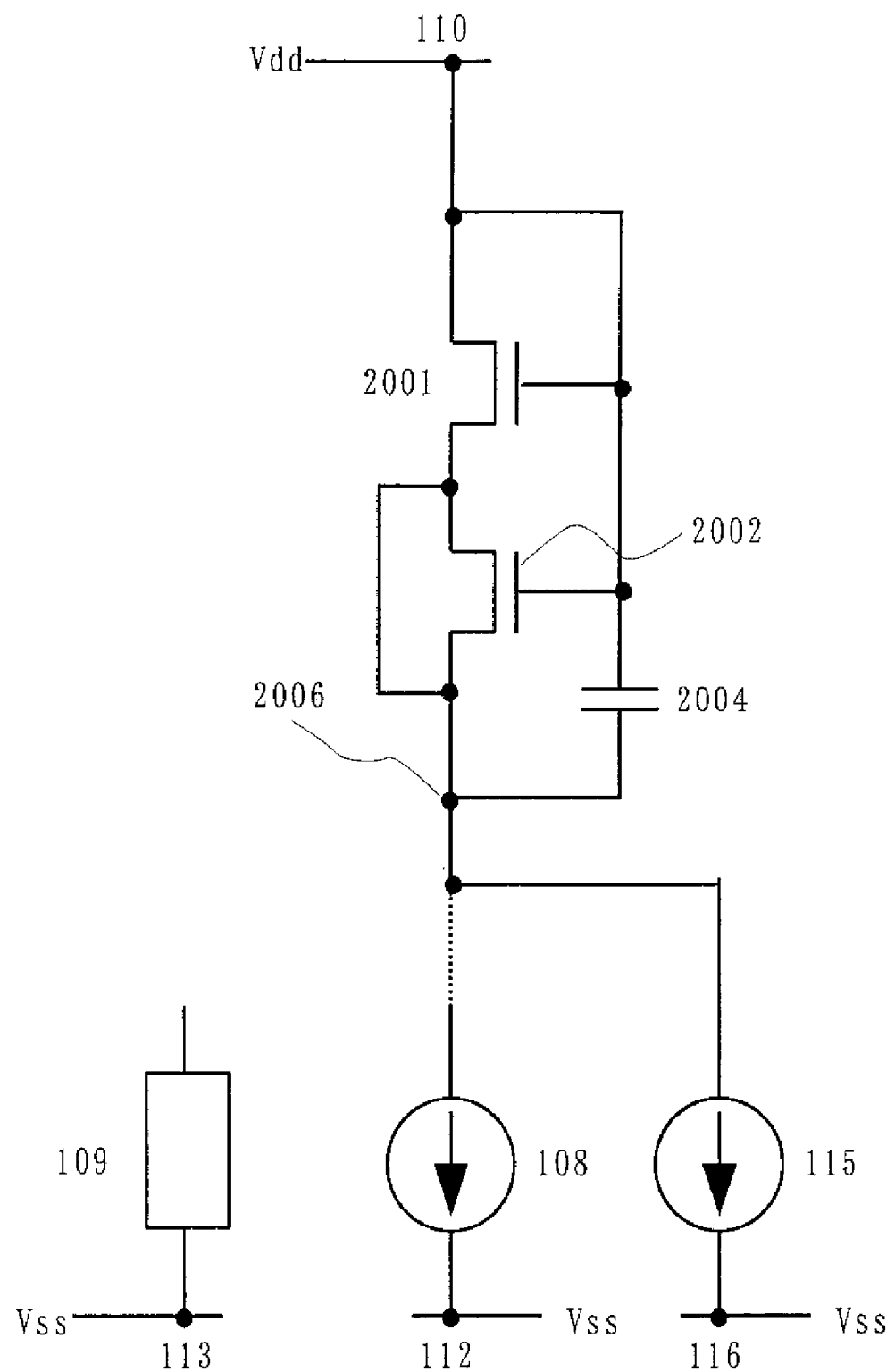
FIG. 21 is a diagram showing a connection of a certain operation of the current source circuit of the invention.
Figure 22:
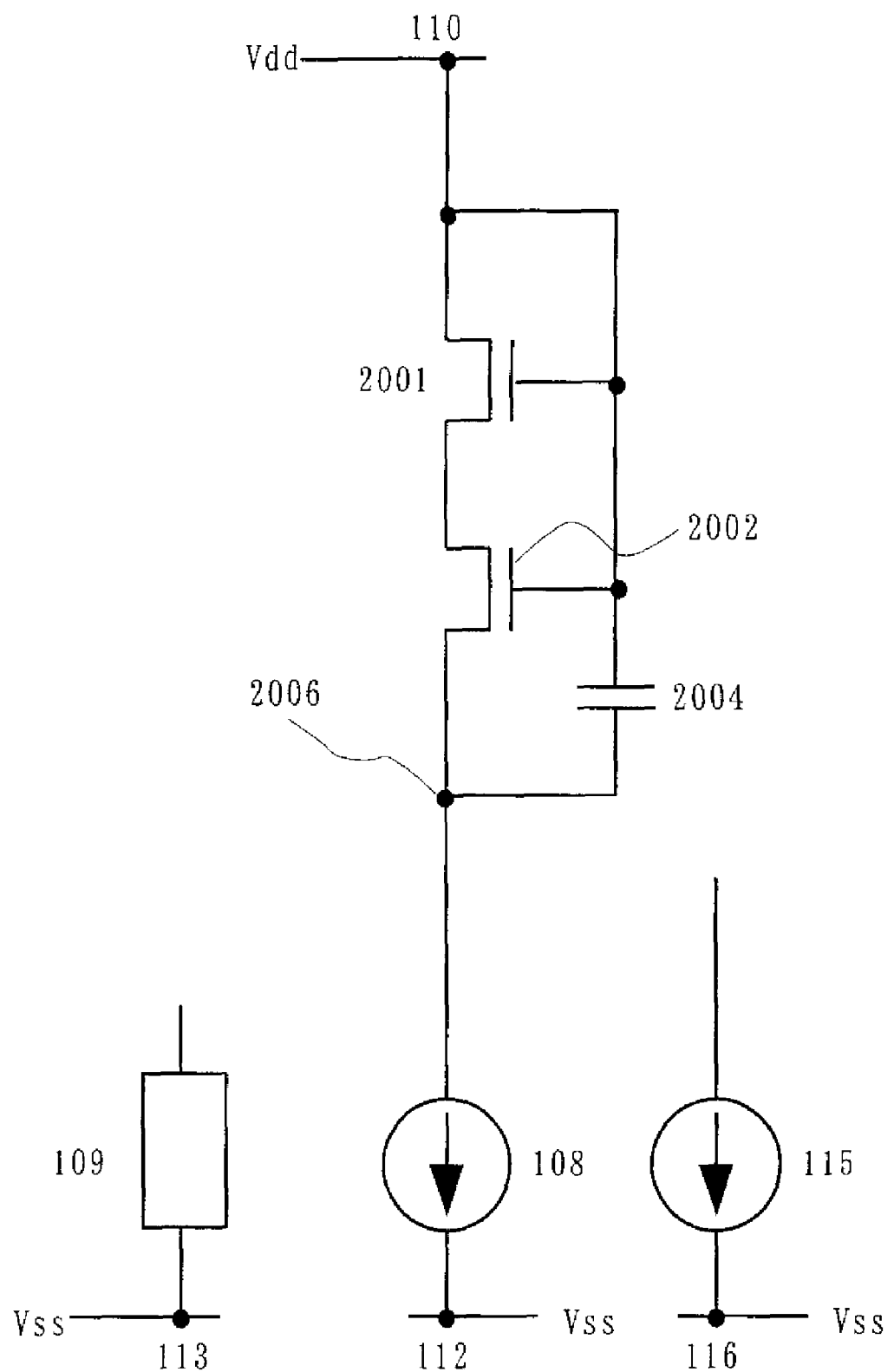
FIG. 22 is a diagram showing a connection of a certain operation of the current source circuit of the invention.
Figure 23:
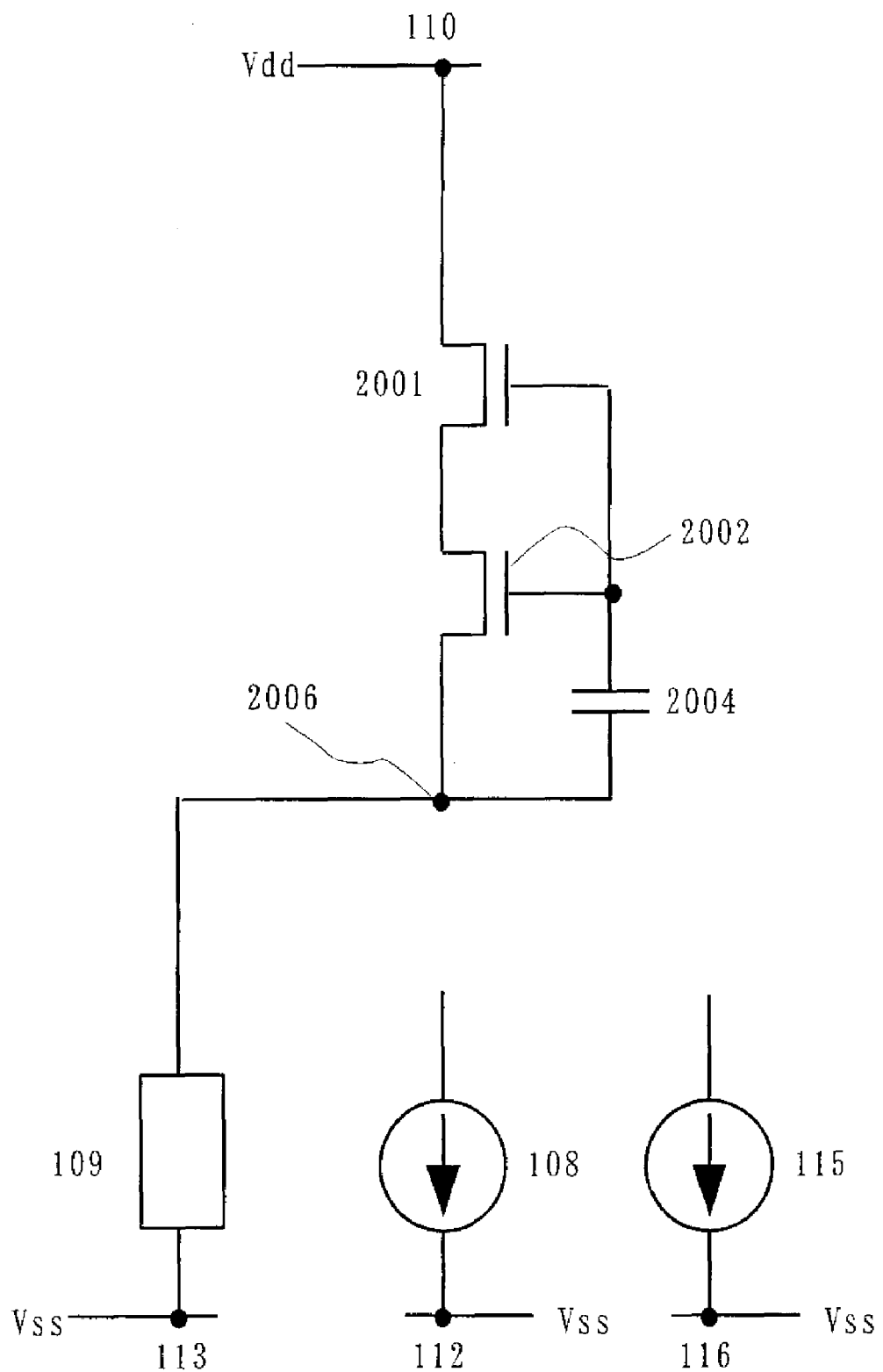
FIG. 23 is a diagram showing a connection of a certain operation of the current source circuit of the invention.

In this case also, it is needless to say that the switches may be disposed anywhere as long as they are connected as shown in FIG. 21 in the precharge operation, connected as shown in FIG. 22 in the set operation, and connected as shown in FIG. 23 in the output operation.

Note that FIG. 20 shows a circuit corresponding to FIG. 1, however, transistors may be disposed in the order as shown in FIG. 18. In that case, a charge is not accumulated in a gate capacitance of the switching transistor 2002 in the short-circuit operation.

In the case of FIG. 1, the precharge operation is performed as shown in FIG. 2 and then the set operation is performed as shown in FIG. 3, however, the invention is not limited to this.

Figure 24:
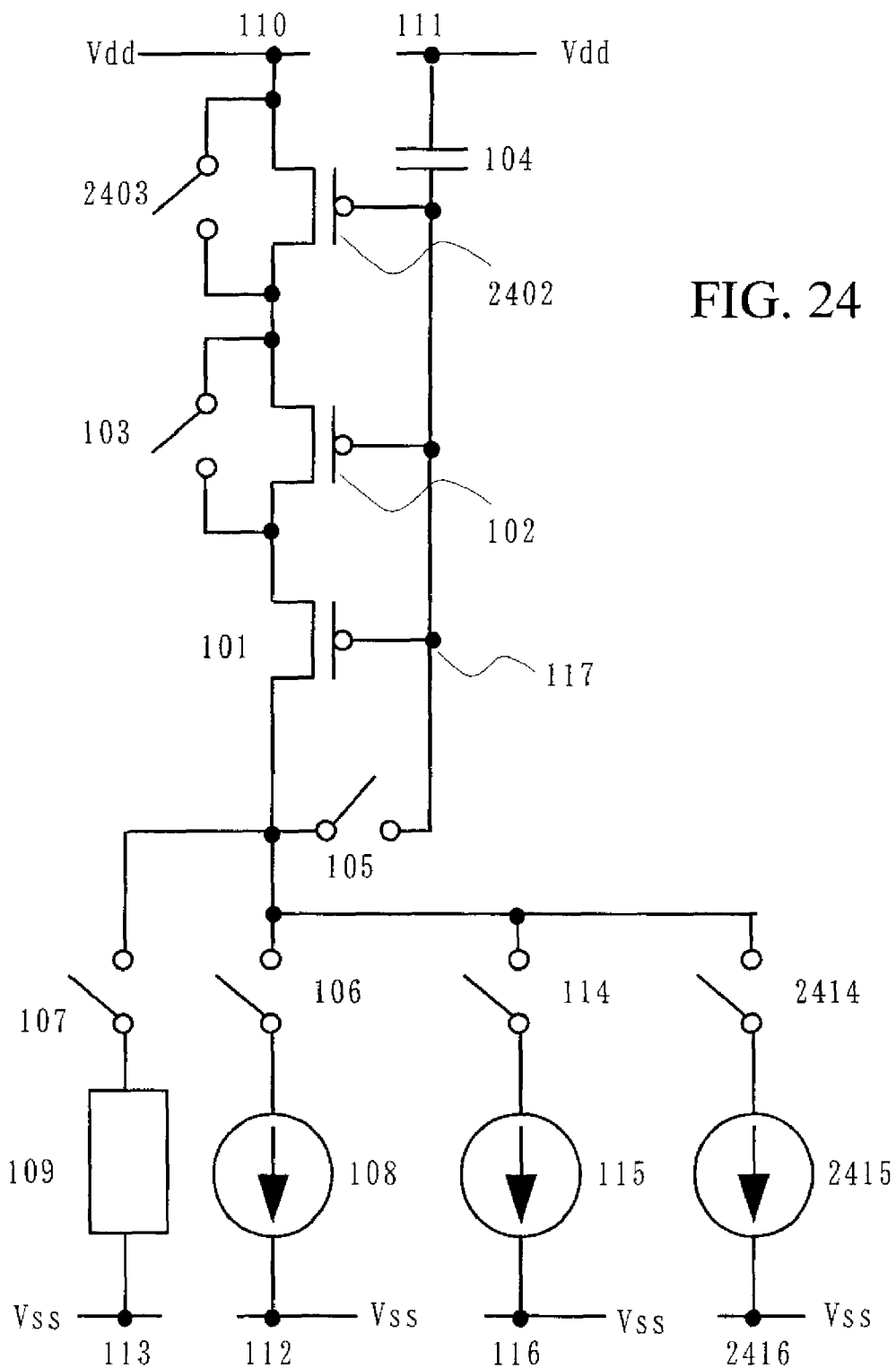
FIG. 24 is a diagram showing a configuration of the current source circuit of the invention.

For example, the precharge operation as shown in FIG. 2 may be performed a plurality of times. As an example, FIG. 24 shows the case where one more precharge operation is performed than the case of FIG. 2. In FIG. 24, a transistor 2402 which operates as a current source is additionally provided. First, while the switches 2403, 2414, and 103 are tuned ON and the switch 114 is turned OFF, a first precharge operation is performed. After that, the switches 2403 and 2414 are turned OFF and the switch 114 is turned ON, then a second precharge operation is performed. That is, it corresponds to the precharge operation of FIG. 2. Note that a current flowing in the first precharge operation is larger than that of the second precharge operation. In this manner, by performing the precharge with a large current value, a steady state can be obtained rapidly.

Alternatively, another precharge operation may be performed in combination.

Figure 25:
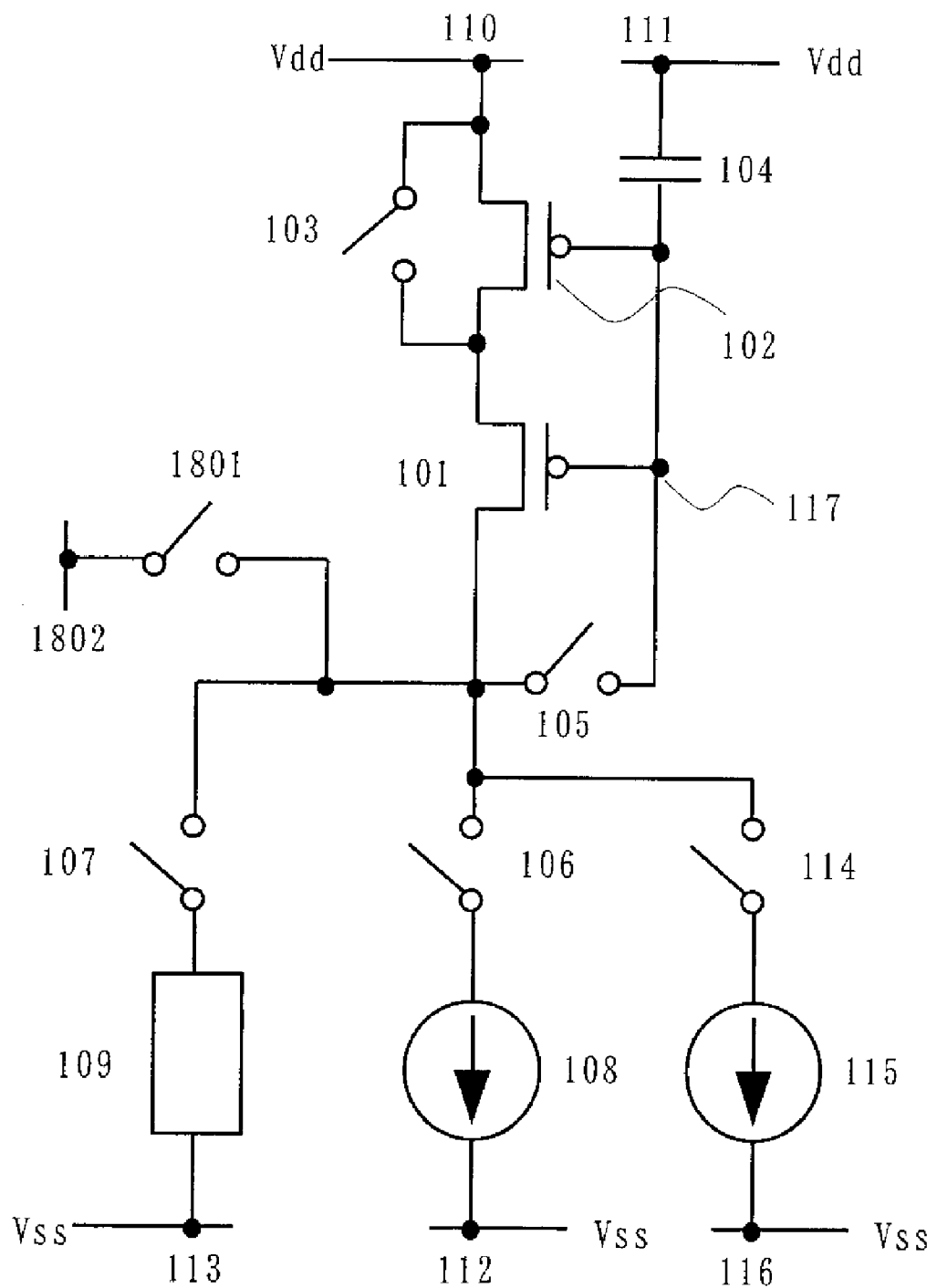
FIG. 25 is a diagram showing a configuration of the current source circuit of the invention.
Figure 26:
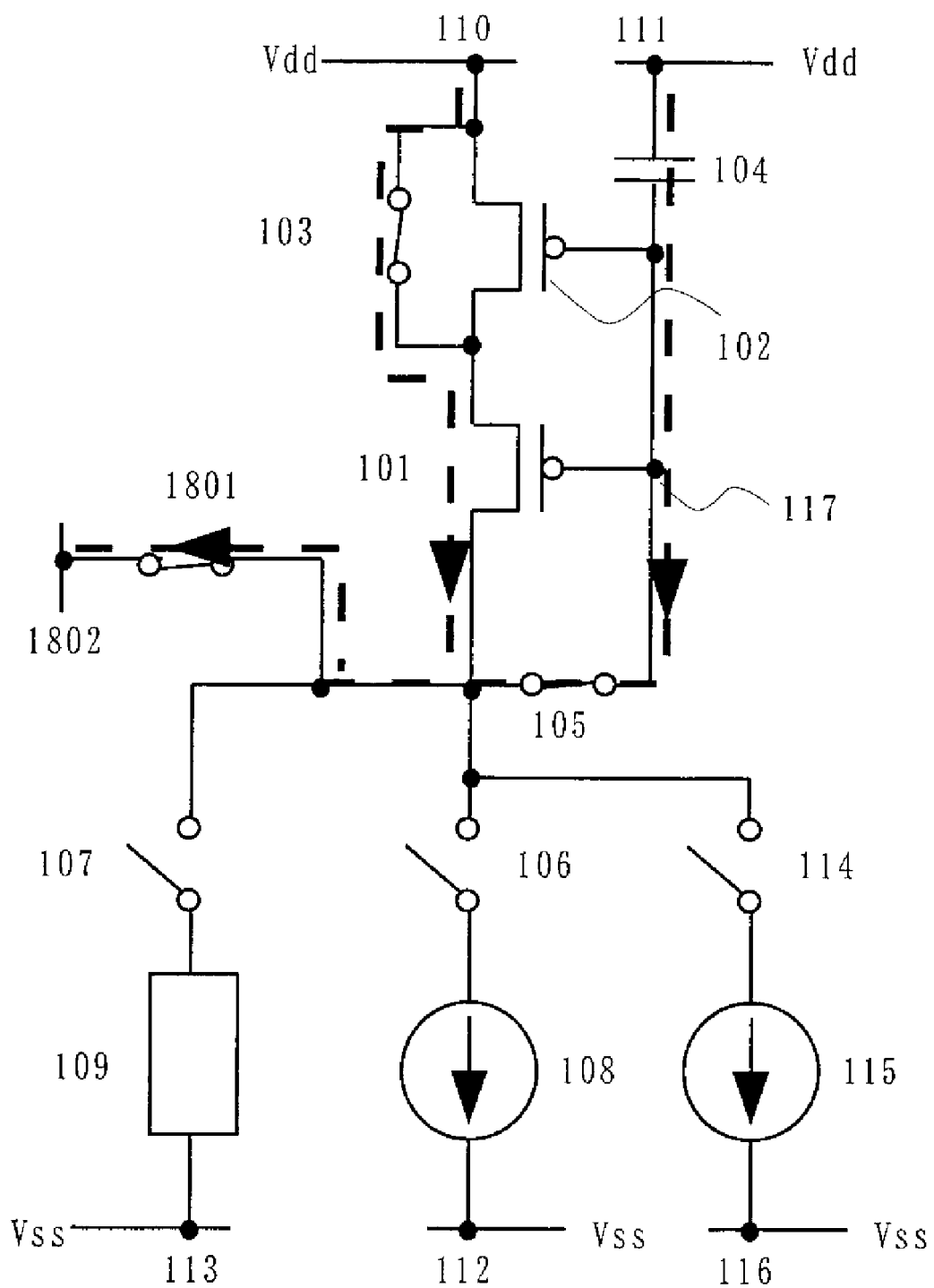
FIG. 26 is a diagram showing an operation of the current source circuit of the invention.
Figure 27:
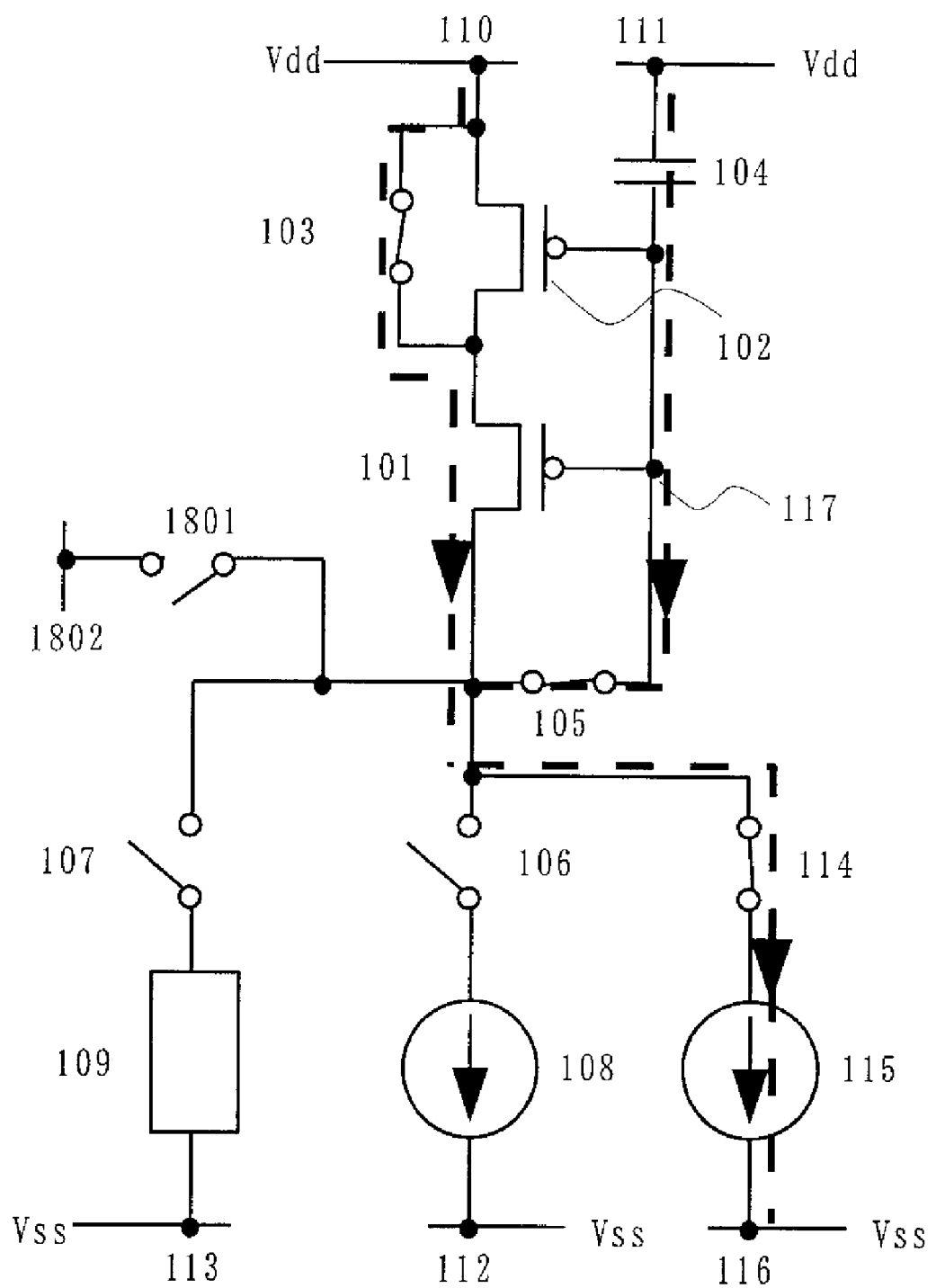
FIG. 27 is a diagram showing an operation of the current source circuit of the invention.

For example, by employing a configuration shown in FIG. 25, another precharge may be performed before the precharge operation shown in FIG. 2. In FIG. 25, a voltage is supplied from a terminal 1802 via a switch 1801. The potential in the precharge operation and the set operation is set approximately equal to a potential in the steady state. That is to say, the switch 1801 is turned ON to supply a potential of the terminal 1802 as shown in FIG. 26. Accordingly, the precharge can be performed rapidly. After that, the switch 1801 is turned OFF to perform the precharge operation as shown in FIG. 27. This corresponds to the precharge operation of FIG. 2. Note that a technique to perform the precharge operation by supplying a voltage is described in the Japanese Patent Application No. Hei 2002-348673 applied by the same applicant. It discloses various precharge techniques, of which contents can be used in combination with this invention.

Note that a transistor used in the precharge operation and a transistor used in the set operation are preferably the same in their characteristics. For example, it is preferable that the current source transistor 101 and the switching transistor 102 have the same current characteristics in the case of FIG. 1. Therefore, in the step for forming the transistor, it is preferable that the current characteristics thereof become the same as much as possible. For example, it is preferable to dispose the current source transistor 101 and the switching transistor 102 as close to each other as possible. In the case of crystallizing a semiconductor layer of a transistor by irradiating laser, for example, it is preferable that the same shot be irradiated to the both transistors. As a result, the current characteristics thereof can be approximately the same.

Accordingly, an appropriate state can be obtained by the precharge operation. Therefore, the set operation can be performed rapidly.

In this manner, by changing an arrangement and the number of switches, polarity of each transistor, the number and arrangement of the current source transistor, the number and arrangement of the switching transistor, a potential of each wiring, a combination with another precharge method, a direction of current flow and the like, various circuits can be employed in the configuration as well as the circuit of FIG. 1. Further, by combining each change also, the invention can be configured by using various circuits.

Embodiment Mode 2

In Embodiment Mode 1, the configuration shown in FIG. 1 is described in order to realize the current source operation and the short-circuit operation to the switching transistor 102. In this embodiment mode, a configuration example to realize the current source operation and the short-circuit operation is described, which is different from that in Embodiment Mode 1.

Note that the same part as Embodiment Mode 1 is not described anymore in the following description.

Figure 28:
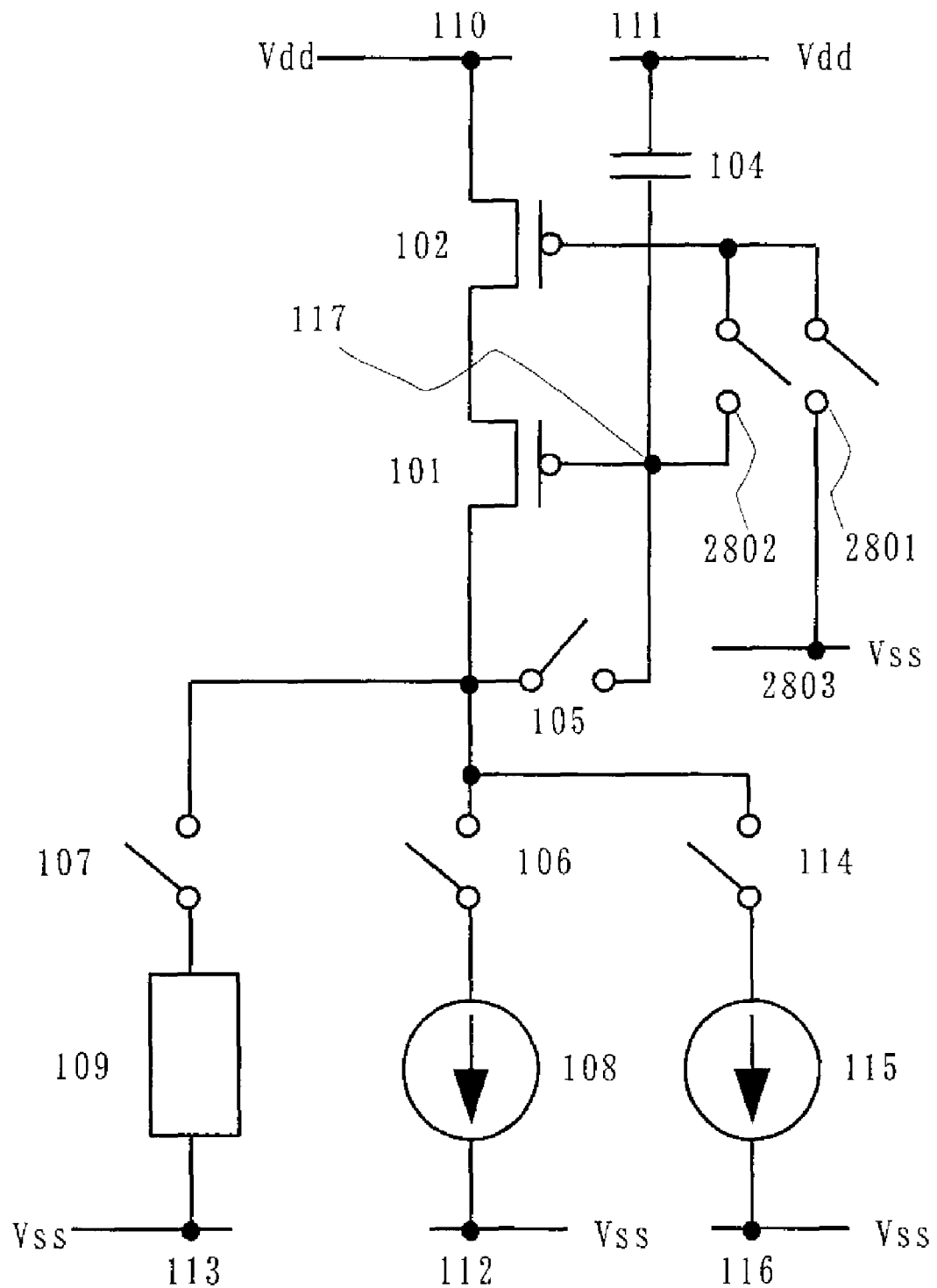
FIG. 28 is a diagram showing a configuration of the current source circuit of the invention.

First, a second configuration to realize the current source operation and the short-circuit operation to the switching transistor 102 is shown in FIG. 28.

The current source circuit shown in FIG. 28 can flow a large current to the switching transistor 102 by controlling a voltage of the gate terminal of the switching transistor 102. Specifically, by using a switch 2801, an absolute value of a gate-source voltage of the switching transistor 102 is made large. As a result, in the case where a certain value of current flows, only a small source-drain voltage of the switching transistor 102 is required. That is, the switching transistor 102 operates as a switch.

In FIG. 28, the gate terminals of the current source transistor 101 and the switching transistor 102 which are not connected to each other are connected by using a switch 2802. Accordingly, they operate as a multi-gate transistor.

Figure 29:
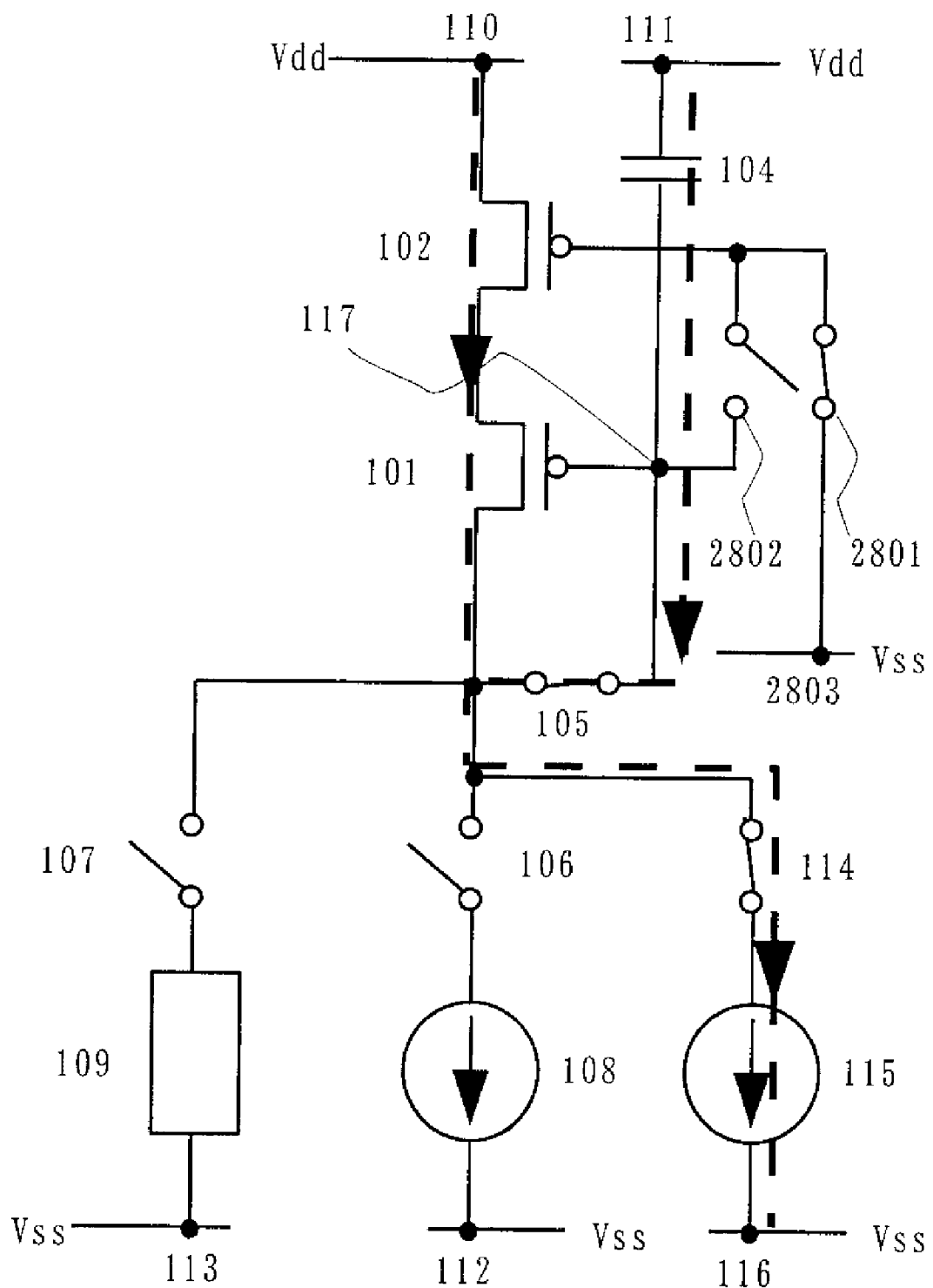
FIG. 29 is a diagram showing an operation of the current source circuit of the invention.

Next, an operation of a current source circuit shown in FIG. 28 is described. First, as shown in FIG. 29, the switches 2801, 105, and 114 are turned ON and the switches 106, 107, and 2802 are turned OFF. Then, the gate terminal of the switching transistor 102 is connected to a wiring 2803. The wiring 2803 is supplied with a power source on the low potential side (Vss), therefore, an absolute value of a gate-source voltage of the switching transistor 102 becomes quite large. Therefore, now that the switching transistor 102 has quite a large current drive capacity, the source terminal and a drain terminal of the switching transistor 102 have approximately the same potentials. Accordingly, the current Ib2 of the second basic current source 115 flows to the capacitor 104 and the current source transistor 101, and the source terminal of the current source transistor 101 has approximately the same potential as the wiring 110. Then, when a current flowing between the source and drain of the current source transistor 101 and the current Ib2 of the second basic current source 115 become equal, a current stops flowing to the capacitor 104. That is, a steady state is obtained. At that time, a potential of the gate terminal thereof is accumulated in the capacitor 104. That is, a voltage required flow the current Ib2 between the source and drain of the current source transistor 101 is applied to the gate terminal thereof. The aforementioned operation corresponds to the precharge operation. At that time, the switching transistor 102 operates as a switch and performs a short-circuit operation.

Figure 30:
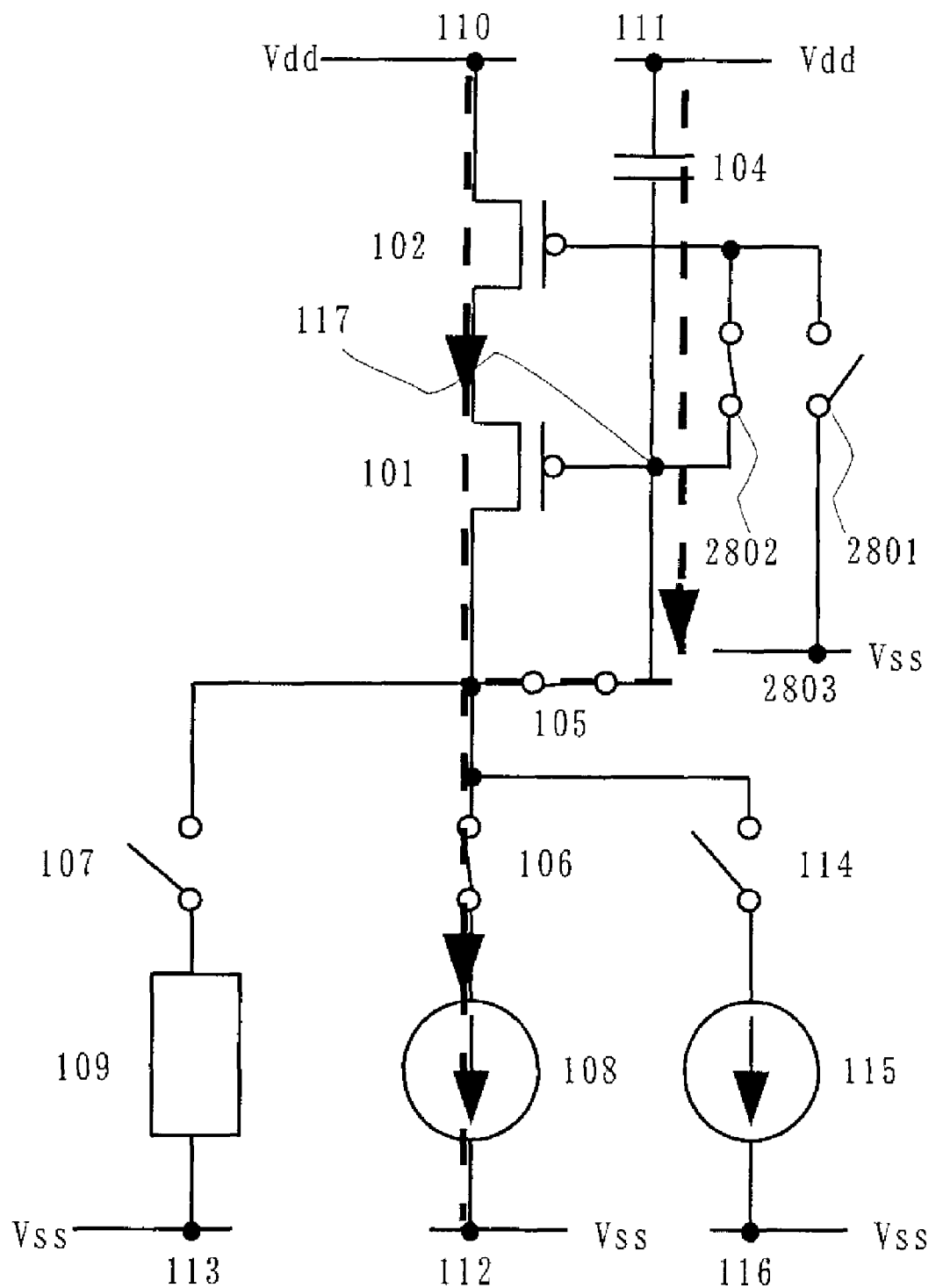
FIG. 30 is a diagram showing an operation of the current source circuit of the invention.

Next, the switches 2801, 107, and 114 are turned OFF and the switches 105, 106, and 2802 are turned ON as shown in FIG. 30. Then, the gate terminal of the switching transistor 102 and the gate terminal of the current source transistor 101 are connected to each other. Therefore, the current source transistor 101 and the switching transistor 102 operate as a multi-gate transistor. Therefore, assuming that the current source transistor 101 and the switching transistor 102 are one transistor, a gate length L thereof becomes longer than L of the current source transistor 101. Then, when a current flowing between the source and drain of the multi-gate transistor formed by the current source transistor 101 and the switching transistor 102 becomes equal to the current Ib1 of the basic current source 106, a current stops flowing to the capacitor 104. That is, a steady state is obtained. At that time, a potential of a gate terminal thereof is accumulated in the capacitor 104. The aforementioned operation corresponds to the set operation. At that time, the switching transistor 102 performs the current source operation.

Figure 31:
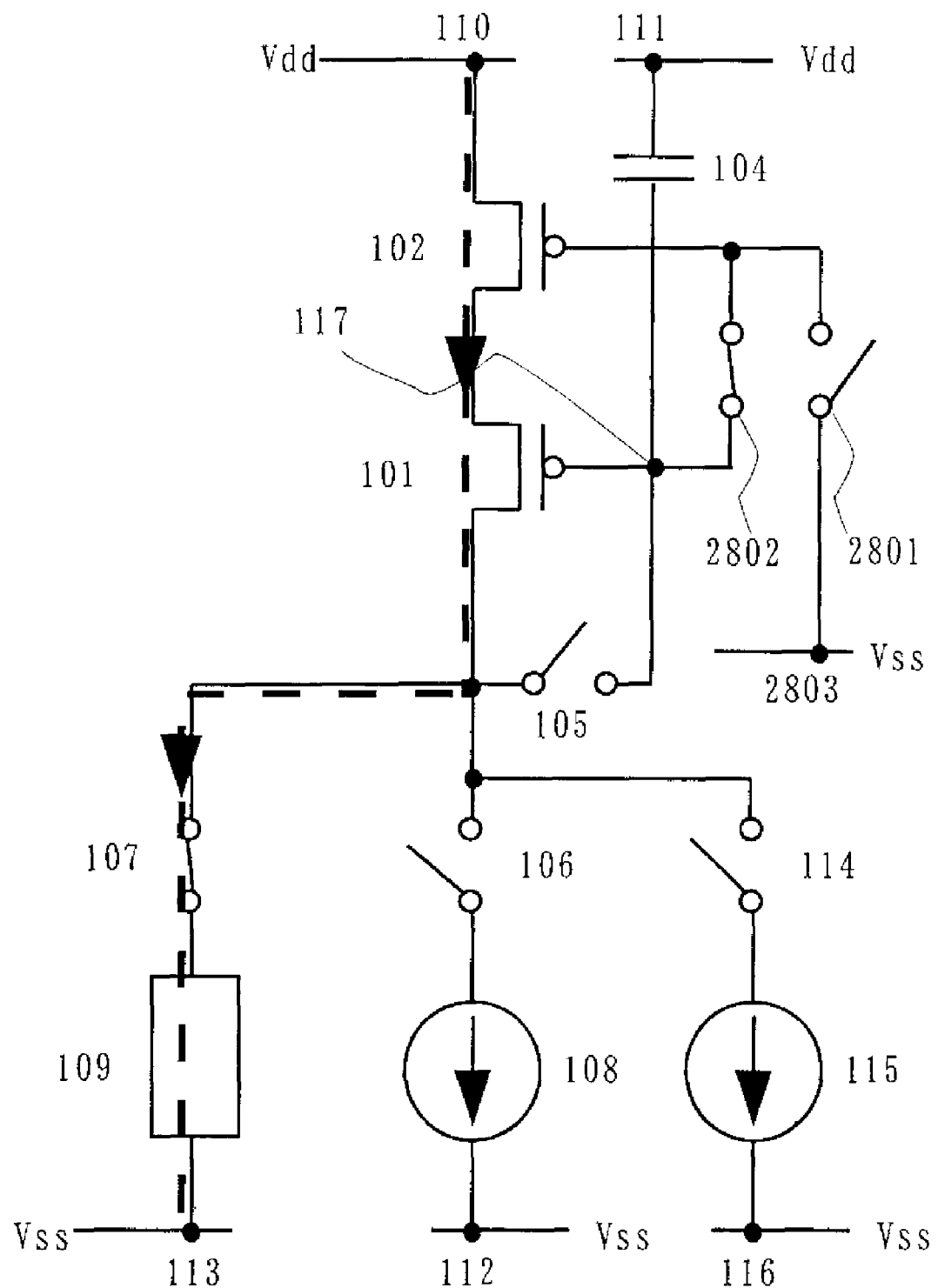
FIG. 31 is a diagram showing an operation of the current source circuit of the invention.

Next, the switches 2801, 105, 106, and 114 are turned OFF and the switches 107 and 2802 are turned ON as shown in FIG. 31. On the other hand, the capacitor 104 stores a charge accumulated in the set operation, which is applied to the gate terminals of the current source transistor 101 and the switching transistor 102. Thus, a current as large as Ib1 flows to the load 109. The aforementioned operation corresponds to the output operation.

Note that the potential of the wiring 2803 is not limited to Vss. It is only required to be a value which can turn ON the switching transistor 102 sufficiently.

Note that the current source circuit shown in FIG. 28 is described in this embodiment mode, however, a configuration of the invention is not limited to this and various changes can be made as far as they do not change the gist of the invention.

For example, by changing an arrangement and the number of switches, polarity of each transistor, the number and arrangement of the current source transistor 101, the number and arrangement of the basic current source, the number and arrangement of the switching transistor, a potential of each wiring, a combination with another precharge method, a direction of current flow and the like as in Embodiment Mode 1, various circuits can be employed in the configuration. Further, by combining each change also, the invention can be configured by using various circuits.

Figure 32:
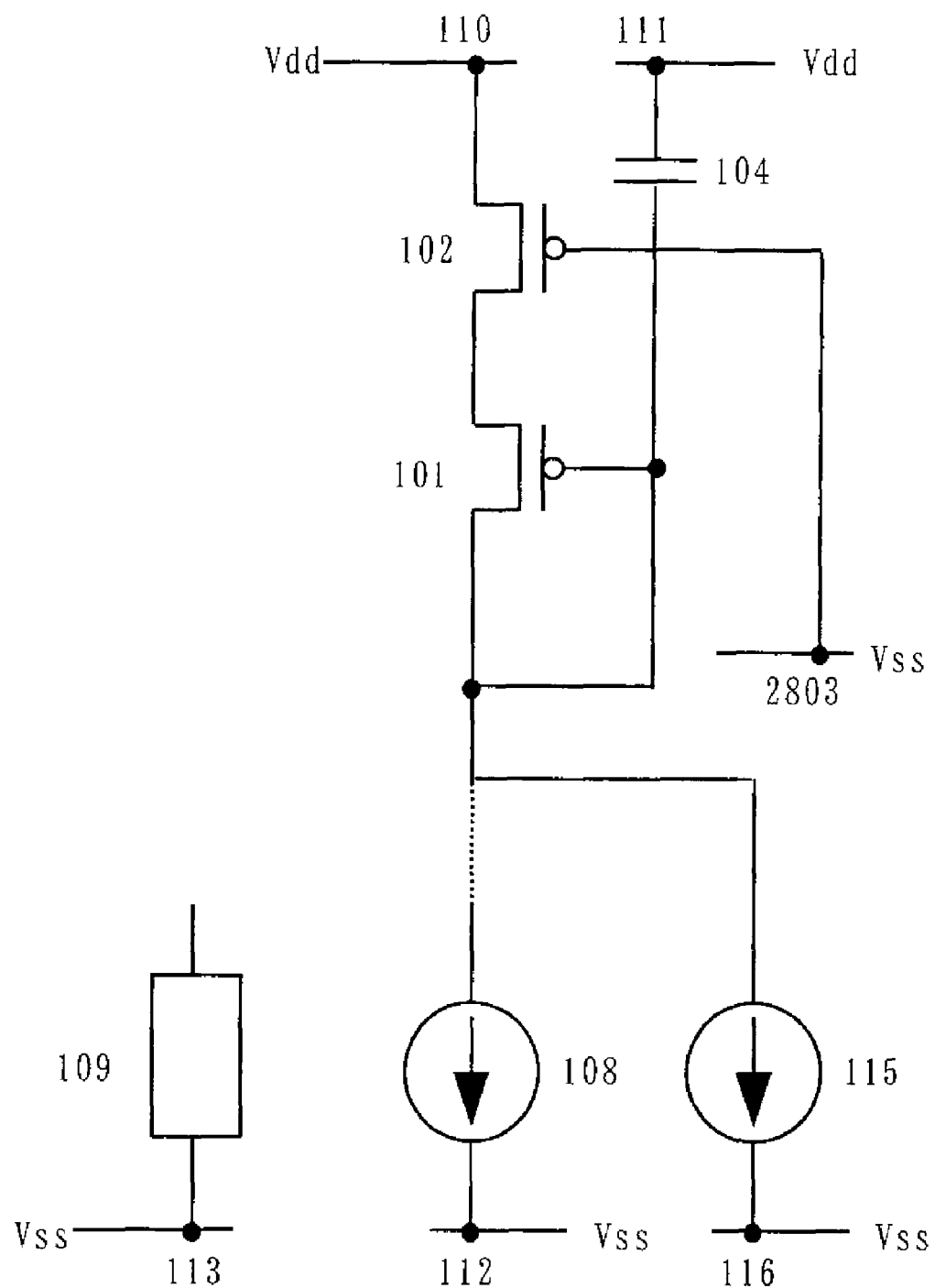
FIG. 32 is a diagram showing a connection of a certain operation of the current source circuit of the invention.
Figure 33:
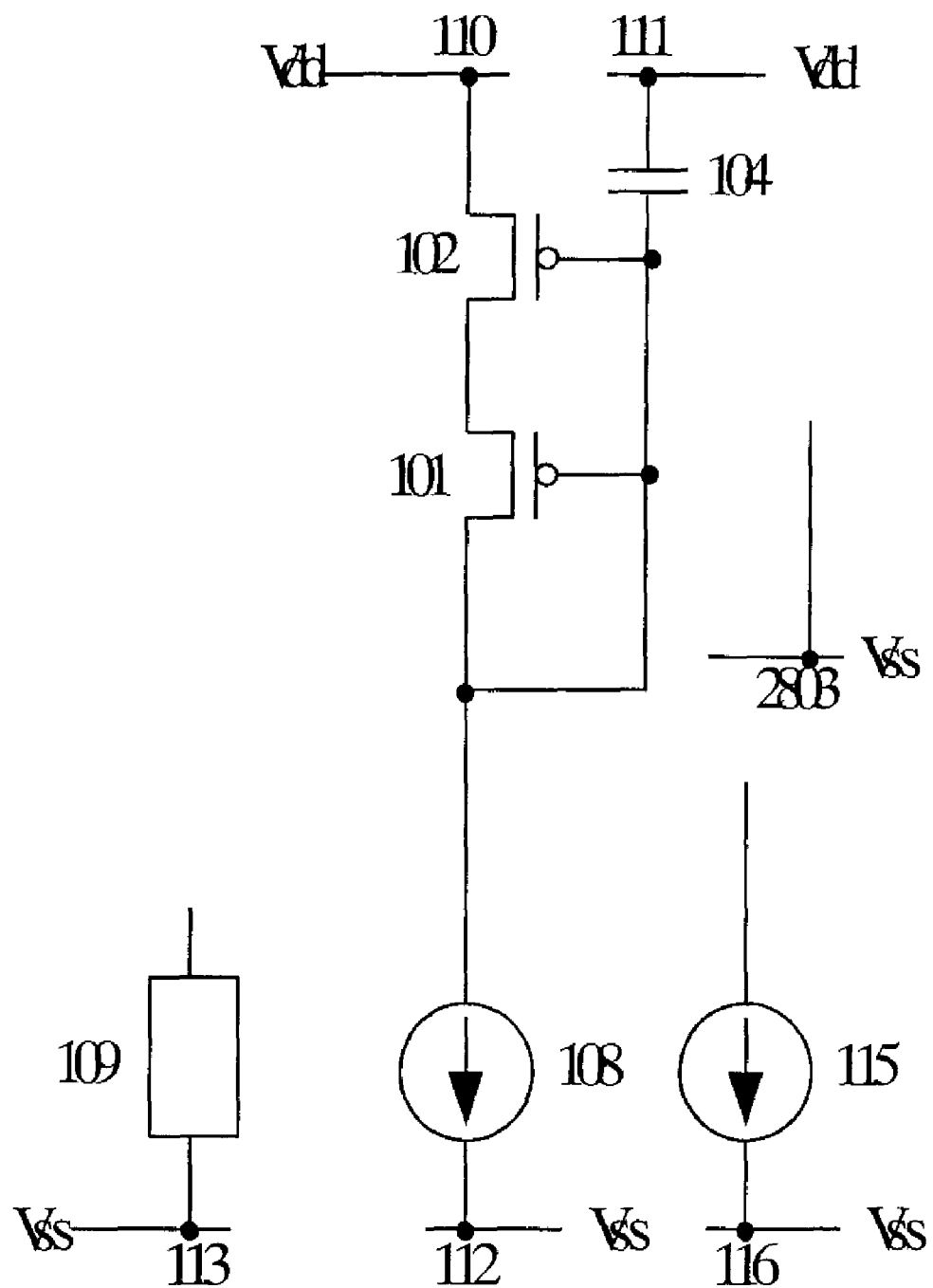
FIG. 33 is a diagram showing a connection of a certain operation of the current source circuit of the invention.
Figure 34:
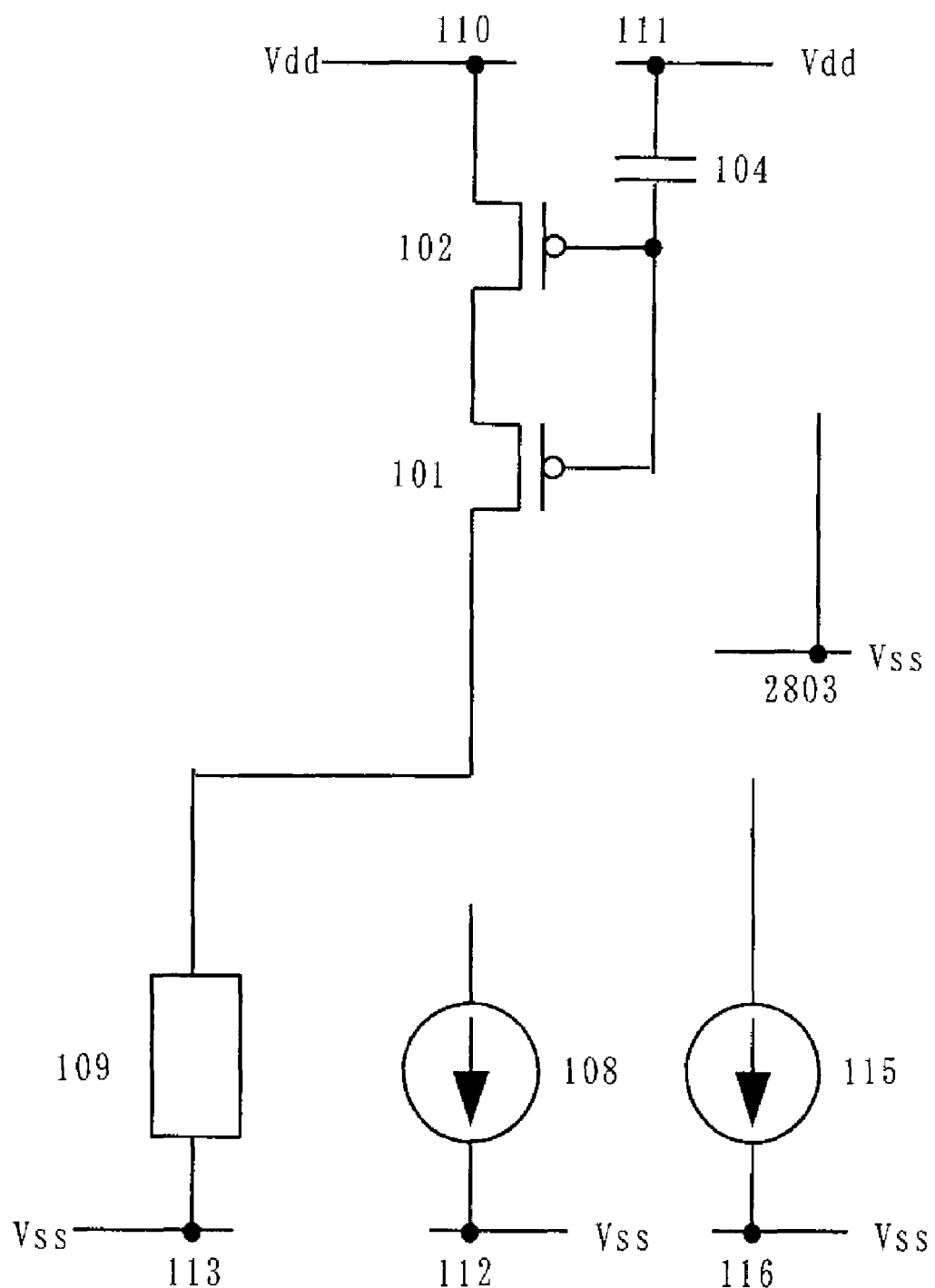
FIG. 34 is a diagram showing a connection of a certain operation of the current source circuit of the invention.

For example, each of the switches may be disposed anywhere as long as they are connected as shown in FIG. 32 in the precharge operation, connected as shown in FIG. 33 in the set operation, and connected as shown in FIG. 34 in the output operation.

Figure 35:
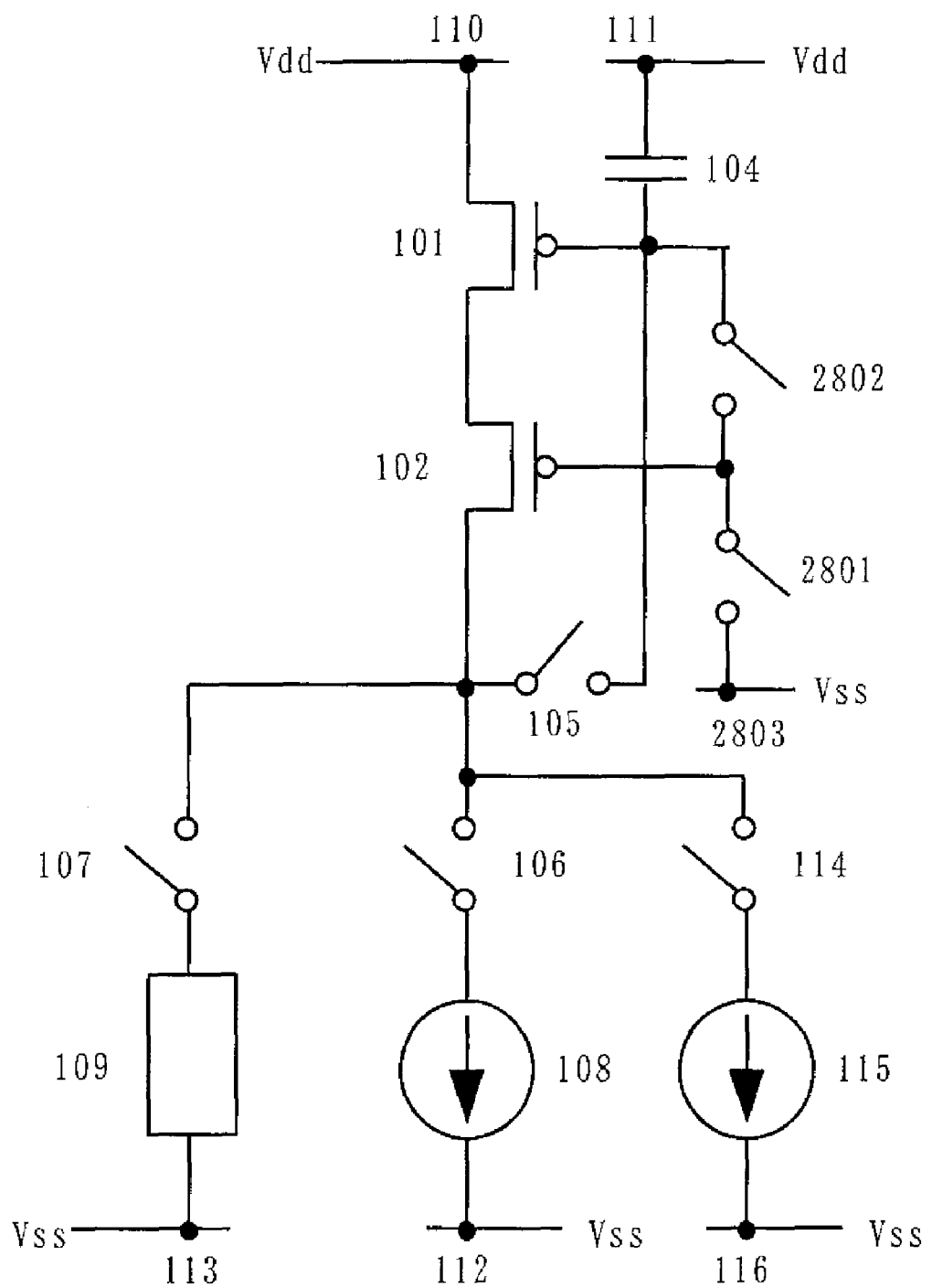
FIG. 35 is a diagram showing a configuration of the current source circuit of the invention.

FIG. 35 shows the case of exchanging the dispositions of the current source transistor 101 and the switching transistor 102. In FIG. 35, the wiring 110, the current source transistor 101, and the switching transistor 102 are disposed in this order.

Figure 36:
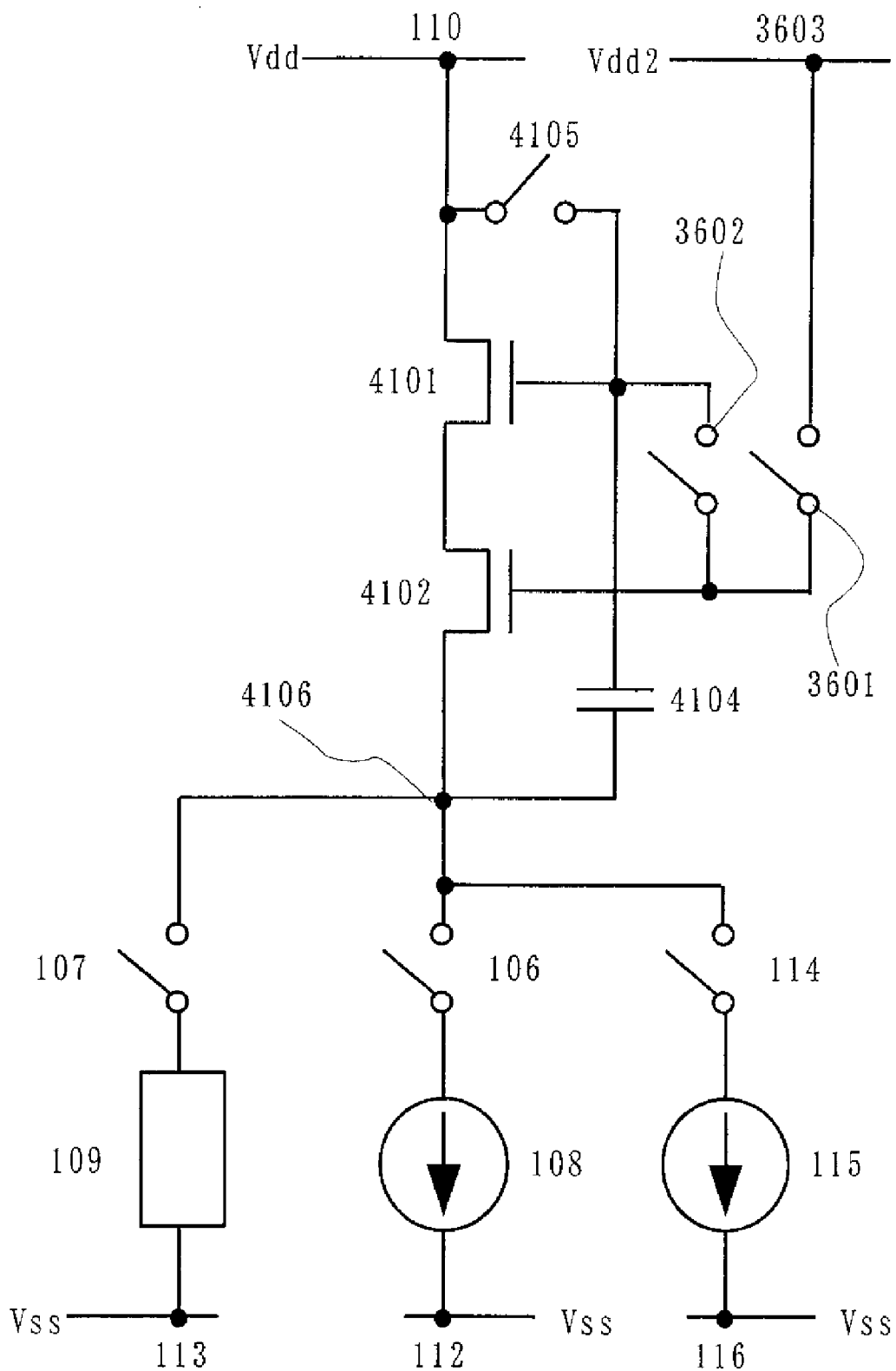
FIG. 36 is a diagram showing a configuration of the current source circuit of the invention.

Further, FIG. 36 shows the case of changing a polarity (conductivity) of the current source transistor 101 and the switching transistor 102 in the circuit of FIG. 28 by changing a connecting structure of the circuit without changing a direction of current flow.

There are a current source transistor 4101 which always operates as a current source (or a part of it) and a switching transistor 4102 of which operation changes according to the circumstance. The current source transistor 4101, the switching transistor 4102, and the wiring 110 are connected in series. The gate terminal of the current source transistor 4101 is connected to one of the terminals of a capacitor 4104. The other terminal 4106 of the capacitor 4104 is connected to the source terminal of the switching transistor 4102 (the current source transistor 4101). Therefore, a gate-source voltage of the current source transistor 4101 can be held. Further, the gate terminal and the drain terminal of the current source transistor 4101 are connected via a switch 4105. The capacitor 4104 can be controlled to hold a charge by ON/OFF of the switch 4105.

It is needless to say in this case also that the switches may be disposed anywhere as long as an operation of each of them can be normally performed in the precharge operation, the set operation, and the output operation.

Note that a wiring 3603 is supplied with Vdd2 which is higher than Vdd. The invention is not limited to this, however, a potential as high as possible is preferably supplied in order that a current drive capacity of the switching transistor 4102 becomes as large as possible in the short-circuit operation.

In this manner, by changing an arrangement and the number of switches, polarity of each transistor, the number and arrangement of the current source transistor, the number and arrangement of the basic current source, the number and arrangement of the switching transistor, a potential of each wiring, a combination with another precharge method, a direction of current flow and the like, various circuits can be employed in the configuration as well as the circuit of FIG. 28. Further, by combining each change also, the invention can be configured by using various circuits.

The contents described in this embodiment mode corresponds to Embodiment Mode 1 of which contents is partially changed. Therefore, the contents described in Embodiment Mode 1 can be applied to this embodiment mode as well.

Embodiment Mode 3

In this embodiment mode, a configuration example is described in which transistors are connected in parallel to change the summed value of currents flowing to each transistor, thereby performing the precharge operation and the set operation.

Note that the same part as Embodiment Modes 1 and 2 are not described anymore in the following description.

First, a configuration example of the case in which transistors are connected in parallel to perform the precharge operation and the set operation is described with reference to FIG. 37.

There are a set transistor 3702 which operates in a state that a current flows at least in the set operation, and a charge transistor 3701 which operates in a state that a current flows in the precharge operation. The set transistor 3702 and the charge transistor 3701 are connected in parallel. The gate terminal of the set transistor 3702 is connected to one terminal of a capacitor 3704. The gate terminal of the charge transistor 3701 is connected to one terminal of the capacitor 3704 as well. The other terminal of the capacitor 3704 is connected to a wiring 3708. Therefore, a potential of the gate terminal of the set transistor 3702 can be held. Further, a terminal 3710 and the drain terminal of the set transistor 3702 are connected via a switch 3703. Moreover, the terminal 3710 and the drain terminal of the charge transistor 3701 are connected via a switch 3706. Further, the terminal 3710 and the gate terminal of the set transistor 3702 are connected via a switch 3705. The capacitor 3704 can be controlled to hold a charge by ON/OFF of the switch 3705. Furthermore, the terminal 3710 and the wiring 112 are connected via the basic current source 108 and the switch 106. In parallel to the aforementioned, the terminal 3710 and the wiring 116 are connected via the second basic current source 115 and the switch 114. Similarly, in parallel to the aforementioned, the terminal 3710 and the wiring 113 are connected via the load 109 and the switch 107.

Figure 37:
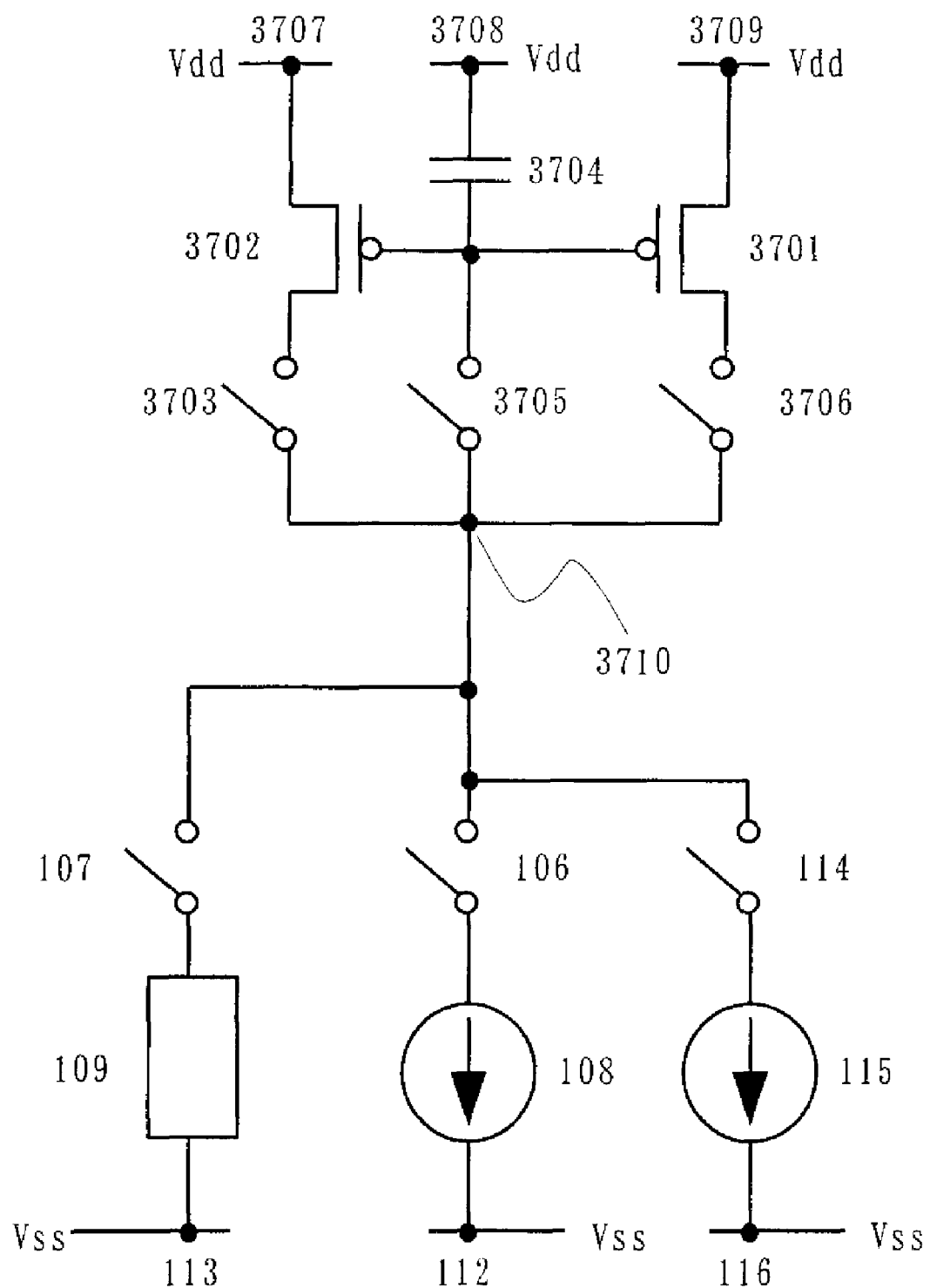
FIG. 37 is a diagram showing a configuration of the current source circuit of the invention.

By using the circuit having the configuration as shown in FIG. 37, the precharge operation can be performed rapidly. Therefore, by performing the set operation after performing the precharge operation, a steady state can be obtained rapidly.

Figure 38:
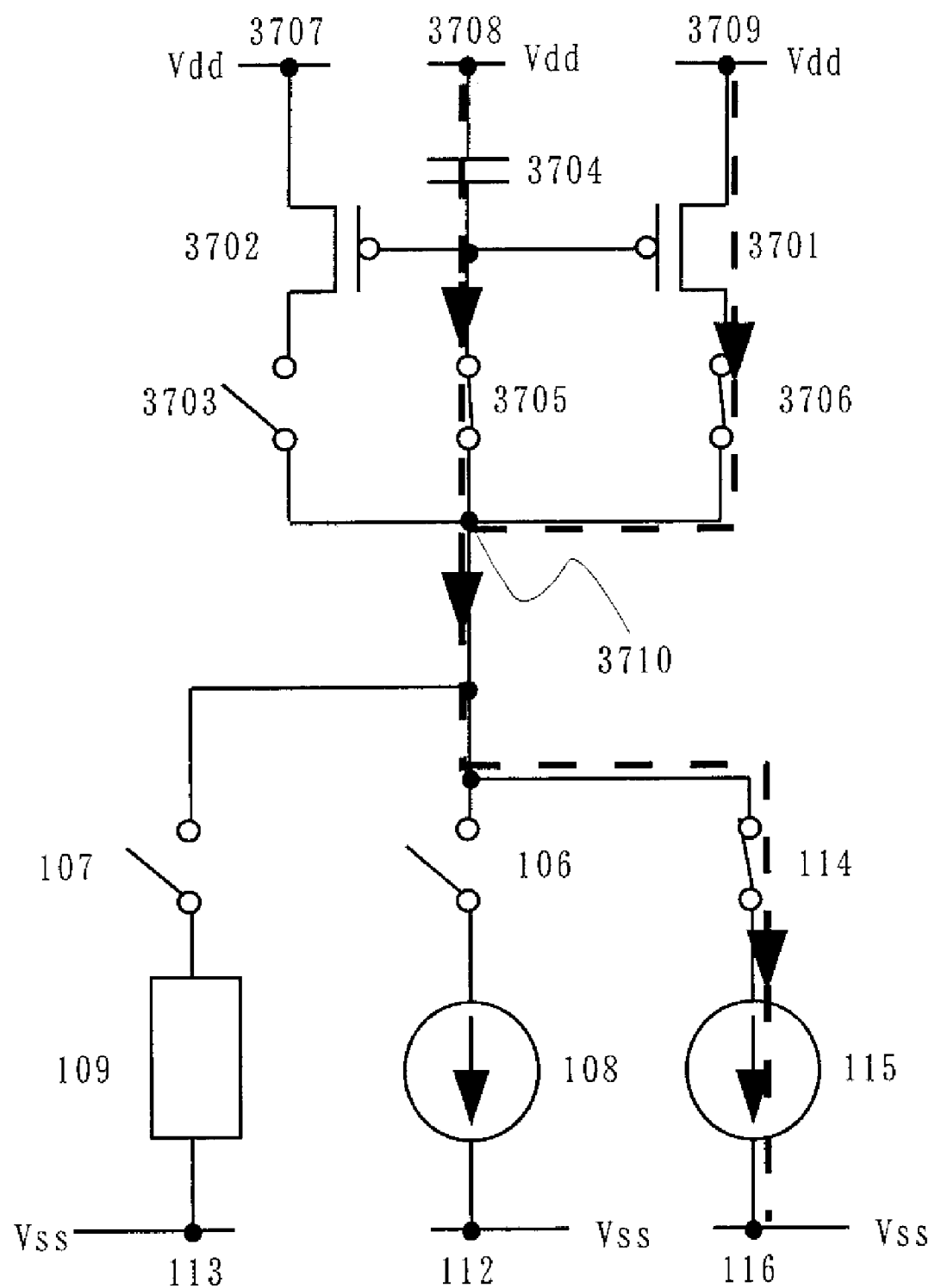
FIG. 38 is a diagram showing an operation of the current source circuit of the invention.

An operation of FIG. 37 is described now. First, the switches 3706, 3705, and 114 are turned ON and the switches 107, 106, and 3703 are turned OFF as shown in FIG. 38. Then, a current does not flow between the source and drain of the set transistor 3702. Therefore, the current Ib2 of the second basic current source 115 flows to the capacitor 3704 and the charge transistor 3701. Then, when a current flowing between the source and drain of the charge transistor 3701 and the current Ib2 of the second basic current source 115 become equal, a current stops flowing to the capacitor 3704. That is, a steady state is obtained. A potential of the gate terminal at that time is accumulated in the capacitor 3704. That is, a voltage required to flow the current Ib2 between the source and drain of the charge transistor 3701 is applied to the gate terminal thereof. The aforementioned operation corresponds to the precharge operation.

Figure 39:
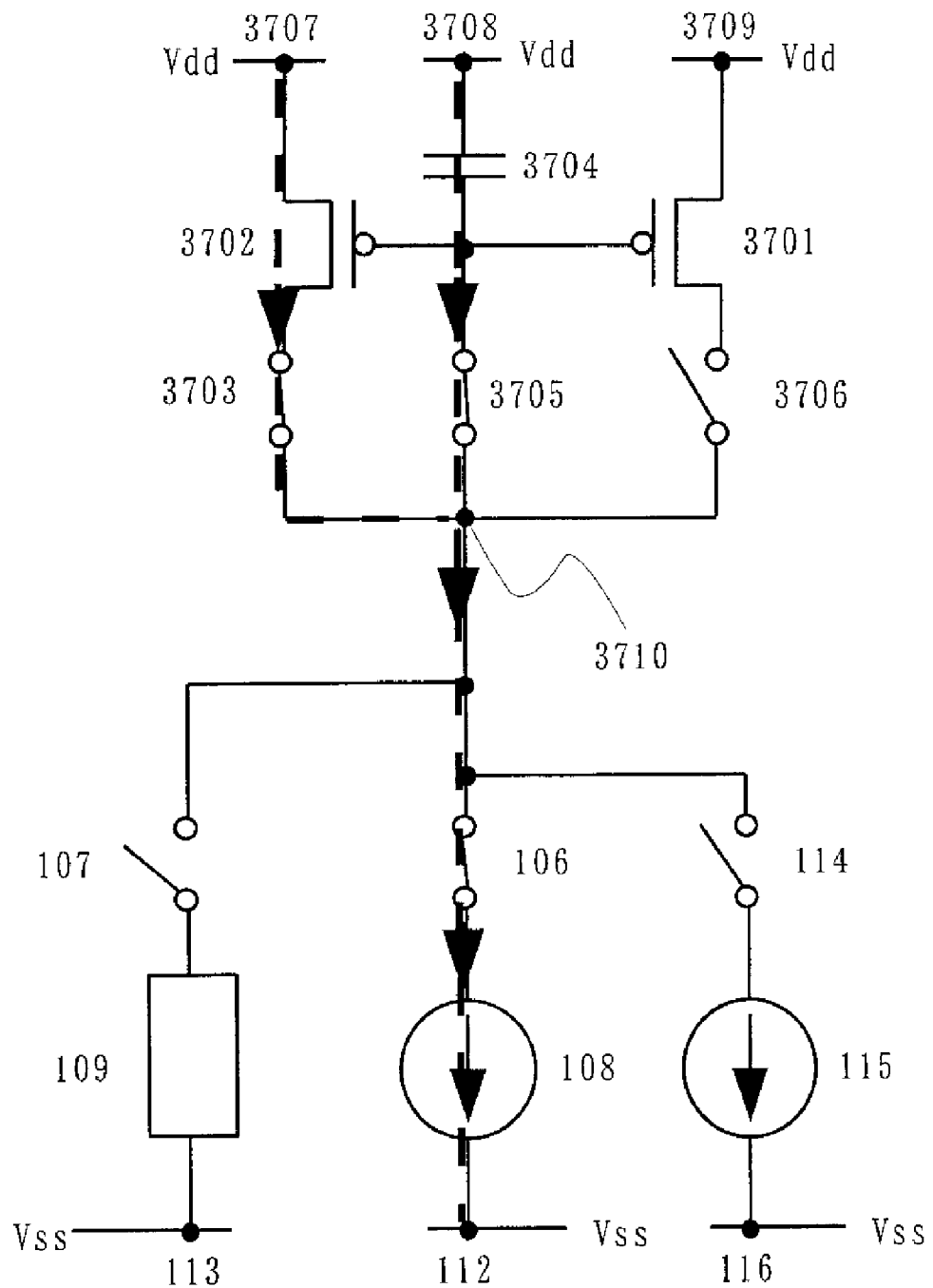
FIG. 39 is a diagram showing an operation of the current source circuit of the invention.

Next, the switches 3705, 3703, and 106 are turned ON and the switches 3706, 107, and 114 are turned OFF as shown in FIG. 39. Then, as the switch 3706 is OFF, a current does not flow between the source and drain of the charge transistor 3701. Therefore, the current Ib1 of the basic current source 108 flows to the capacitor 3704 and the set transistor 3702. Then, when a current flowing between the source and drain of the set transistor 3702 and the current Ib1 of the basic current source 108 become equal, a current stops flowing to the capacitor 3704. That is, a steady state is obtained. A potential of the gate terminal thereof at that time is accumulated in the capacitor 3704. That is, a voltage required to flow the current Ib1 between the source and drain of the set transistor 3702 is applied to the gate terminal thereof. The aforementioned operation corresponds to the set operation.

At this time, by appropriately setting the current Ib1 of the basic current source 108, the current Ib2 of the second basic current source 115, and a transistor size (gate width W, gate length L and the like) of the set transistor 3702 and the charge transistor 3701, a charge accumulated in the capacitor 3704, that is a potential of the gate terminal of the set transistor 3702 (or the charge transistor 3701) is controlled to be approximately equal in the precharge operation and the set operation. Then, in the case where the current Ib2 of the second basic current source 115 has a larger value than the current Ib1 of the basic current source 108, the capacitor 3704 can be charged in the precharge operation and a steady state can be obtained rapidly. After that, in the set operation, the steady state can be obtained rapidly even when the current Ib1 of the basic current source 108 is small in the set operation. This is because the capacitor 3704 is almost charged in the precharge operations.

Figure 40:
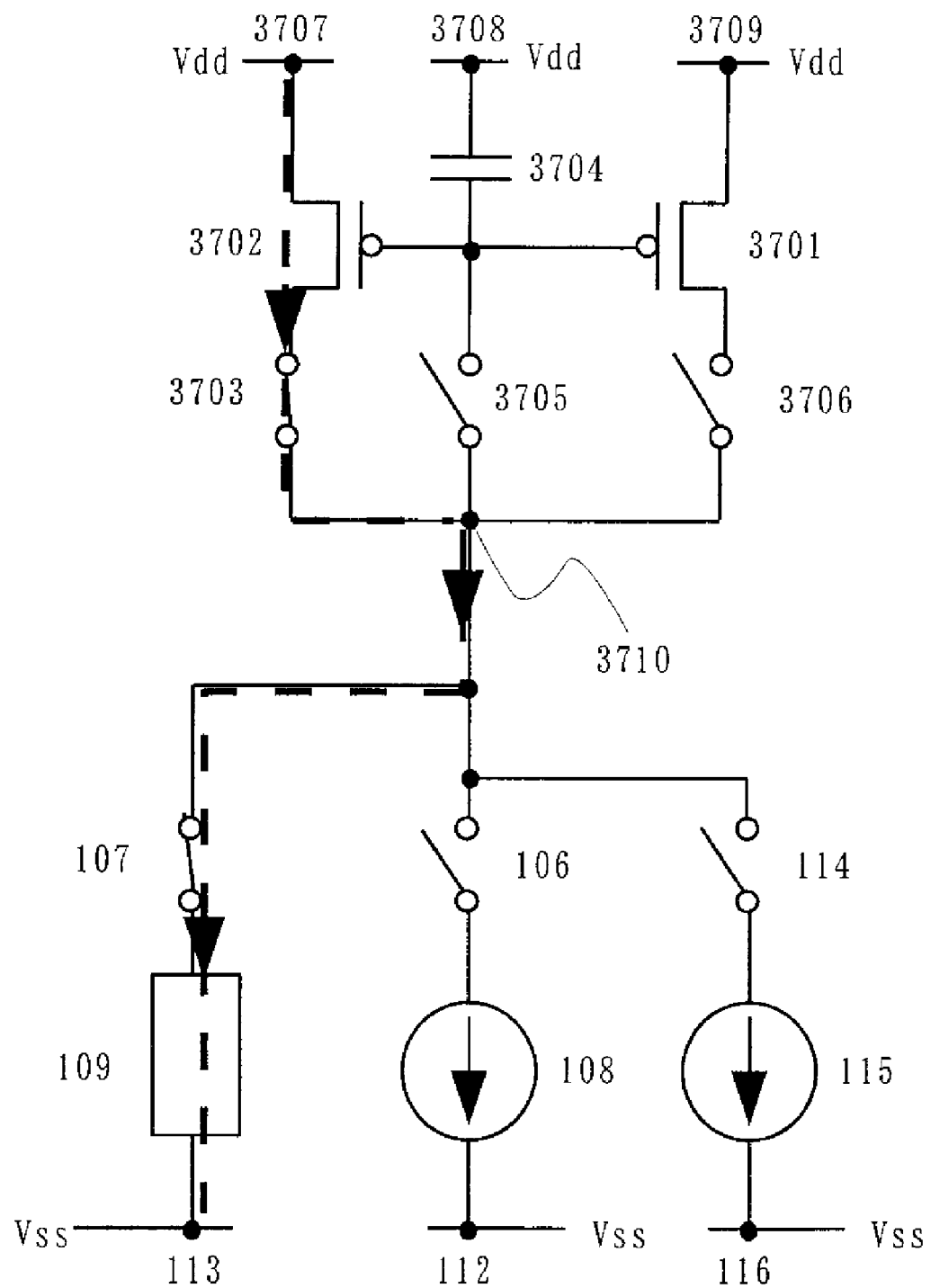
FIG. 40 is a diagram showing an operation of the current source circuit of the invention.

Next, the switches 3705, 3706, 106, and 114 are turned OFF and the switches 107 and 3703 are turned ON as shown in FIG. 40. Then, a current flows to the load 109. The aforementioned operation corresponds to an output operation.

In this manner, by controlling ON/OFF of the switches 3703 and 3706, a current flowing in the precharge operation can be large, which can achieve the steady state rapidly. That is, the steady state can be rapidly obtained by lessening the effect of a load which is parasitic on a wiring through which a current flows (wiring resistance, intersection capacitance and the like). At that time, a state which is approximately close to the steady state in the set operation is already obtained, Therefore, the steady state can be rapidly obtained in the set operation after the precharge operation.

Therefore, in the case where the load 109 is an EL element, a signal can be written rapidly when the EL element is to emit light in a low gray scale.

Now, a condition for a voltage accumulated in the capacitor 3704 to be approximately equal in the precharge operation and the set operation is described. First, it is assumed that a gate width of the charge transistor 3701 is Wa, a gate length thereof is La, and a gate width of the set transistor 3702 is Wb, the gate length thereof is Lb. Then, a current flowing in the set operation (the current Ib1 of the basic current source 108 in FIG. 3) times A equals to a current flowing in the precharge operation (the current Ib2 of the second basic current source 115 in FIG. 2).

Generally, a current flowing between a source and drain of a transistor is in proportion to a ratio of a channel width W and a channel length L: W/L. Therefore, a ratio of the gate width and the gate length Wa/La in the precharge operation and a ratio of the gate width and gate length Wb/Lb in the set operation are considered. The current Ib1 of the basic current source 108 times A equals to the current Ib2 of the second basic current source 115. Therefore, each value may be set so that Wb/Lb times A equals to Wa/La. Thus, a voltage of the capacitor 3704 (potentials of gate terminals of the charge transistor 3701 and the set transistor 3702) in the time T2a becomes approximately equal to a potential in the time T2b in FIG. 5, provided that current characteristics of the charge transistor 3701 and the set transistor 3702 are approximately the same.

Note that the capacitor 3704 can be substituted by a gate capacitance of the charge transistor 3701, the set transistor 3702, and the like. In that case, the capacitor 3704 can be omitted. Note that in the precharge operation, the switches 3706, 3705, and 114 are turned ON and the switches 107, 106, and 3703 are turned OFF and a current does not flow to the set transistor 3702 in FIG. 38, however, the invention is not limited to this. For example, by turning ON the switches 3706, 3705, 3703, and 114 and turning OFF the switches 107 and 106 as shown in FIG. 41, a current may flow to the set transistor 3702.

Figure 41:
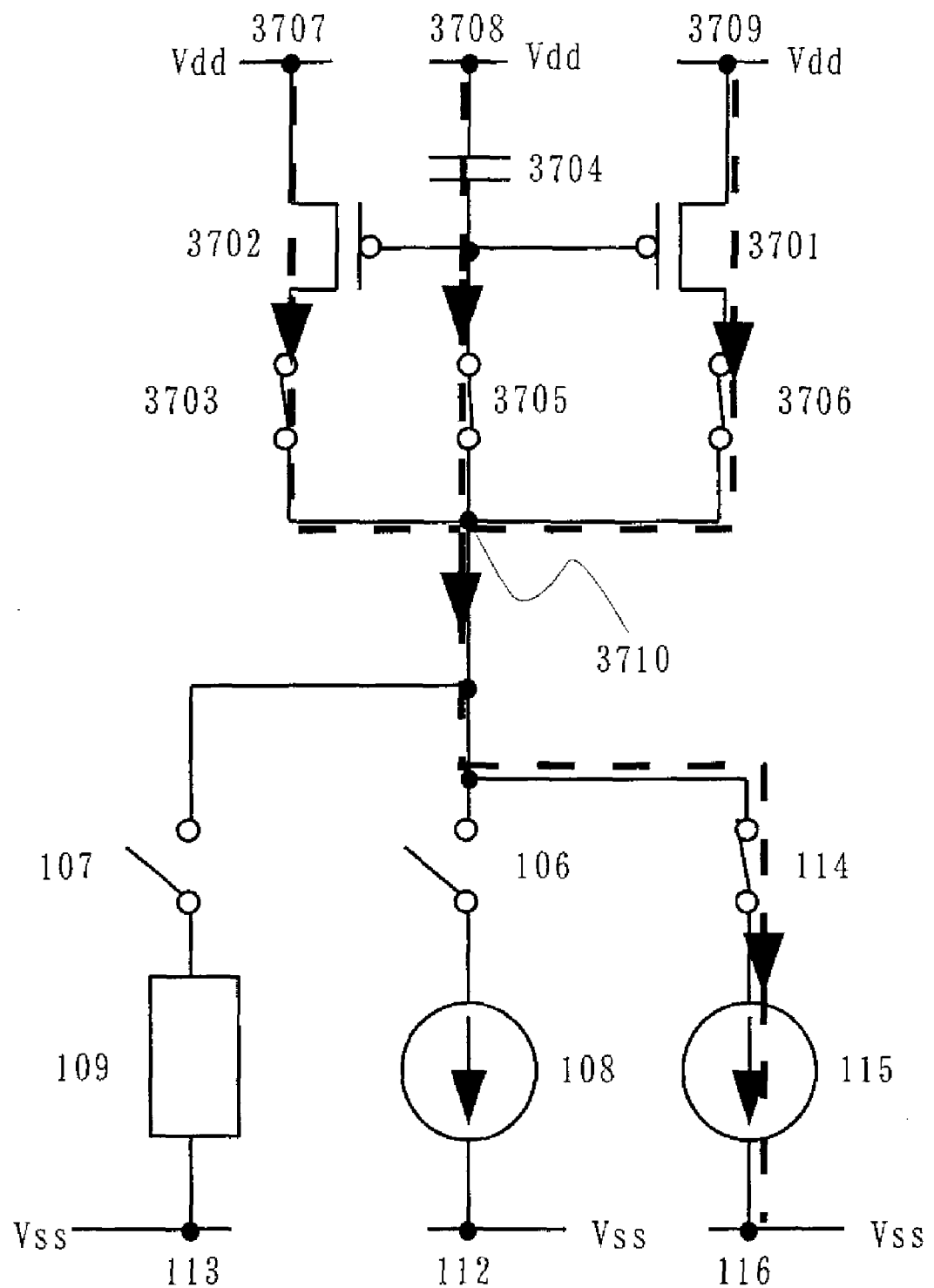
FIG. 41 is a diagram showing an operation of the current source circuit of the invention.

In the precharge operation, the switch 114 is turned ON and the switches 107 and 106 are turned OFF and a current of the second basic current source 115 flows and the current of the basic current source 108 does not flow in FIGS. 38 and 41, however, the invention is not limited to this. For example, the switches 114 and 106 may be turned ON and the switch 107 may be turned OFF so the currents of the second basic current source 115 and the basic current source 108 flow.

Note that a wiring 3707, a wiring 3708, and a wiring 3709 are supplied with a power source on the high potential side Vdd, however, the invention is not limited to this. Each wiring may have the same potential or a different potential. The wiring 3708 is only required to be capable of storing a charge of the capacitor 3704. Further, the wiring 3707, the wiring 3709, or the wiring 3708 is not required to constantly maintain the same potential. The potential may change between the set operation and the output operation as long as a normal operation can be obtained.

Note that the capacitor 3704 is connected to gate terminals of the charge transistor 3701 and the set transistor 3702 and the wiring 3708, however, the invention is not limited to this. It is most preferable that the capacitor 3704 be connected to the gate terminal and a source terminal of the set transistor 3702. This is because the operation of a transistor is not easily influenced by other effects (an effect of a voltage drop and the like due to a wiring resistance and the like) as long as a voltage is maintained between the gate terminal and the source terminal since the operation of the transistor is determined by a gate-source voltage. Provided that the capacitor 3704 is disposed between the gate terminals of the charge transistor 3701 and the set transistor 3702 and another wiring, a potential of the gate terminals of the charge transistor 3701 and the set transistor 3702 may change depending on the level of voltage drop of that another wiring.

Note that the charge transistor 3701 and the set transistor 3702 are required to have approximately the same potentials in the precharge operation and the set operation, therefore, these transistors preferably have the same polarity (have the same conductivity type).

Note that the gate widths W of the charge transistor 3701 and the set transistor 3702 may be the same or different. Similarly, the gate length L may be the same or different. The gate length L of the set transistor 3702 being longer, a current flowing in the set operation and the output operation becomes smaller. Further, even when a source-drain voltage in a saturation region changes, a current value hardly changes. That is, a kink effect can be small. Similarly, the gate width W of the set transistor 3702 being shorter, a current flowing in the set operation and the output operation becomes smaller. Therefore, an appropriate design may be employed according to the circumstance.

Note that the description is made with reference to FIG. 37 and the like in this embodiment mode, however, a configuration of the invention is not limited to this and various changes can be made as far as they do not change the gist of the invention. For example, by changing an arrangement and the number of switches, polarity of each transistor, the number and arrangement of the charge transistor 3701, the number and arrangement of the set transistor 3702, a potential of each wiring, a combination with another precharge method, a direction of current flow and the like as in Embodiment Modes 1 and 2, various circuits can be employed in the configuration. Further, by combining each change also, a configuration using various circuits can be achieved.

Figure 42:
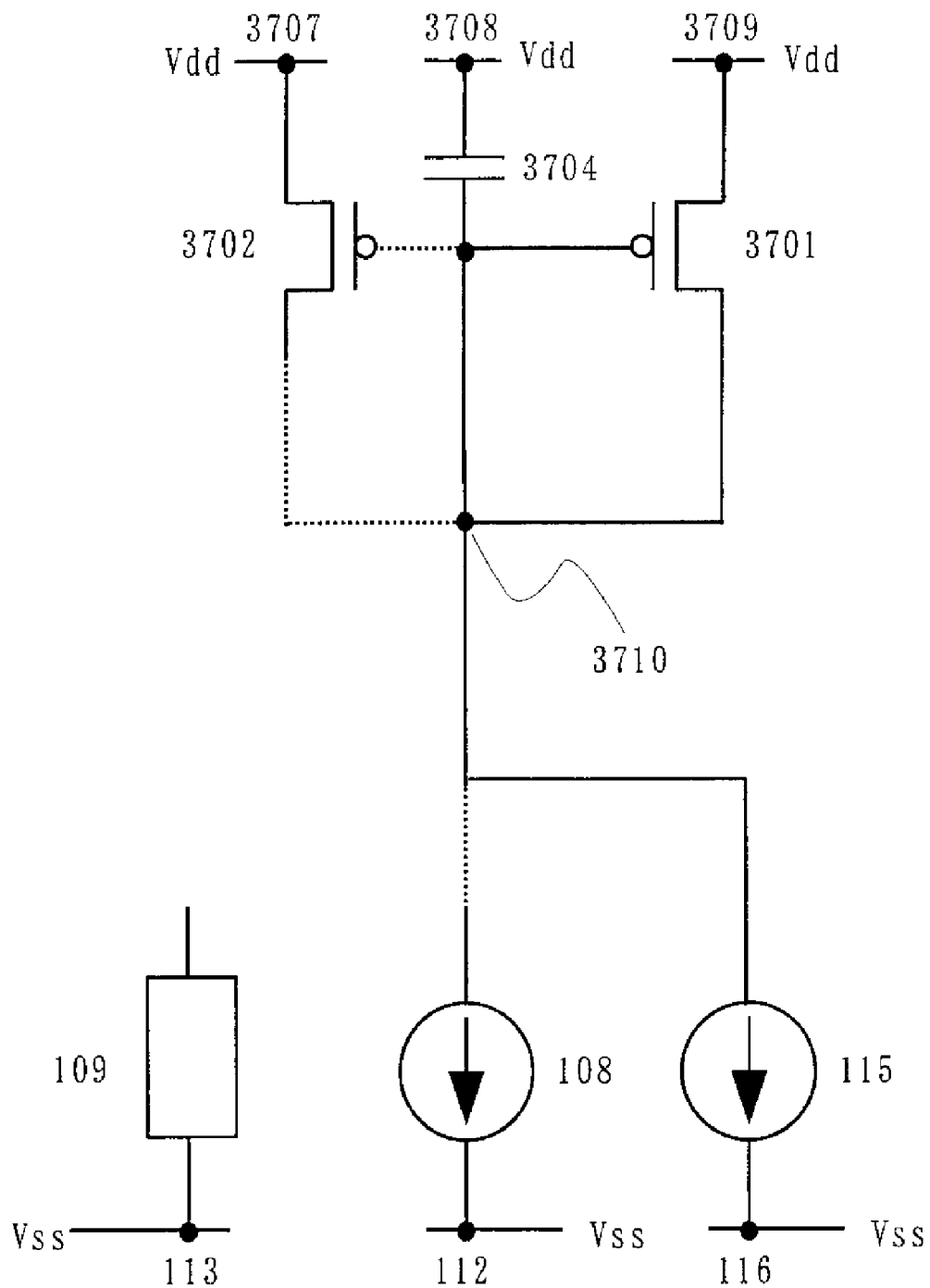
FIG. 42 is a diagram showing a connection of a certain operation of the current source circuit of the invention.
Figure 43:
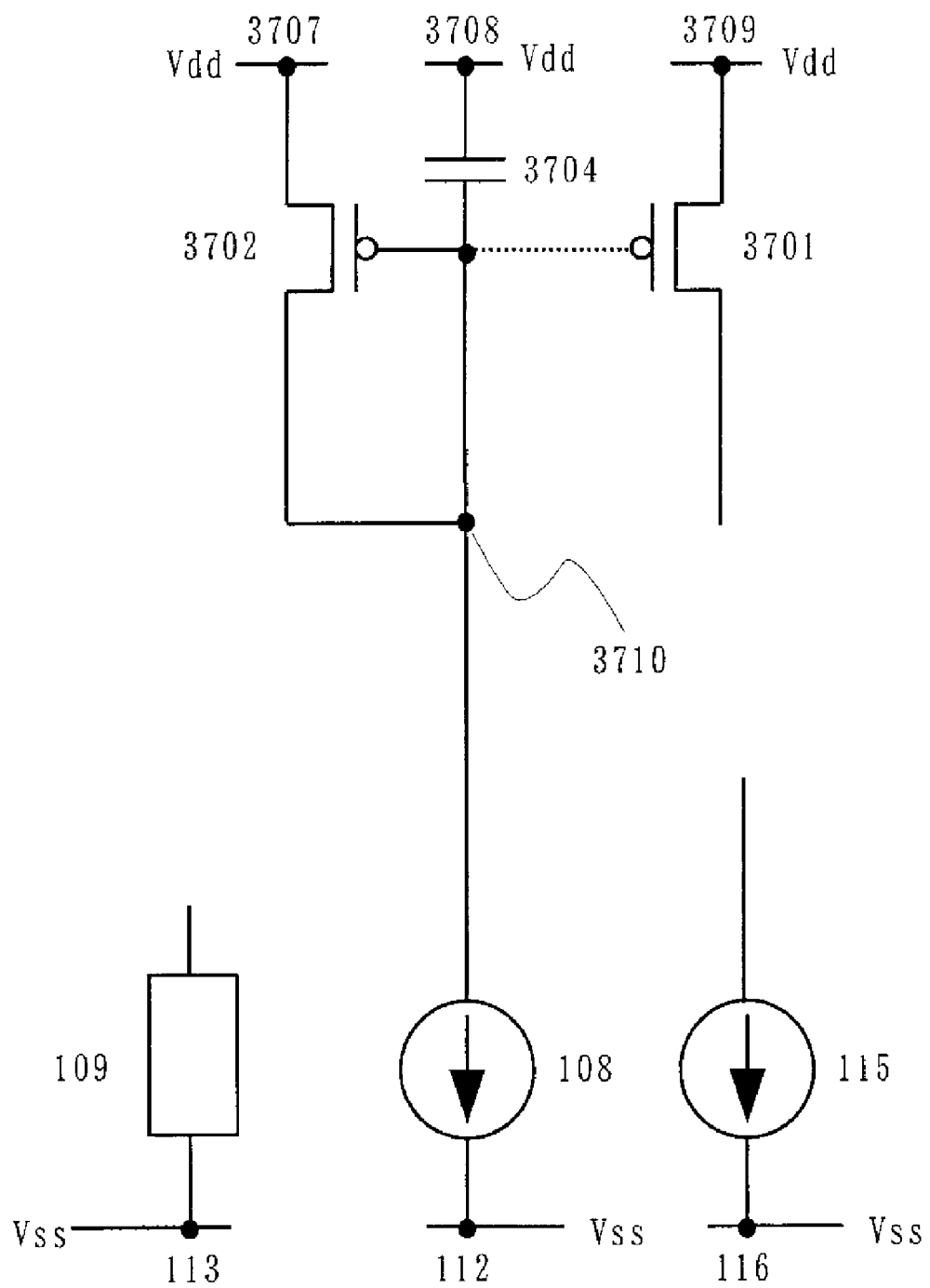
FIG. 43 is a diagram showing a connection of a certain operation of the current source circuit of the invention.
Figure 44:
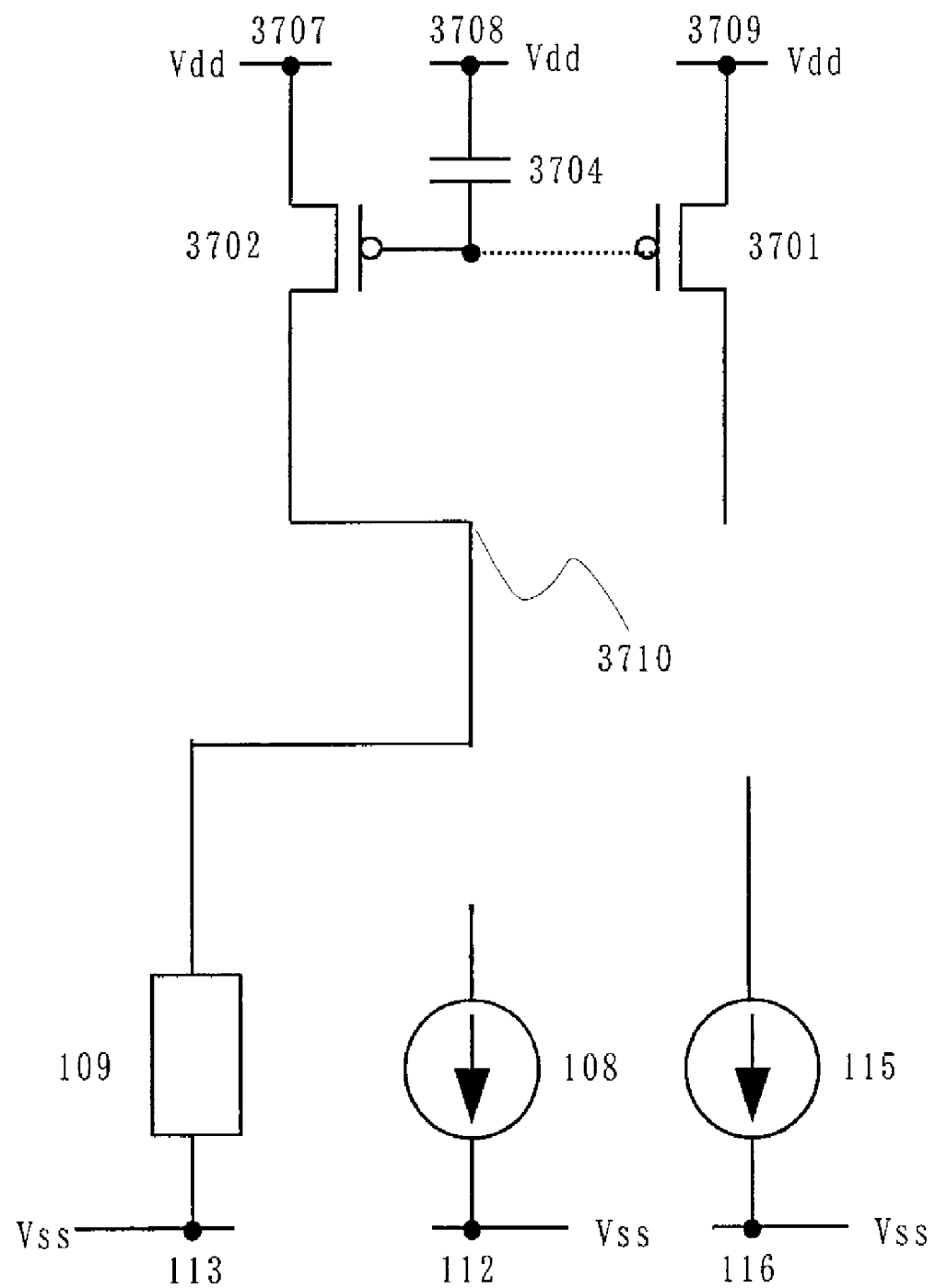
FIG. 44 is a diagram showing a connection of a certain operation of the current source circuit of the invention.
Figure 46:
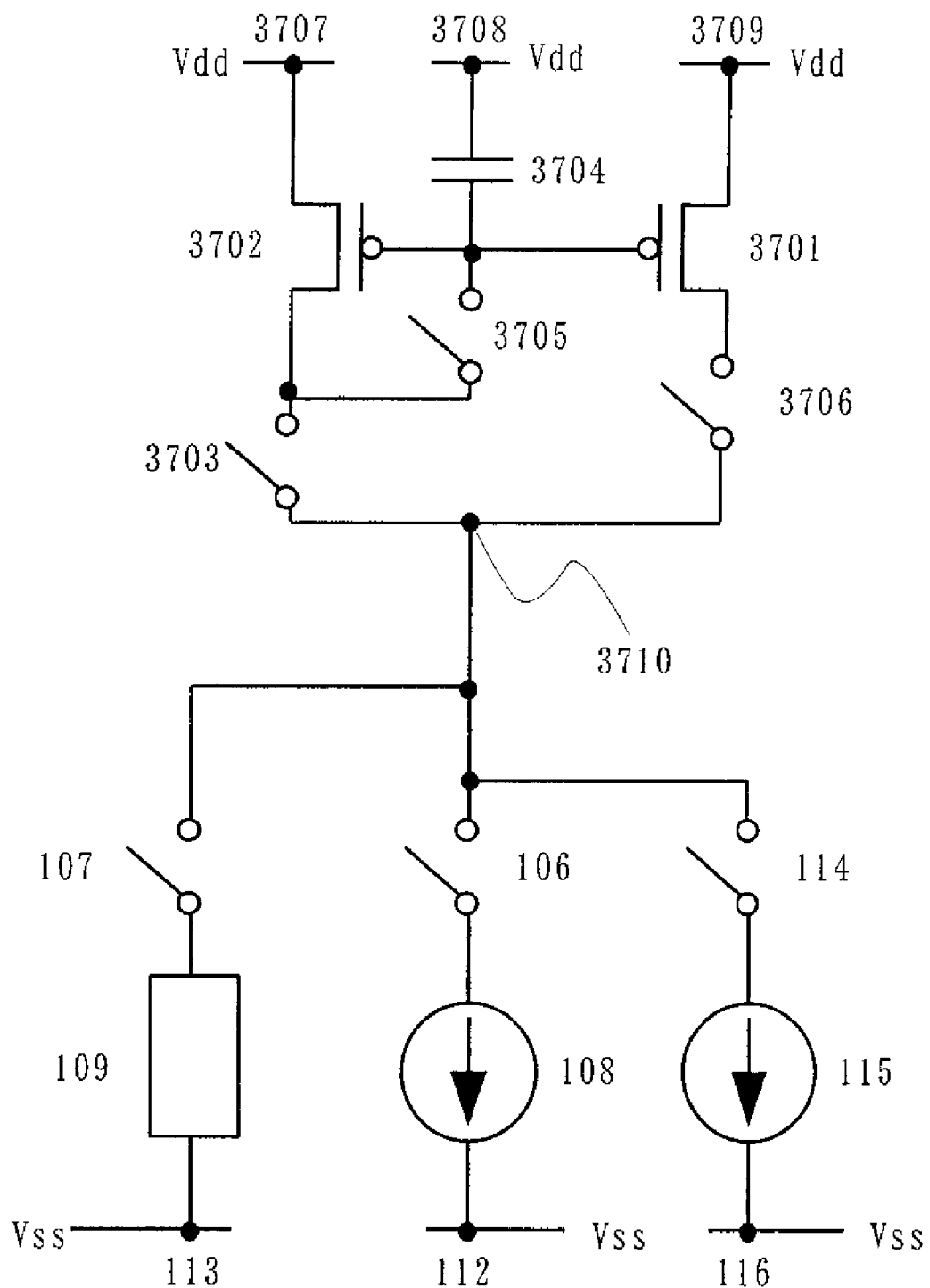
FIG. 46 is a diagram showing a configuration of the current source circuit of the invention.
Figure 47:
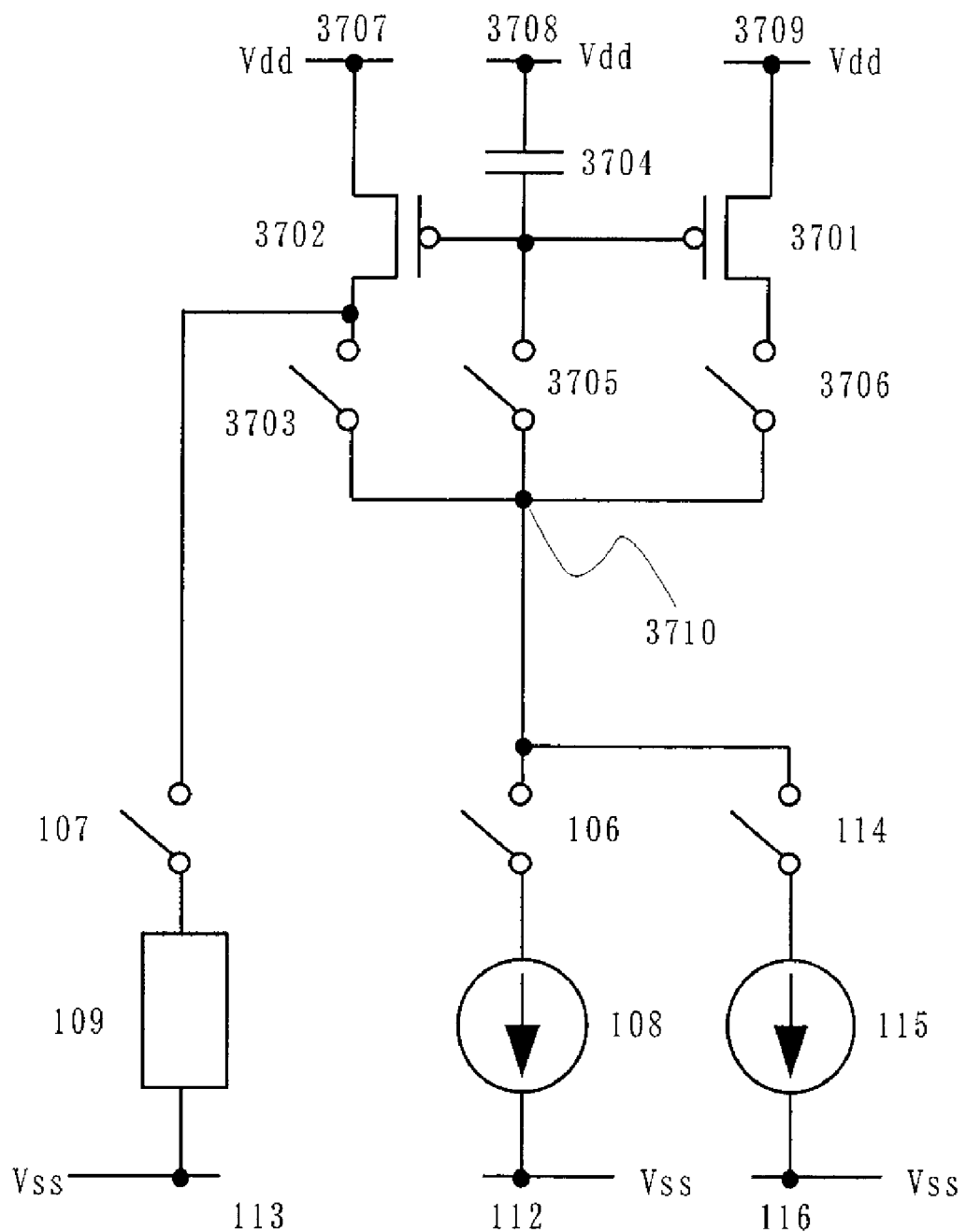
FIG. 47 is a diagram showing a pixel configuration of the invention.
Figure 48:
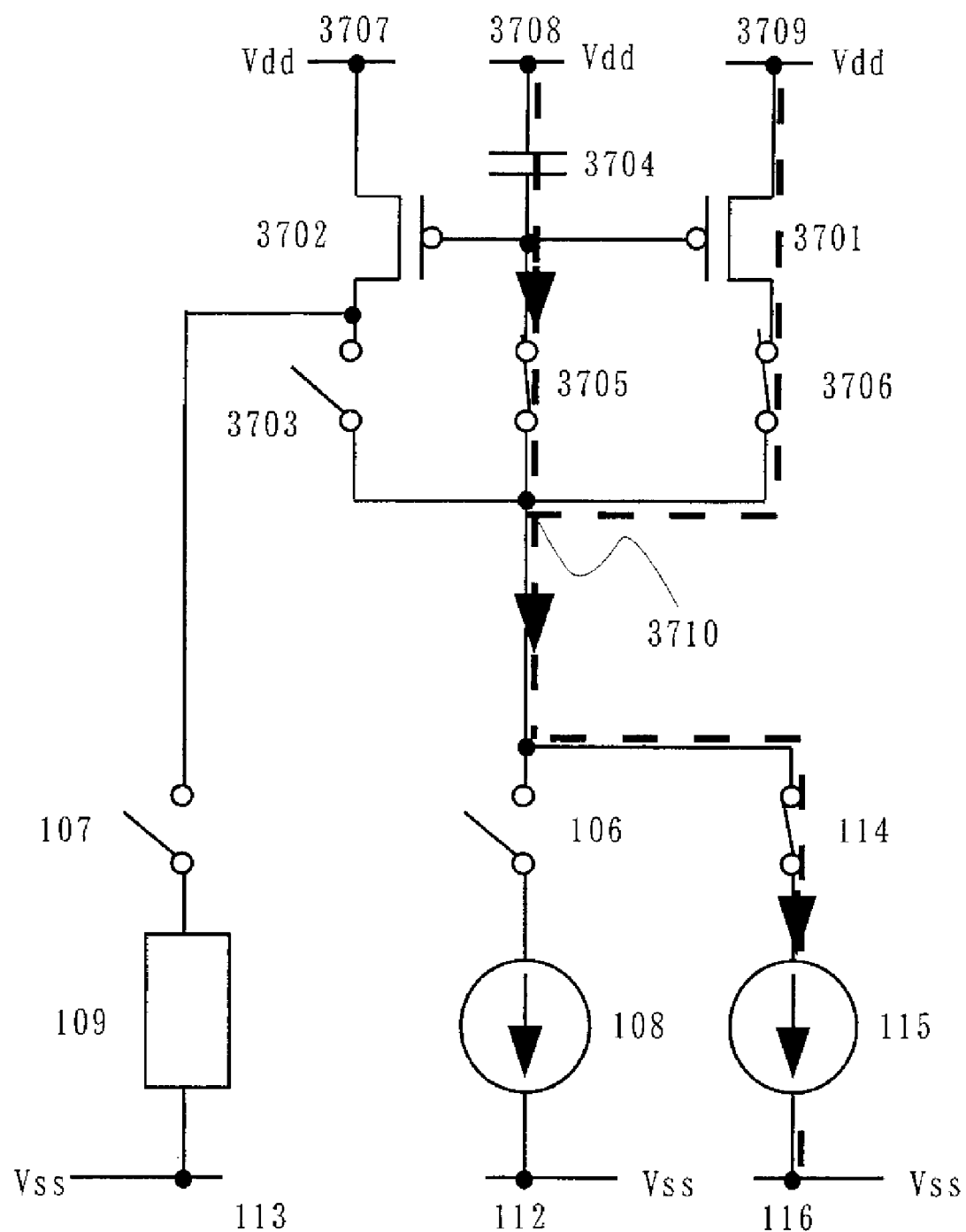
FIG. 48 is a diagram showing an operation of the current source circuit of the invention.
Figure 49:
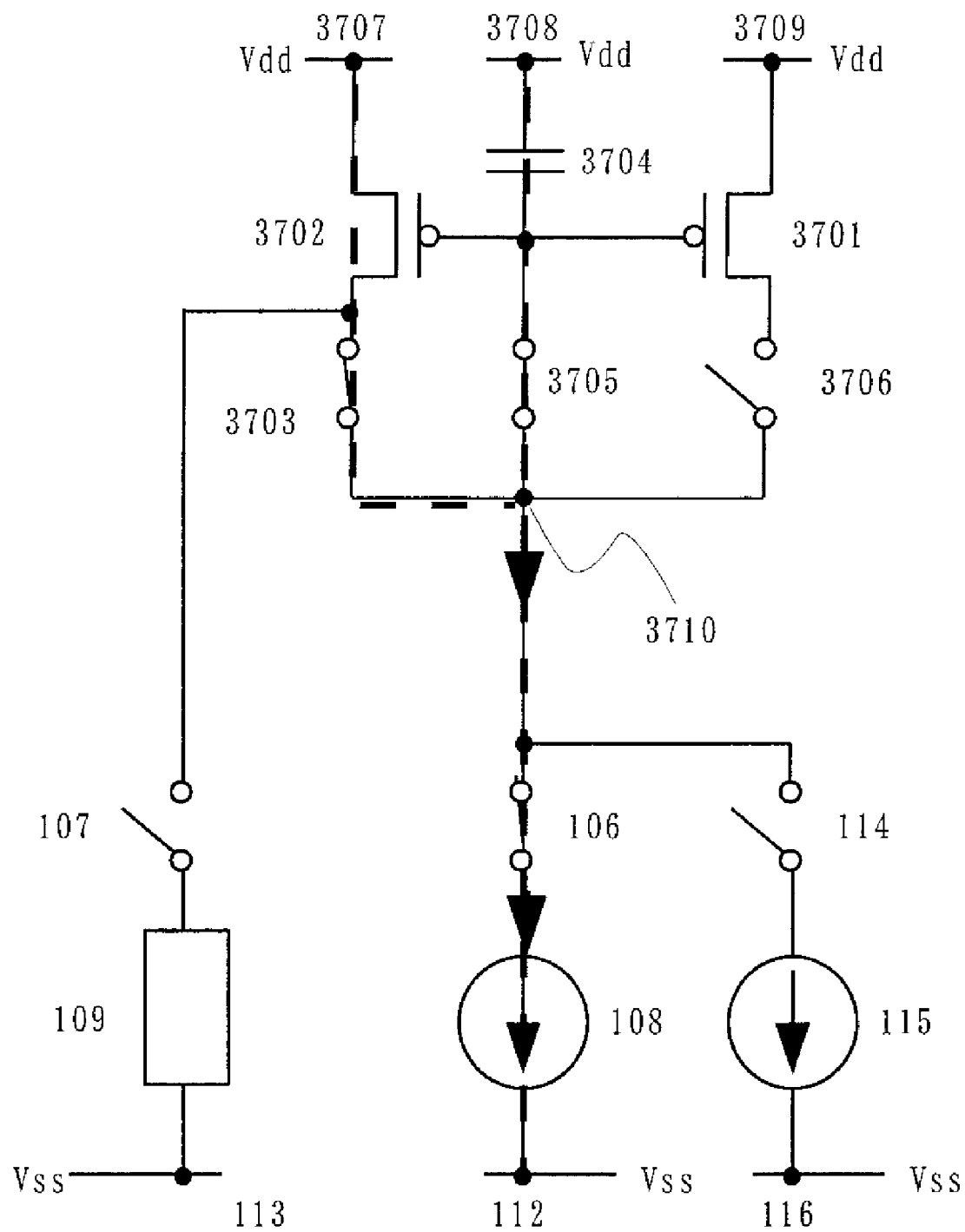
FIG. 49 is a diagram showing an operation of the current source circuit of the invention.
Figure 50:
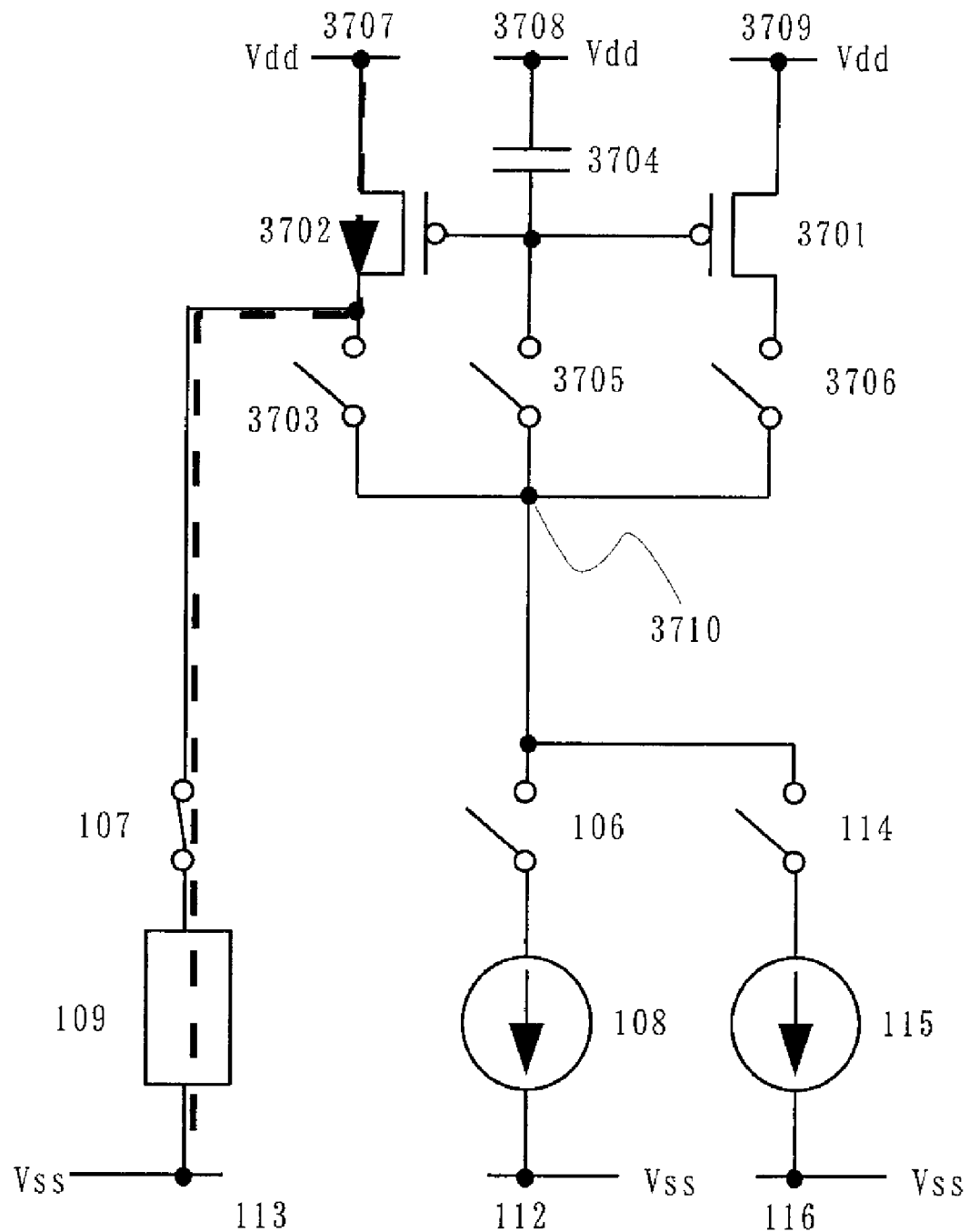
FIG. 50 is a diagram showing an operation of the current source circuit of the invention.

For example, each of the switches may be disposed anywhere as long as they are connected as shown in FIG. 42 in the precharge operation, connected as shown in FIG. 43 in the set operation and connected as shown in FIG. 44 in the output operation. Note that a dotted portion and the like in FIGS. 42 to 44 may be either connected or not. Therefore, the gate terminals of the charge transistor 3701 and the set transistor 3702 may be connected via a switch. Alternatively, they may be connected as shown in FIG. 46. However, in the case of FIG. 46, the switch 3703 is required to be ON to flow a current to the set transistor 3702 in the precharge operation in order to flow a current to the capacitor 3704. Alternatively, they may be connected as shown in FIG. 47. FIGS. 48 to 50 show operations. FIG. 48 shows the case of the precharge operation. Note that either or both of the switches 3703 and 106 may be ON. FIG. 49 shows the case of the set operation. FIG. 50 shows the case of the output operation. Heretofore, the switch 3703 is ON in the output operation, however, the load 109 is connected to the set transistor 3702 without through the switch 3703 in the configuration of FIG. 47. Therefore, the switch 3703 is required to be OFF in the output operation.

Figure 51:
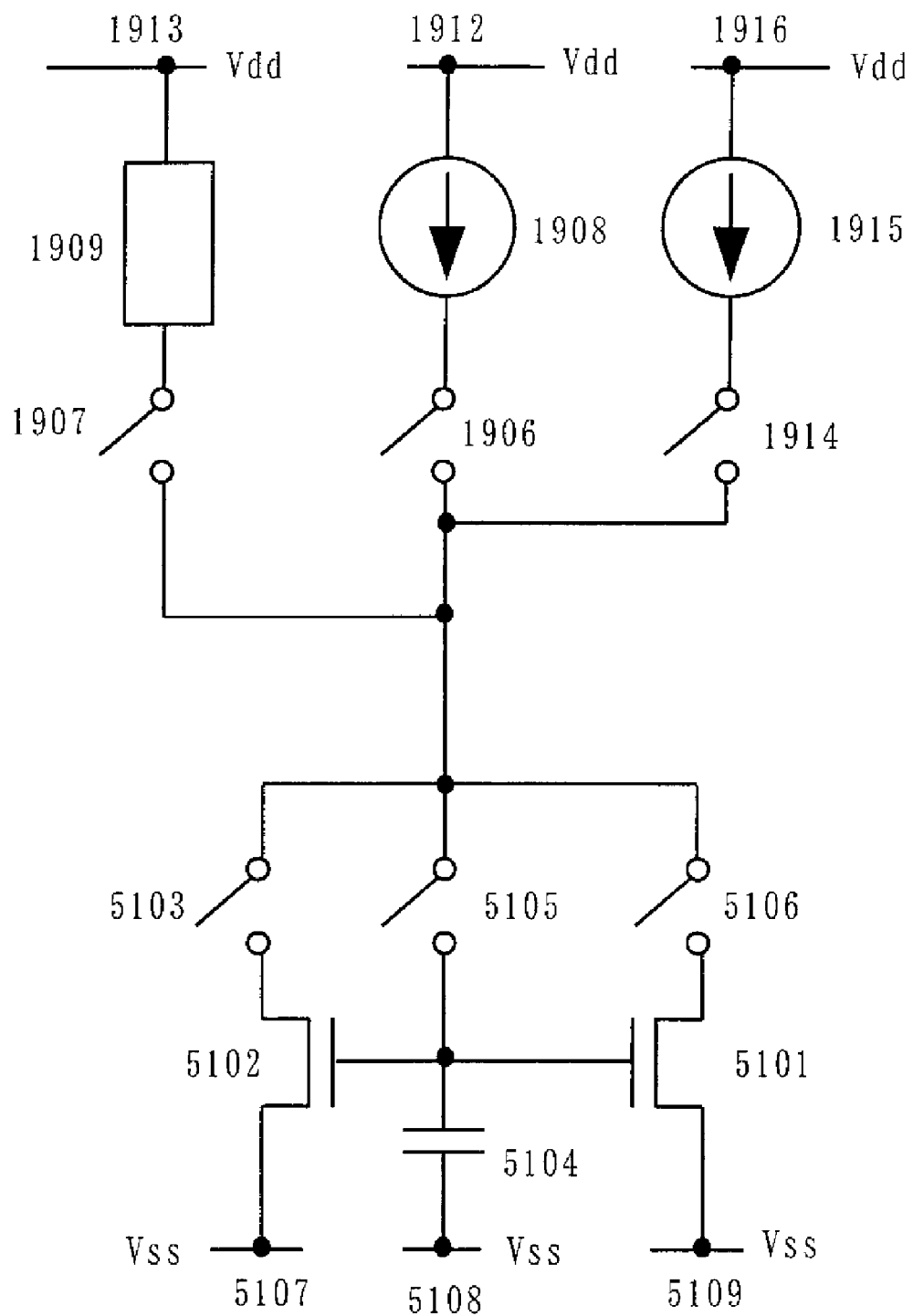
FIG. 51 is a diagram showing a configuration of the current source circuit of the invention.

Further, FIG. 51 shows the case of changing a polarity (conductivity) of the charge transistor 3701 and the set transistor 3702 by changing a direction of current flow without changing a connecting structure of the circuit relatively to a circuit of FIG. 37.

Figure 52:
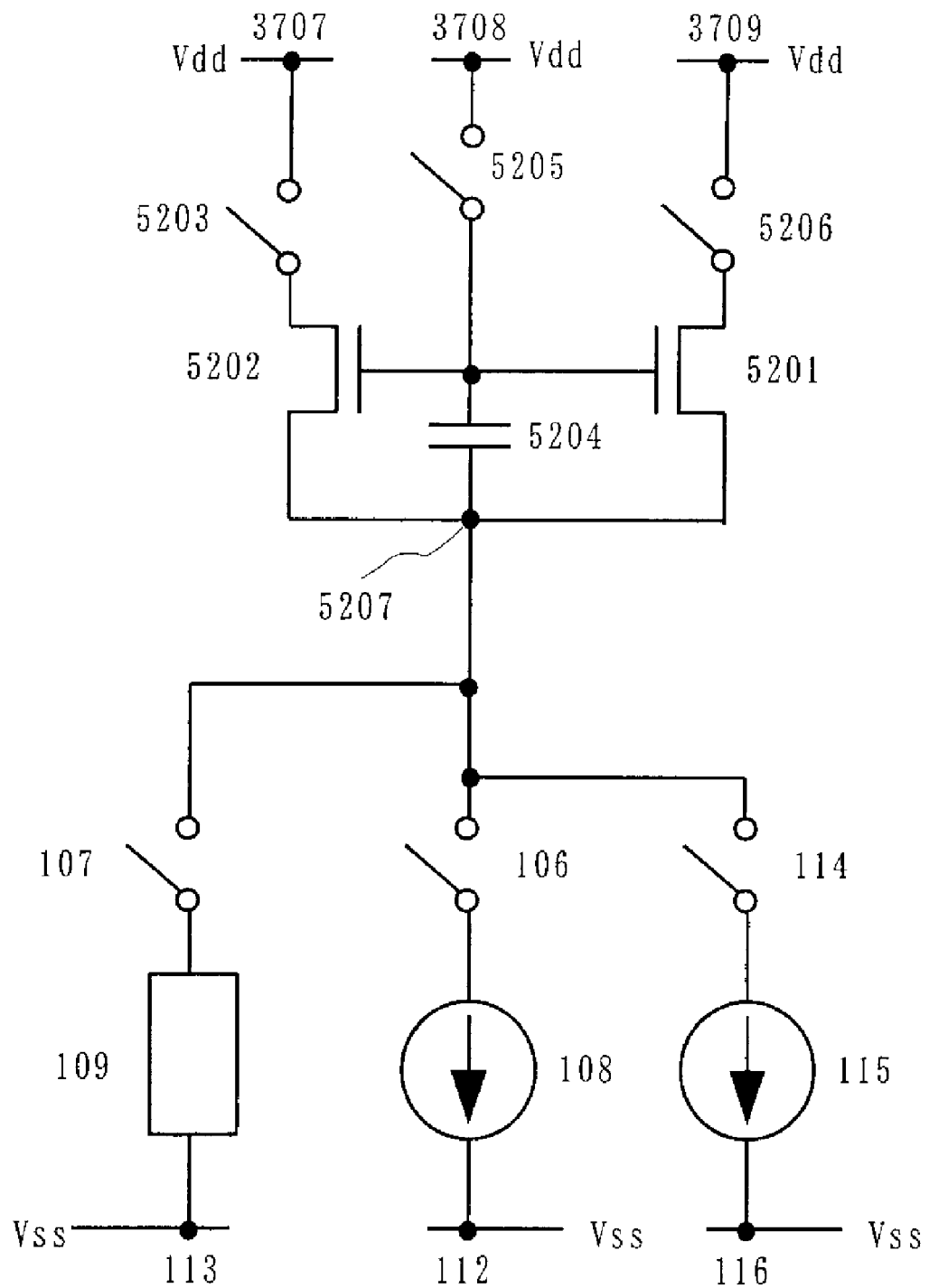
FIG. 52 is a diagram showing a configuration of the current source circuit of the invention.

FIG. 52 shows an example of the case of changing a polarity (conductivity) of the charge transistor 3701 and the set transistor 3702 by changing a direction of a current flow without changing a connecting structure of the circuit relatively to the circuit of FIG. 37. The description of an operation of the circuit of FIG. 52 is similar, therefore, it is omitted here.

Figure 53:
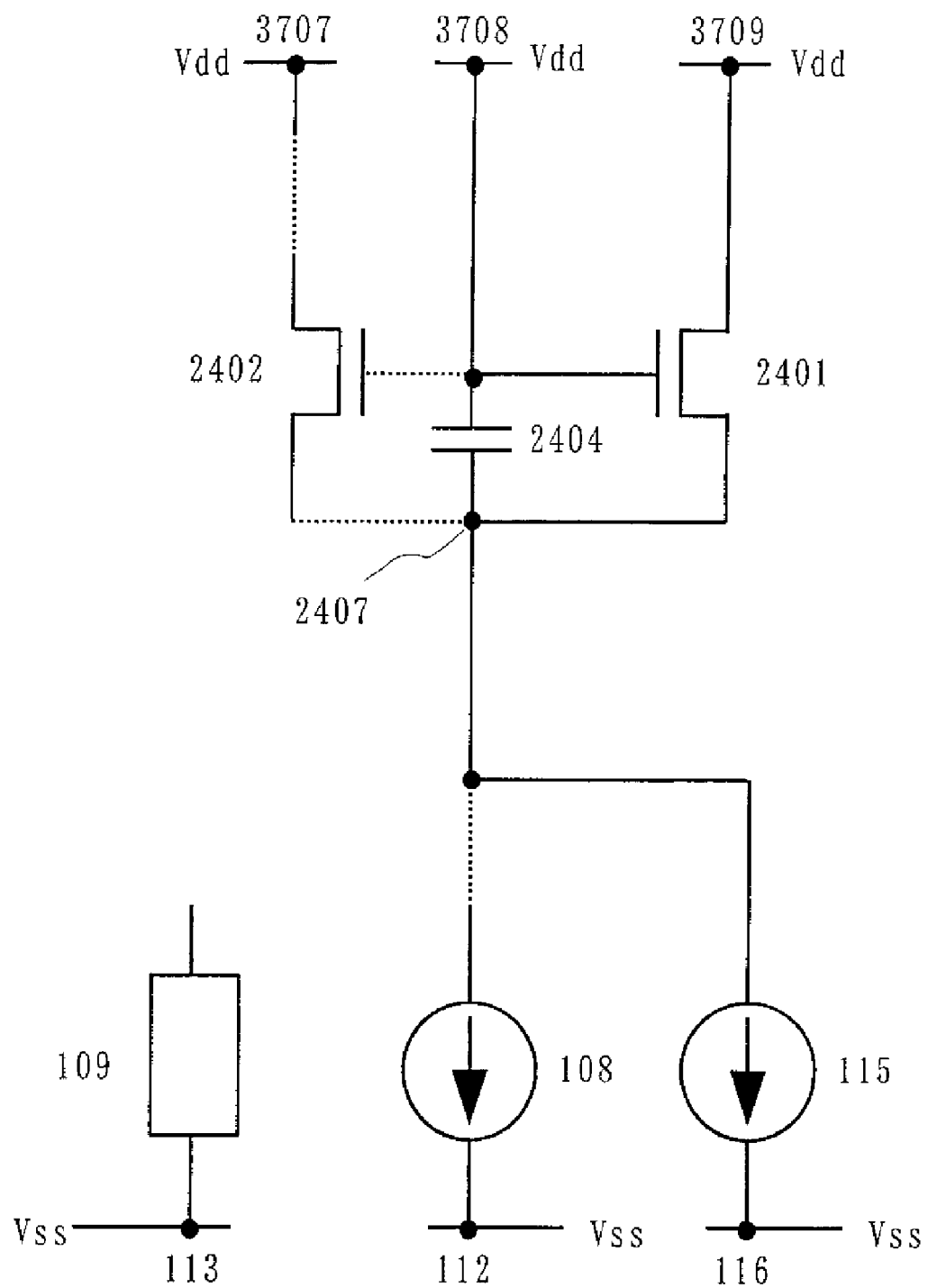
FIG. 53 is a diagram showing a connection of a certain operation of the current source circuit of the invention.
Figure 54:
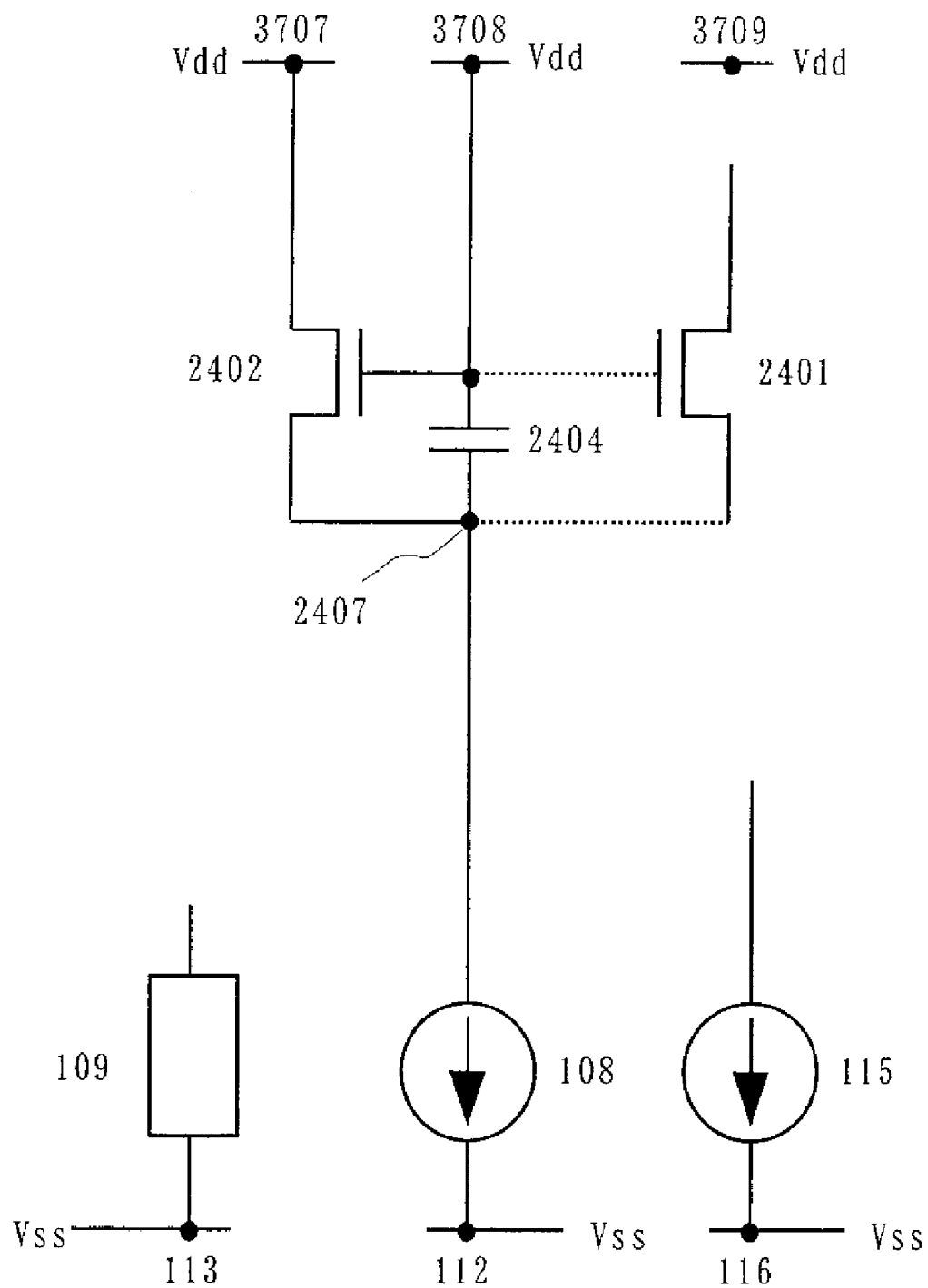
FIG. 54 is a diagram showing a connection of a certain operation of the current source circuit of the invention.
Figure 55:
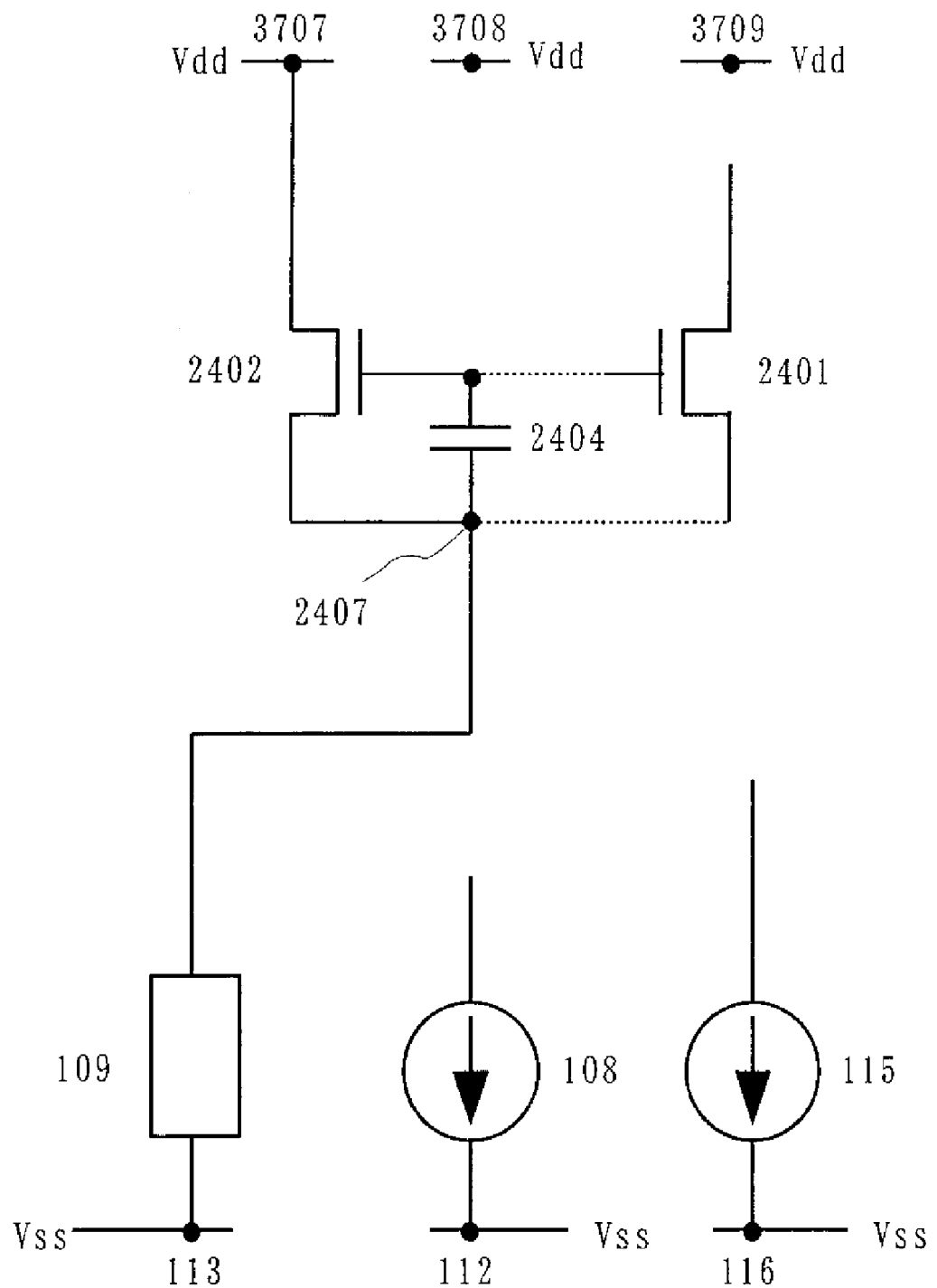
FIG. 55 is a diagram showing a connection of a certain operation of the current source circuit of the invention.

Note that in this case also switches may be disposed anywhere as long as each of them can be operated normally in the precharge operation, the set operation, and the output operation or as long as they are connected as shown in FIGS. 53 to 55.

In this manner, this embodiment mode can be configured by using various circuits as well as the circuit of FIG. 37.

In the case of FIG. 37, the precharge operation is performed as shown in FIG. 38 and then the set operation is performed as shown in FIG. 39, however, the invention is not limited to this.

Figure 60:
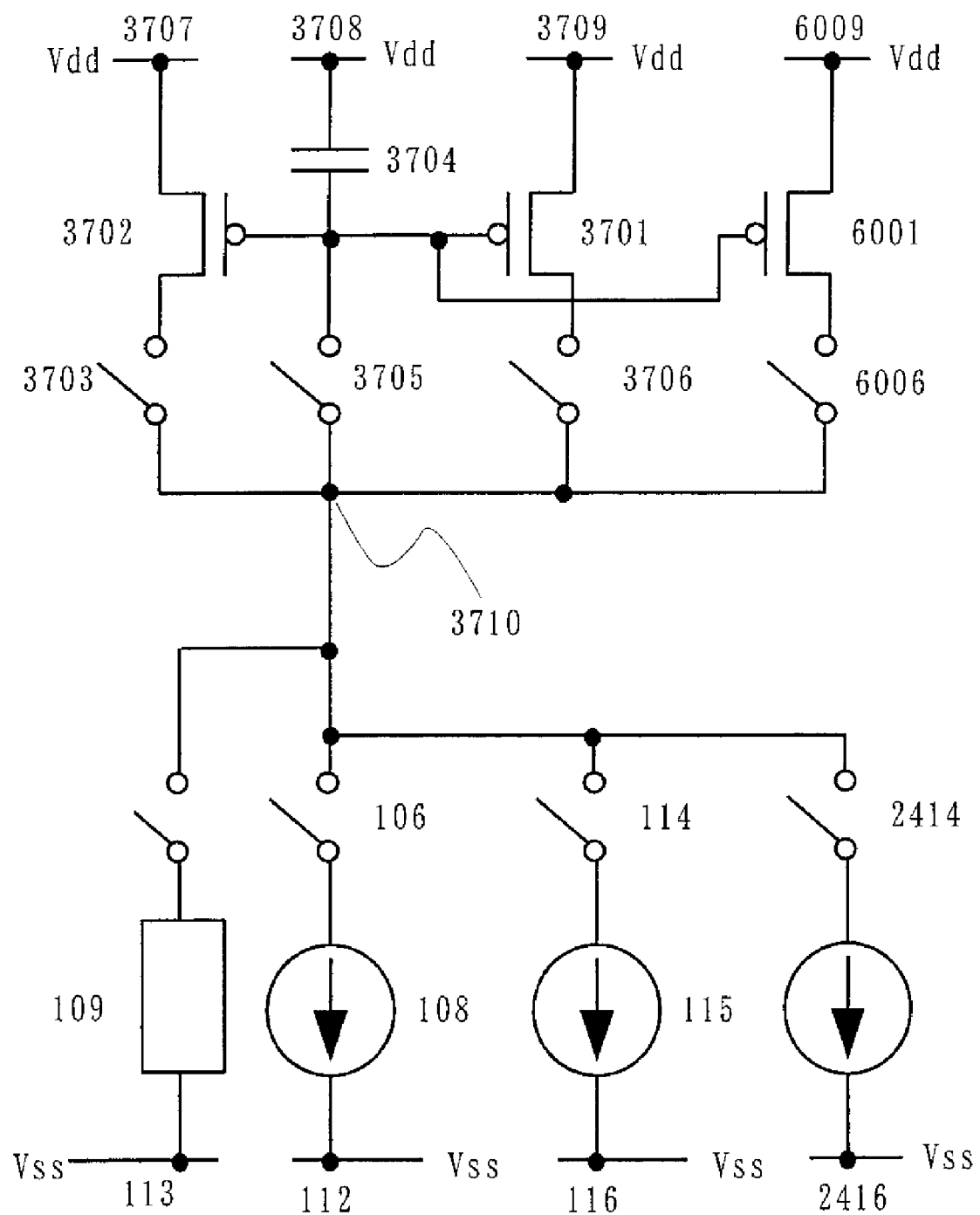
FIG. 60 is a diagram showing a configuration of the current source circuit of the invention.

For example, the precharge operation as shown in FIG. 38 may be performed a plurality of times. As an example, FIG. 60 shows the case where one more precharge operation is performed than the case of FIG. 38. In FIG. 60, a transistor 6001 which operates as a current source is provided additionally. First, while the switches 6006, 2414, and 3706 are turned ON and the switch 114 is turned OFF, a first precharge operation is performed. After that, while the switches 6006 and 2414 are turned OFF and the switch 114 is turned ON, a second precharge operation is performed. That is, it corresponds to the precharge operation of FIG. 38. Note that a current flowing in the first precharge operation is larger than that in the second precharge operation. In this manner, by performing the precharge with a large current value at first, a steady state can be obtained rapidly.

Alternatively, another precharge operation may be performed in combination.

Note that a transistor used in the precharge operation and a transistor used in the set operation preferably have the same characteristics as much as possible. For example, in the case of FIG. 37, the set transistor 3702 and the charge transistor 3701 preferably have the same current characteristics. Therefore, in the step for forming the transistor, it is preferable that the current characteristics thereof become the same as much as possible. For example, it is preferable to dispose the current source transistor 3701 and the switching transistor 3702 as close to each other as possible. In the case of crystallizing a semiconductor layer of a transistor by irradiating laser, for example, it is preferable that the same shot be irradiated to the both transistors. As a result, the current characteristics thereof can be approximately the same. Accordingly, an appropriate state can be obtained by the precharge operation. Therefore, the set operation can be performed rapidly.

The contents described in this embodiment mode corresponds to Embodiment Modes 1 and 2 of which contents are partially changed. Therefore, the contents described in Embodiment Modes 1 and 2 can be applied to this embodiment mode as well. The contents described in Embodiment Modes 1 and 2 can be implemented in combination with the contents described in this embodiment mode as well.

Figure 56:
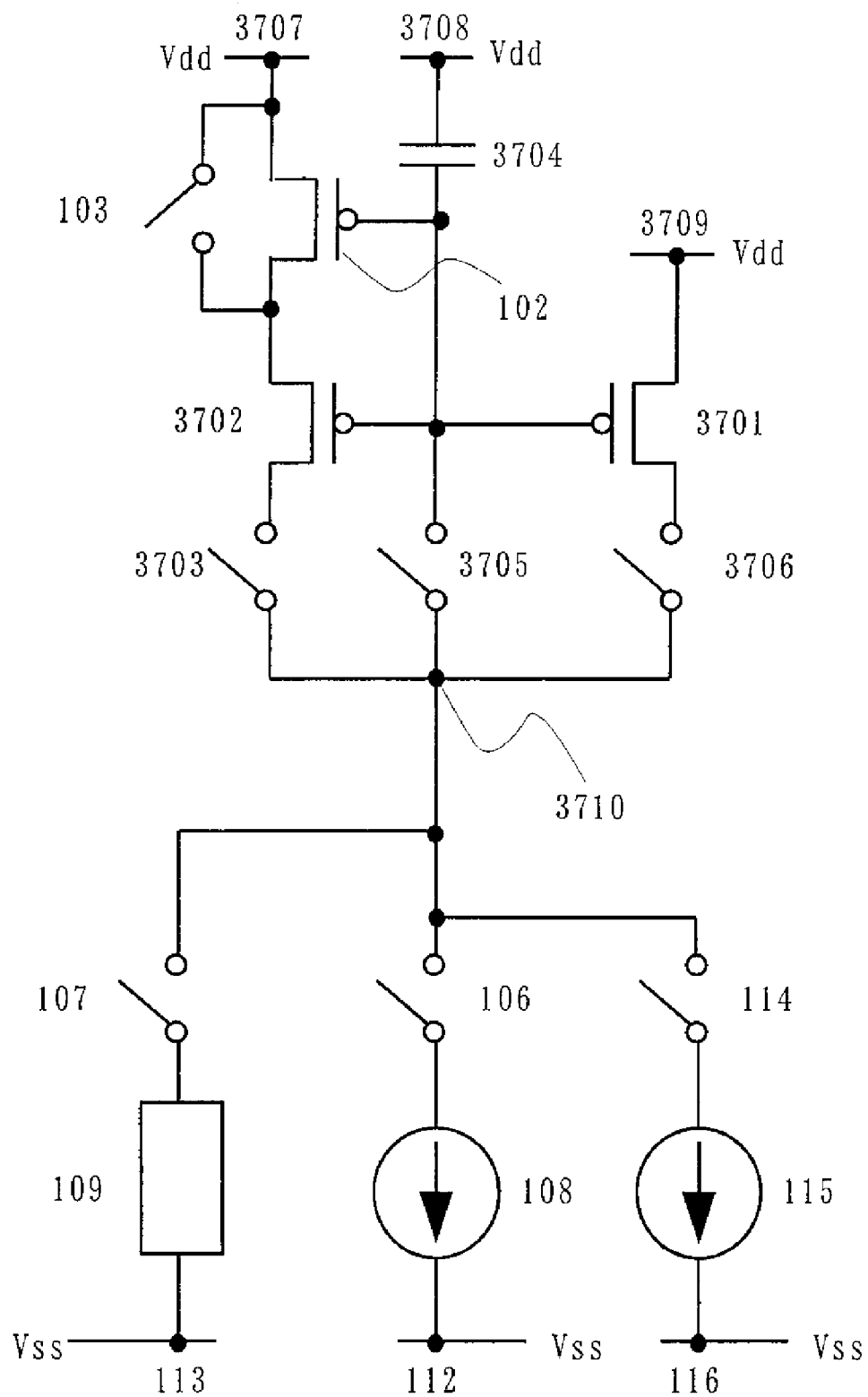
FIG. 56 is a diagram showing a configuration of the current source circuit of the invention.
Figure 57:
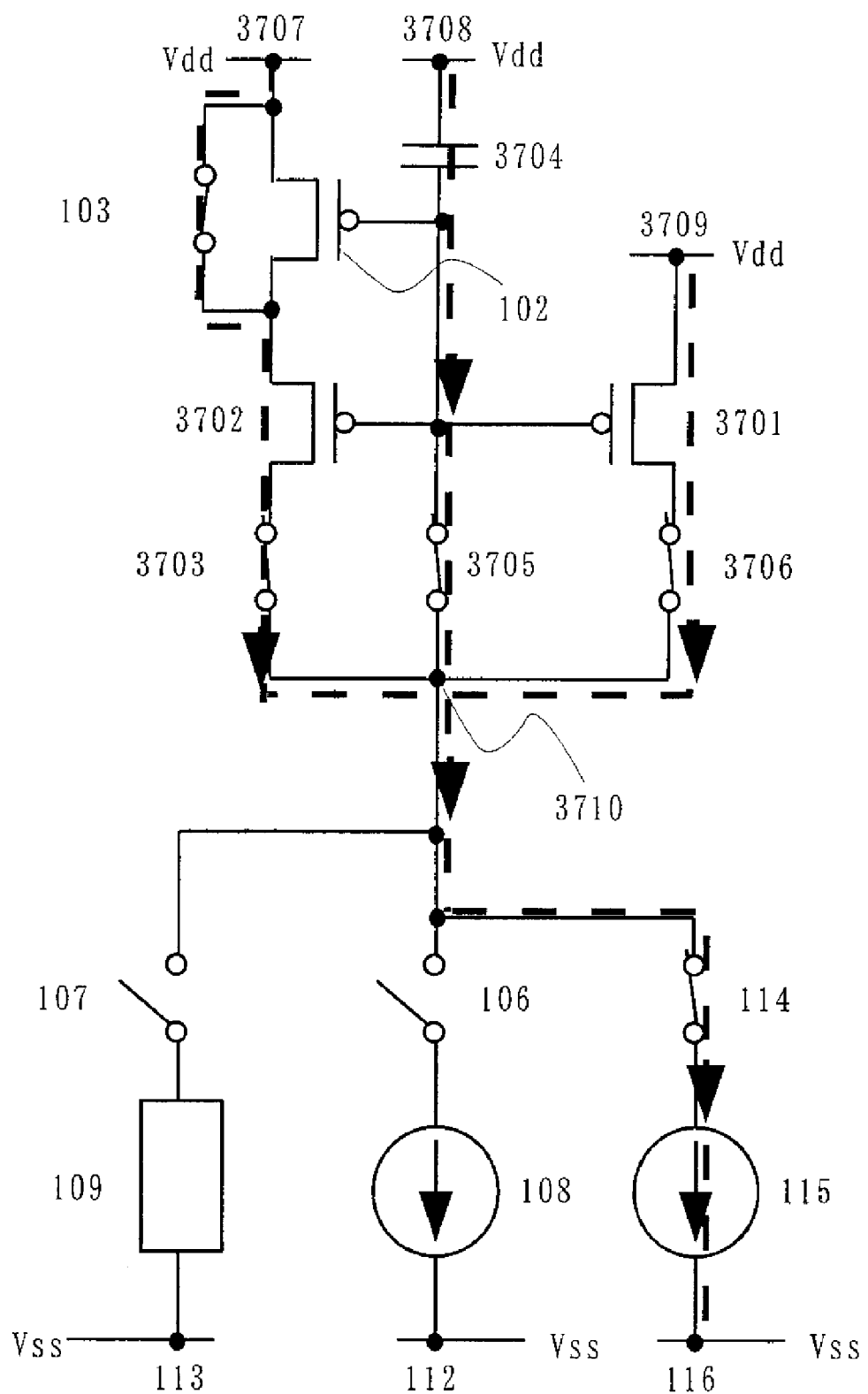
FIG. 57 is a diagram showing an operation of the current source circuit of the invention.
Figure 58:
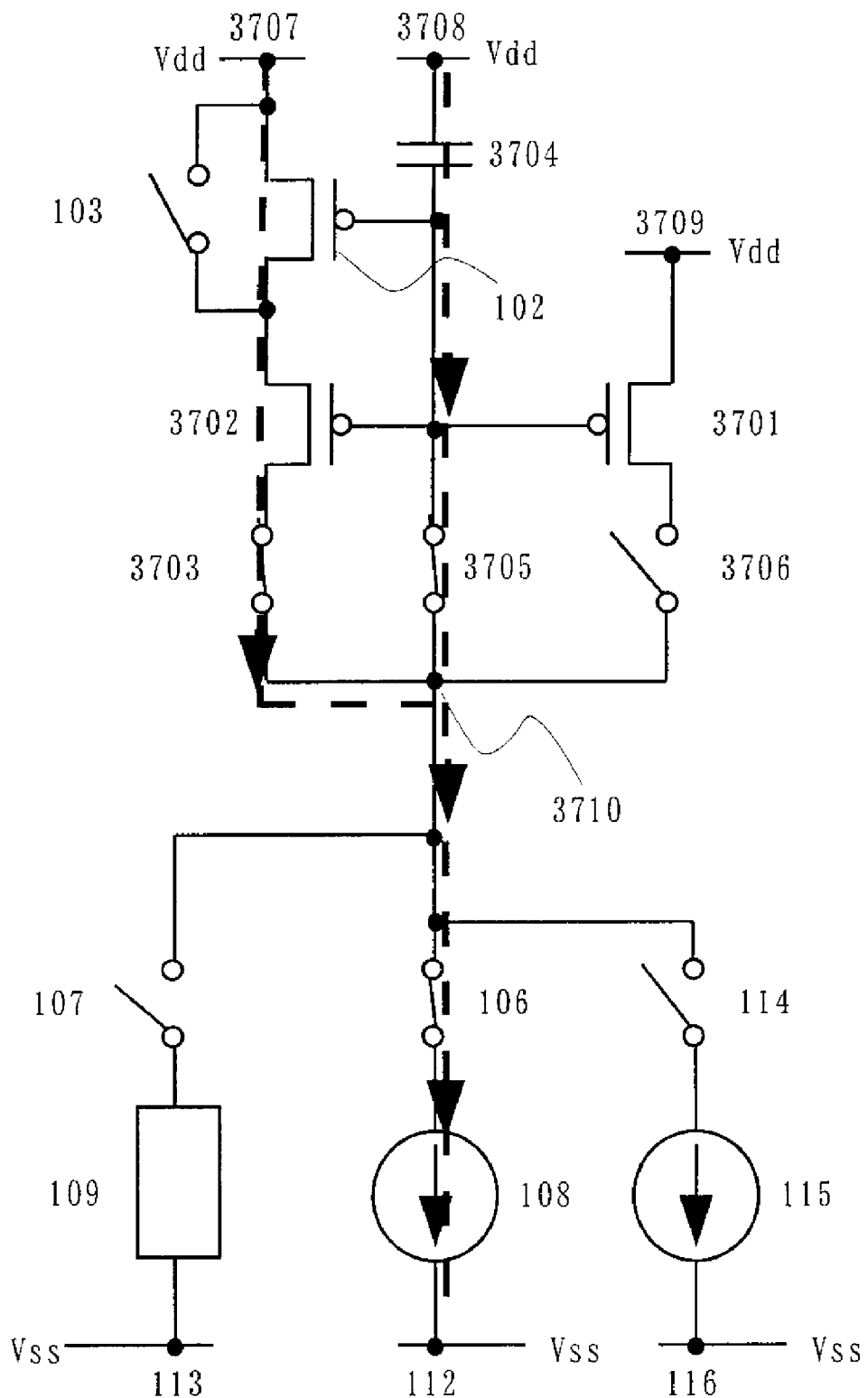
FIG. 58 is a diagram showing an operation of the current source circuit of the invention.
Figure 59:
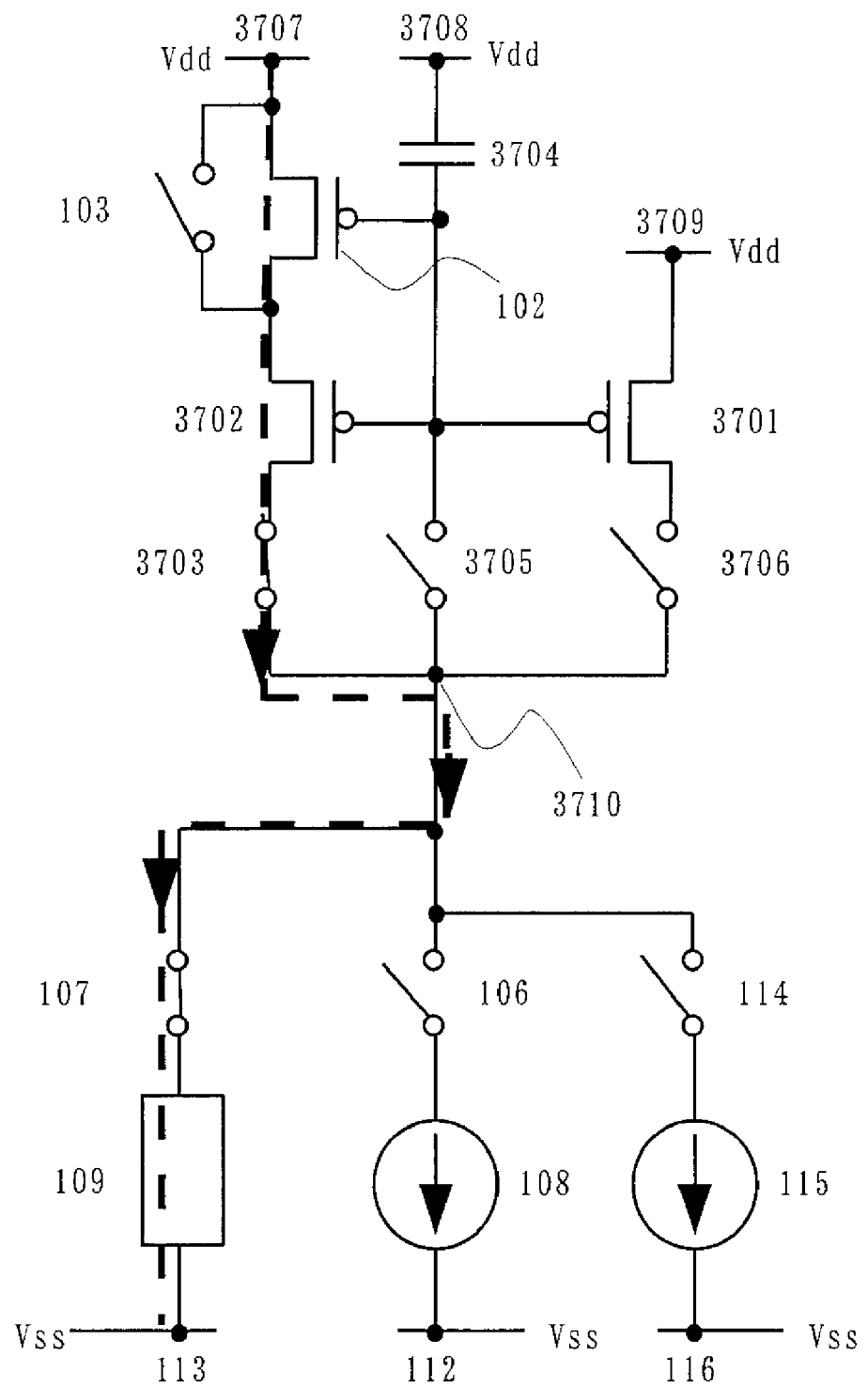
FIG. 59 is a diagram showing an operation of the current source circuit of the invention.

FIG. 56 shows a configuration of the case where the circuit of FIG. 1 and the circuit of FIG. 37 are combined. FIG. 56 has a configuration in which the switching transistor 102 and the switch 103 are provided additionally to the circuit of FIG. 37. Operations at this time are simply shown in FIGS. 57 to 59. In the precharge operation, the switching transistor 102 performs the short-circuit operation as shown in FIG. 57 and a current flows to the charge transistor 3701 as well. In the set operation, the switching transistor 102 performs the current source operation as shown in FIG. 58. In the output operation, the operation is performed as shown in FIG. 59.

It is needless to say that the contents described in Embodiment Modes 1 to 3 can be applied to the configuration of FIG. 56 as well.

Embodiment Mode 4

In this embodiment mode, the circuits described in Embodiment Modes 1 to 3 which are partially changed are described.

Here, the case of changing the circuit of FIG. 1 partially is described for simplicity. Therefore, as most contents are similar to Embodiment Mode 1, those parts will not be described anymore. However, it can be applied to the various circuits described in Embodiment Modes 1 to 3.

Figure 61:
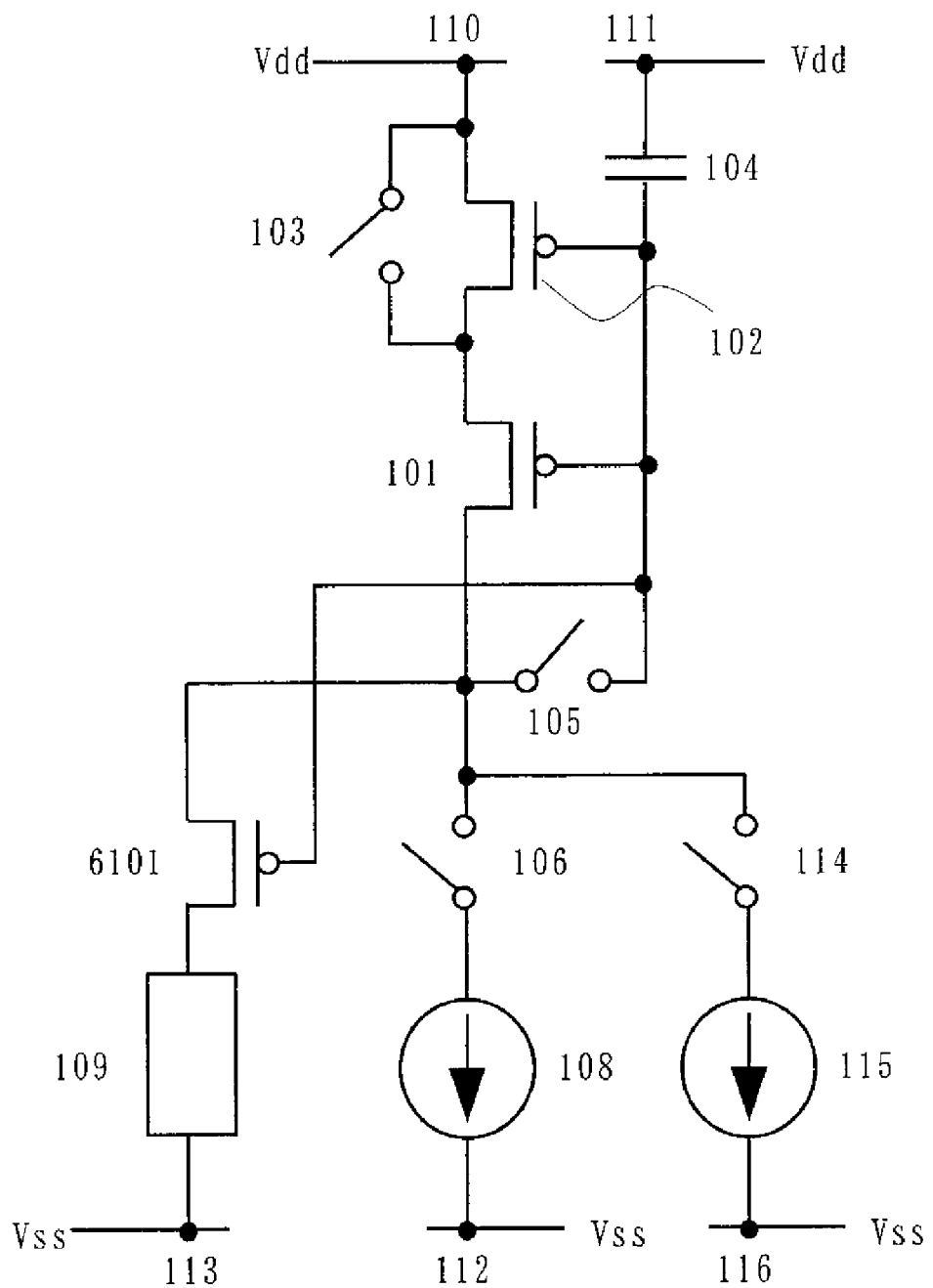
FIG. 61 is a diagram showing a configuration of the current source circuit of the invention.

First, FIG. 61 shows the configuration of FIG. 1 which is partially changed. What is different is that the switch 107 of FIG. 1 is changed into a multi transistor 6101 of FIG. 61. The multi transistor 6101 is a transistor having the same polarity (conductivity) as the current source transistor 101 and the switching transistor 102. The gate terminal of the multi transistor 6101 is connected to the gate terminal of the current source transistor 101. The multi transistor 6101 changes its operation according to the circumstance. That is, it operates as a switch in the set operation while it operates as a current source as a part of a multi-gate transistor together with the current source transistor 101 and the switching transistor 102 in the output operation. That is, in the case where the gate and the drain of the multi transistor 6101 are short-circuited by the switch 105, the multi transistor 6101 is OFF.

An operation of the circuit of FIG. 61 is similar to FIG. 1, therefore, the description is omitted here.

Note that the current source transistor 101, the switching transistor 102, and the multi transistor 6101 operate as a multi-gate transistor, therefore, these transistors preferably have the same polarity (have the same conductivity).

In the output operation, the current source transistor 101, the switching transistor 102, and the multi transistor 6101 operate as a multi-gate transistor, however, the gate width W of each transistor may be the same or different. Similarly, the gate length L of each may be the same or different as well. However, the gate width W is preferably the same since the gate width W can be considered to be the same as a typical multi-gate transistor. The gate lengths L of the switching transistor 102 and the multi transistor 6101 being longer, a current flowing to the load 109 becomes smaller. Further, even when a source-drain voltage changes in a saturation region, a current value hardly changes. That is, a kink effect can be small. Therefore, an appropriate design may be employed according to the circumstance.

Figure 62:
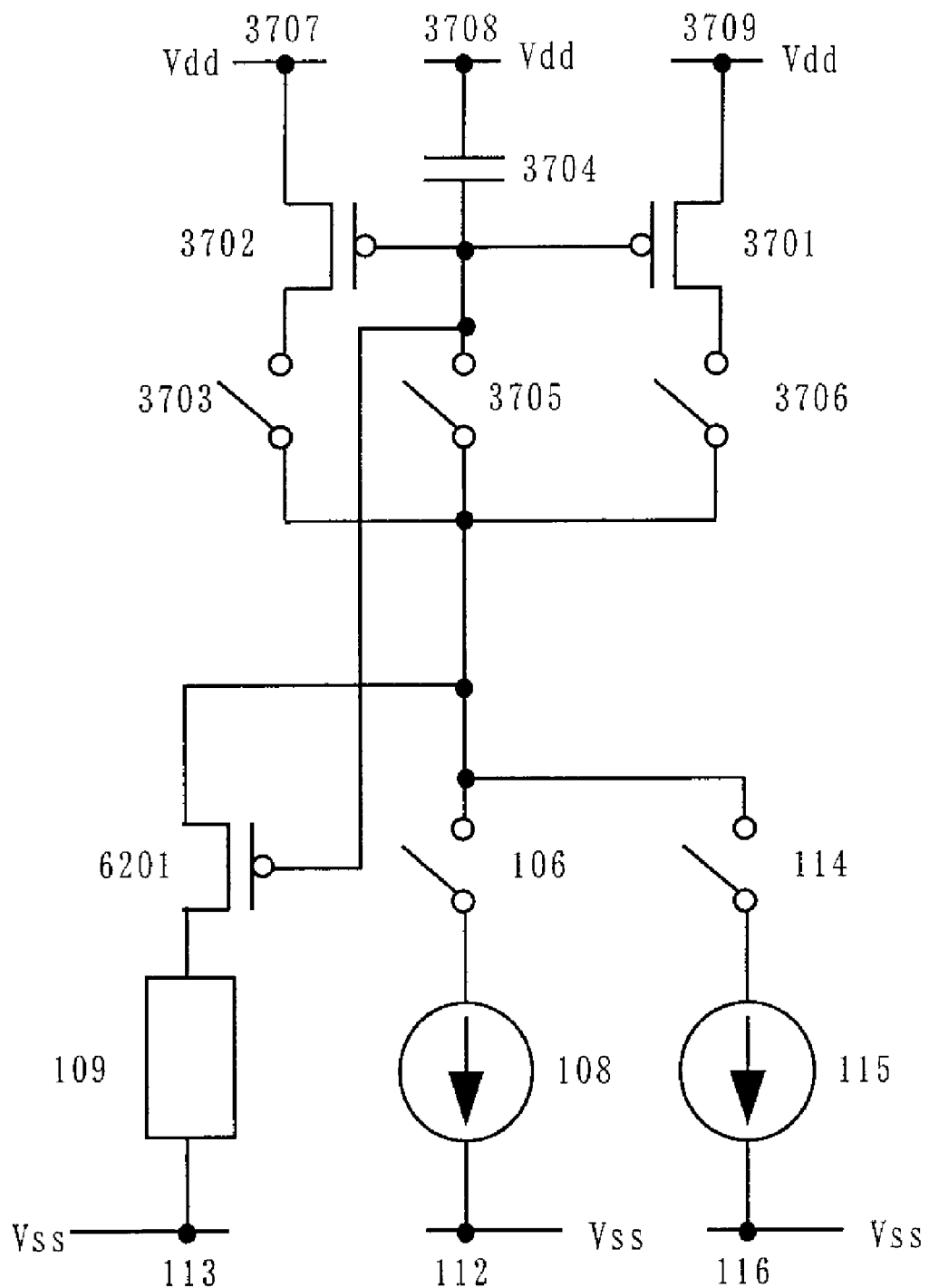
FIG. 62 is a diagram showing a configuration of the current source circuit of the invention.

Next, FIG. 62 shows the case where the circuit of FIG. 37 is partially changed. What is different here is that the switch 107 in FIG. 37 is changed into a multi transistor 6201 in FIG. 62.

An operation of the circuit of FIG. 62 is similar to that of FIG. 37, therefore, the description is omitted here.

Note that as the set transistor 3702 and the multi transistor 6201 operate as a multi-gate transistor in the output operation, these transistors preferably have the same polarity (have the same conductivity).

In this manner, the current source circuits shown in FIGS. 61 and 62 are described in this embodiment mode, however, a configuration of the invention is not limited to this and various changes can be made as far as they do not change the gist of the invention. For example, by changing an arrangement and the number of switches, polarity of each transistor, the number and arrangement of the current source transistor, the number and arrangement of the basic current source, the number and arrangement of the switching transistor, the number and arrangement of the multi transistor, the number and arrangement of the set transistor, the number and arrangement of the charge transistor, a potential of each wiring, a combination with another precharge method, a direction of current flow and the like, various circuits can be employed in the configuration. Further, by combining each change also, the invention can be configured by using various circuits.

The contents described in this embodiment mode corresponds to Embodiment Modes 1 to 3 of which contents are partially changed. Therefore, the contents described in this embodiment mode can be applied to Embodiment Modes 1 to 3 as well.

Embodiment Mode 5

In this embodiment mode, configurations and operations of a display device, a signal line driver circuit and the like are described. The circuit of the invention can be applied to a portion of the signal line driver circuit or to a pixel.

Figure 63:
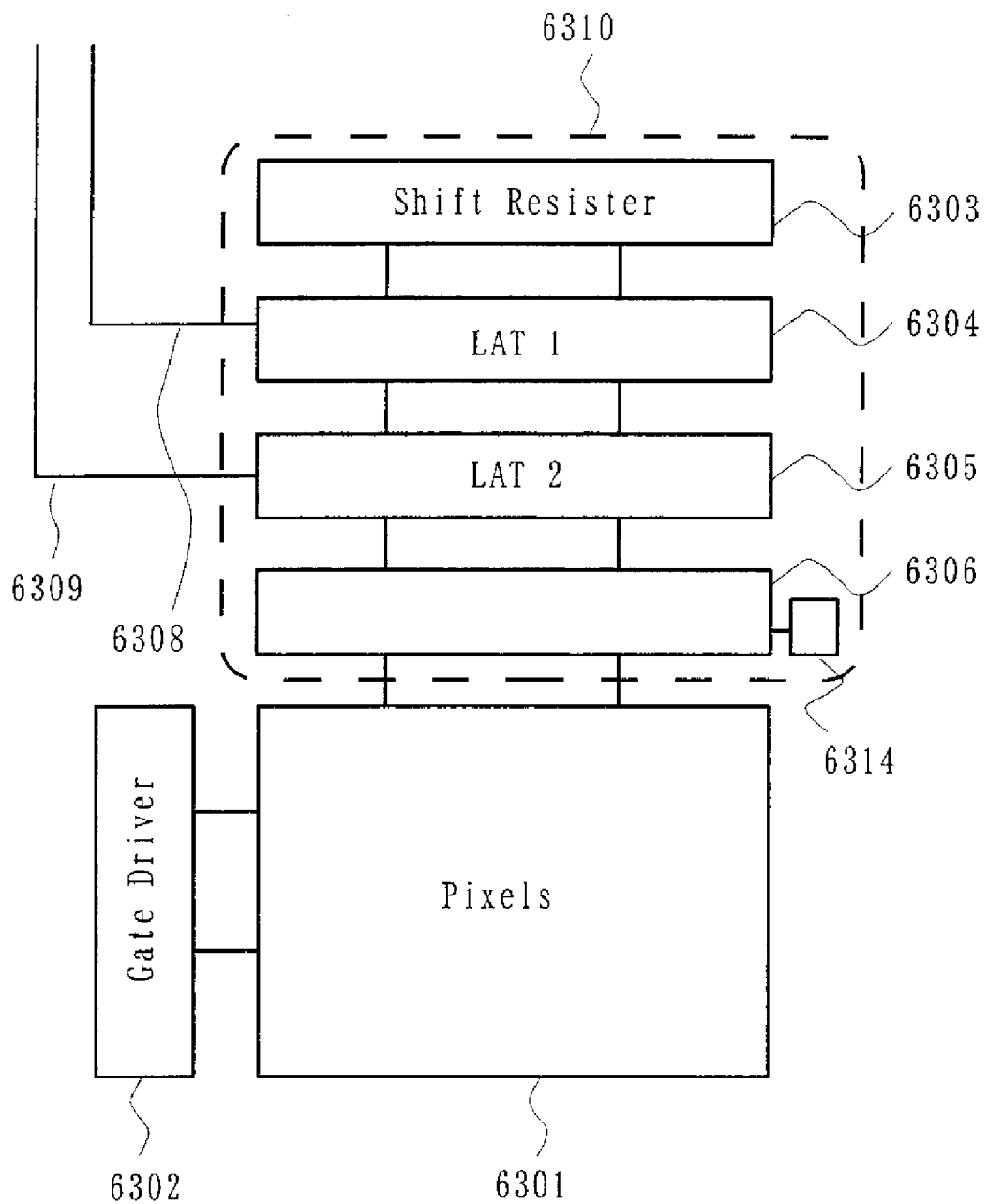
FIG. 63 is a diagram showing a structure of the display device of the invention.

As shown in FIG. 63, the display device includes a pixel arrangement (Pixels) 6301, a gate line driver circuit (Gate Driver) 6302, and a signal line driver circuit 6310. The gate line driver circuit 6302 sequentially outputs a selection signal to the pixel arrangement 6301. The pixel arrangement 6301 displays an image by controlling a state of light according to the video signal. The video signal inputted from the signal line driver circuit 6310 to the pixel arrangement 6301 is often a current. That is, a display element disposed in each pixel or an element which controls the display element change their states in accordance with the video signal (current) inputted from the signal line driver circuit 6310. The display element disposed in a pixel is, for example, an EL element, an element used in an FED (Field Emission Display) and the like.

Note that a plurality of the gate line driver circuits 6302 and the signal line driver circuits 6310 may be disposed.

A configuration of the signal line driver circuit 6310 can be divided into a plurality of portions. Briefly, it can be divided into a shift register 6303, a first latch circuit (LAT 1) 6304, a second latch circuit (LAT 2) 6305, and a digital-analog converter circuit 6306. The digital-analog converter circuit 6306 includes a function to convert a voltage into a current and may include a function to provide a gamma correction as well. That is, the digital-analog converter circuit 6306 includes a circuit for outputting a current (video signal) to a pixel, namely a current source circuit to which the invention can be applied.

Furthermore, the pixel includes a display element such as an EL element. The display element includes a circuit for outputting a current (video signal), namely a current source circuit to which the invention can be applied.

An operation of the signal line driver circuit 6310 is briefly described. The shift register 6303 is configured by using a plurality of columns of flip-flop circuits (FFs) and the like and inputted with a clock signal (S-CLK), a start pulse (SP), and a clock inversion signal (S-CLKb). Sampling pulses are sequentially outputted in accordance with these signals.

The sampling pulses outputted from the shift register 6303 are inputted to the first latch circuit (LAT 1) 6304. The first latch circuit (LAT 1) 6304 is inputted with a video signal from the video signal line 6308 and holds a video signal in each column in accordance with a timing at which the sampling pulses are inputted. In the case where the digital-analog converter circuit 6306 is disposed, a video signal has a digital value. Further, the video signal in this stage is often a voltage.

However, provided that the first latch circuit 6304 and the second latch circuit 6305 are capable of storing analog values, the digital-analog converter circuit 6306 can often be omitted. In that case, the video signal is often a current as well. Provided that data outputted to the pixel arrangement 6301 has a binary value, namely a digital value, the digital-analog converter circuit 6306 can often be omitted.

When video signals are held up to the final column in the first latch circuit (LAT 1) 6304, a latch pulse is inputted from a latch control line 6309 in a horizontal retrace period and the video signals held in the first latch circuit (LAT 1) 6304 are transferred to the second latch circuit (LAT 2) 6305 all at once. After that, the video signals held in the second latch circuit (LAT 2) 6305 are inputted to the digital-analog converter circuit 6306 one row at a time. Then, the signals outputted from the digital-analog converter circuit 6306 are inputted to the pixel arrangement 6301.

While the video signals held in the second latch circuit (LAT 2) 6305 are inputted to the digital-analog converter circuit 6306 and then to the pixels 6301, sampling pulses are outputted again in the shift register 6303. That is, two operations are simultaneously performed. Accordingly, a line sequential drive can be performed. After this, the aforementioned operation is repeated.

Note that the current source circuit in the digital-analog converter circuit 6306 performs the set operation and the output operation, a circuit for flowing a current to the current source circuit is required. In that case, a reference current source circuit 6314 is provided.

Note that the signal line driver circuit or a portion of it does not exist on the same substrate as the pixel arrangement 6301 but formed by using, for example, an external IC chip in some cases.

The IC chip may be mounted on a glass substrate by connecting by COG (Chip On Glass). Alternatively, the IC chip may be connected to the glass substrate by using TAB (Tape Auto Bonding) or a printed substrate. Note that configurations of the signal line driver circuit and the like are not limited to FIG. 63.

Figure 64:
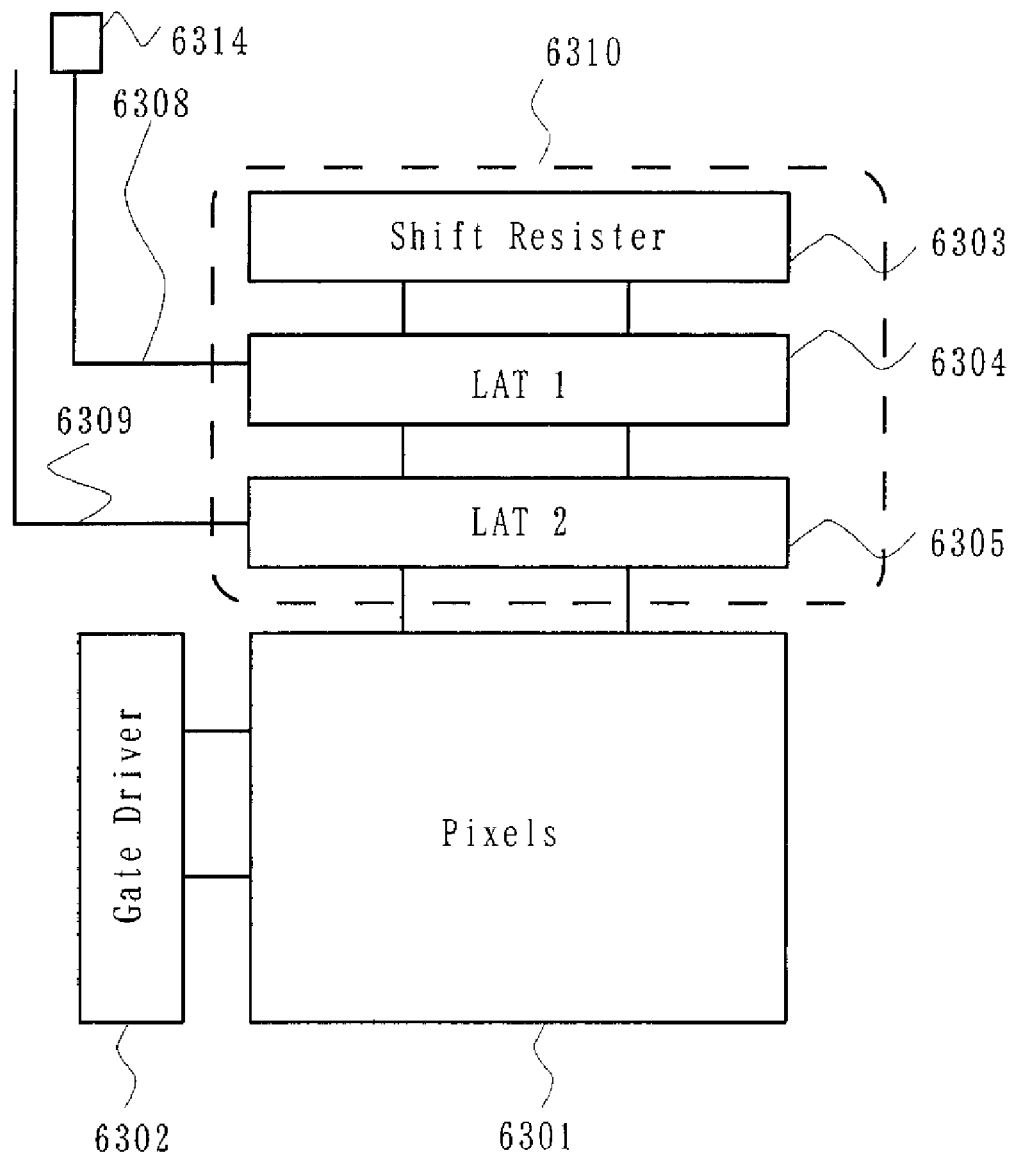
FIG. 64 is a diagram showing a structure of the display device of the invention.

For example, in the case where the first latch circuit 6304 and the second latch circuit 6305 are capable of storing analog values, a video signal (analog current) may be inputted from the reference current source circuit 6314 to the first latch circuit (LAT 1) 6304 as shown in FIG. 64. Furthermore, the second latch circuit 6305 may not be provided in FIG. 64. In that case, more current source circuits are disposed in the first latch circuit 6304 in many cases. Accordingly, the set operation, the output operation and the like can be performed simultaneously even without the second latch circuit 6305. For example, by disposing two or more current source circuits, they may be changed over to be used. That is, the set operation is performed to one current source circuit and the output operation is performed to the other current source circuit simultaneously. Then, they are changed over in an arbitrary cycle. In this manner, the set operation, the output operation and the like can be performed simultaneously. As a result, the second latch circuit 4105 can be omitted. A configuration and an operation of such a circuit are described in International Publication WO03/038796 and International Publication WO03/038797, of which contents can be applied to the invention.

Embodiment Mode 6

Next, a specific configuration of the signal line driver circuit 6310 described in Embodiment Mode 5 is described.

Figure 65:
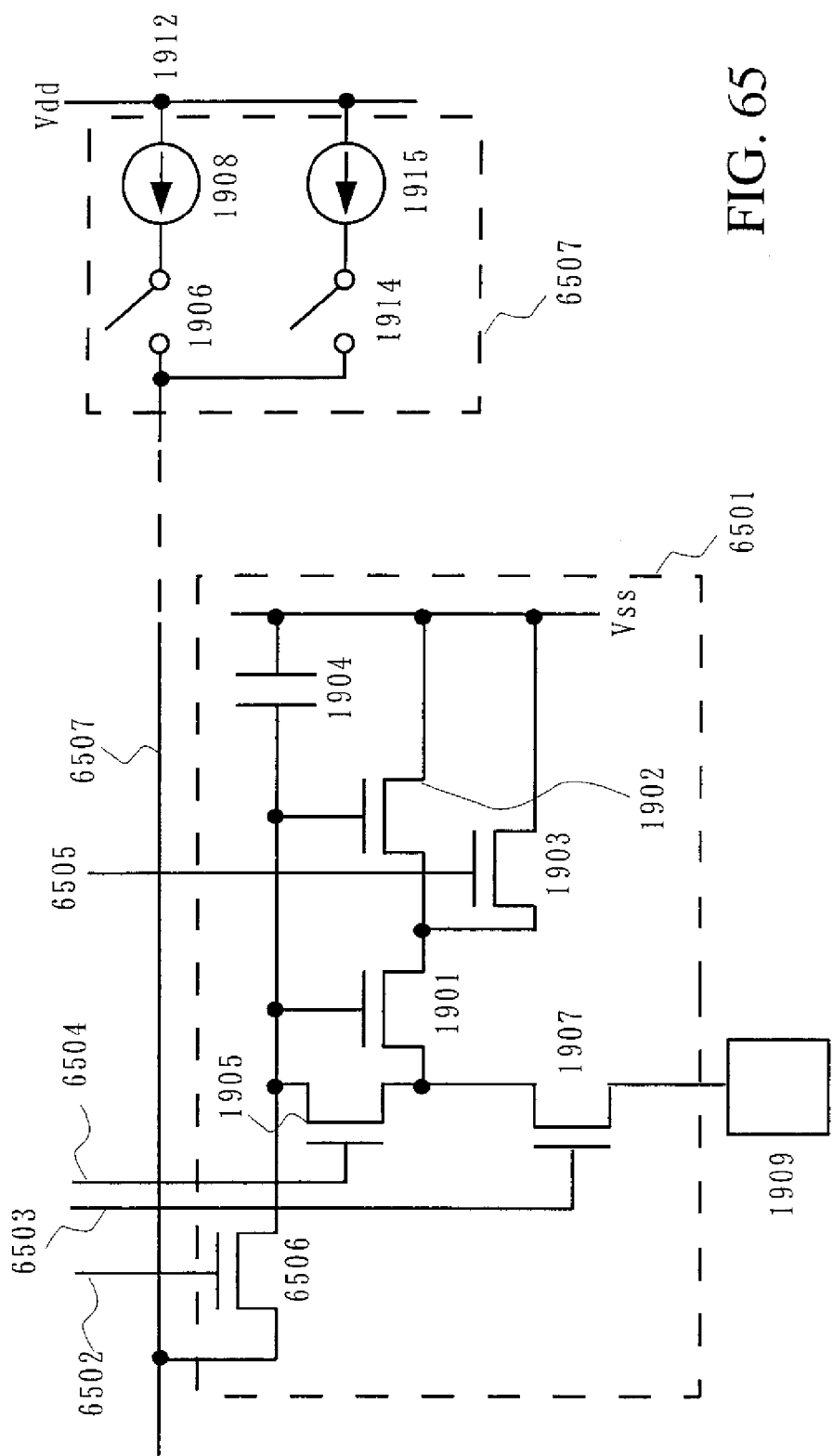
FIG. 65 is a diagram showing a portion of a configuration of the signal line driver circuit of the invention.

First, FIG. 65 shows an example of the case where the invention is applied to the signal line driver circuit. FIG. 65 shows an example of the case of connecting transistors in series as shown in FIG. 19 (or FIG. 1). A plurality of current source circuits are connected to a wiring 6507. In FIG. 65, only a current source circuit 6501 is connected thereto for simplicity. The current source circuit 6501 changes over the precharge operation, the set operation, and the output operation by wirings 6502, 6503, 6504, and 6505. A current is inputted from a basic current source circuit 6507 which includes a basic current source 1908, a second basic current source 1915 and the like in the precharge operation and the set operation. In the output operation, a current is outputted from the current source circuit 6501 to a load 1909.

Note that a current source of the reference current source circuit 6314 corresponds to the basic current source circuit 6507 in FIG. 65. Then, the load 1909 in FIG. 65 corresponds to a switch, a signal line, a pixel connected to a signal line and another current source circuit.

Figure 66:
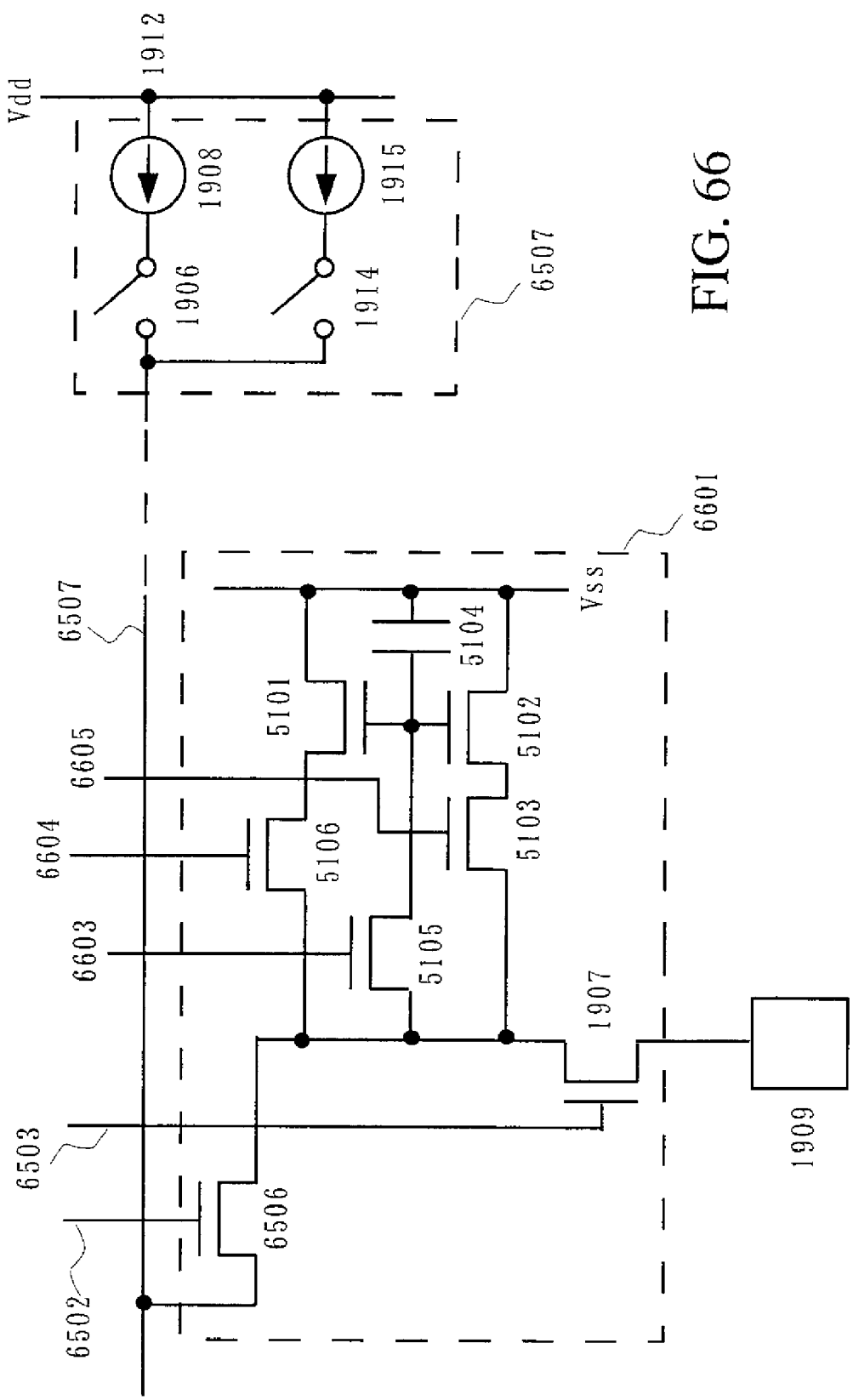
FIG. 66 is a diagram showing a portion of a configuration of the signal line driver circuit of the invention.

Further, as an example of the case of applying the invention to the signal line driver circuit, FIG. 66 shows an example of the case of connecting transistors in parallel as shown in FIG. 51 (or FIG. 37). A current source circuit 6601 chances over the precharge operation, the set operation, and the output operation by wirings 6502, 6503, 6603, 6604, and 6605.

Note that only one current source circuit is shown in FIGS. 65 and 66, however, the output operation can be performed while the set operation and the like are performed by disposing a plurality of current source circuits in parallel and changing them over to be operated.

In the case of performing the set operation to the current source circuit, a timing thereof is required to be controlled. In that case, a dedicated driver circuit (shift register and the like) may be disposed for controlling the set operation. Alternatively, the set operation to the current source circuit may be controlled by using a signal outputted from the shift register for controlling the LAT 1 circuit. That is, the LAT 1 circuit and the current source circuit may be controlled by one shift register. In that case, the signal outputted from the shift register for controlling the LAT 1 circuit may be directly inputted to the current source circuit or the current source circuit may be controlled via a circuit for controlling a separation of a control of the LAT 1 circuit and a control of the current source circuit. Alternatively, a signal outputted from the LAT 2 circuit may be used to control the set operation to the current source circuit. A signal outputted from the LAT 2 circuit is normally a video signal, therefore, the current source circuit may be controlled via a circuit for controlling a separation of the case of using as a video signal and the case of controlling the current source circuit. A circuit configuration, an operation of the circuit and the like for controlling the set operation and the output operation in this manner are described in International Publication WO03/038793, International Publication WO03/038794, and International Publication WO03/038795, of which contents can be applied to the invention.

Figure 67:
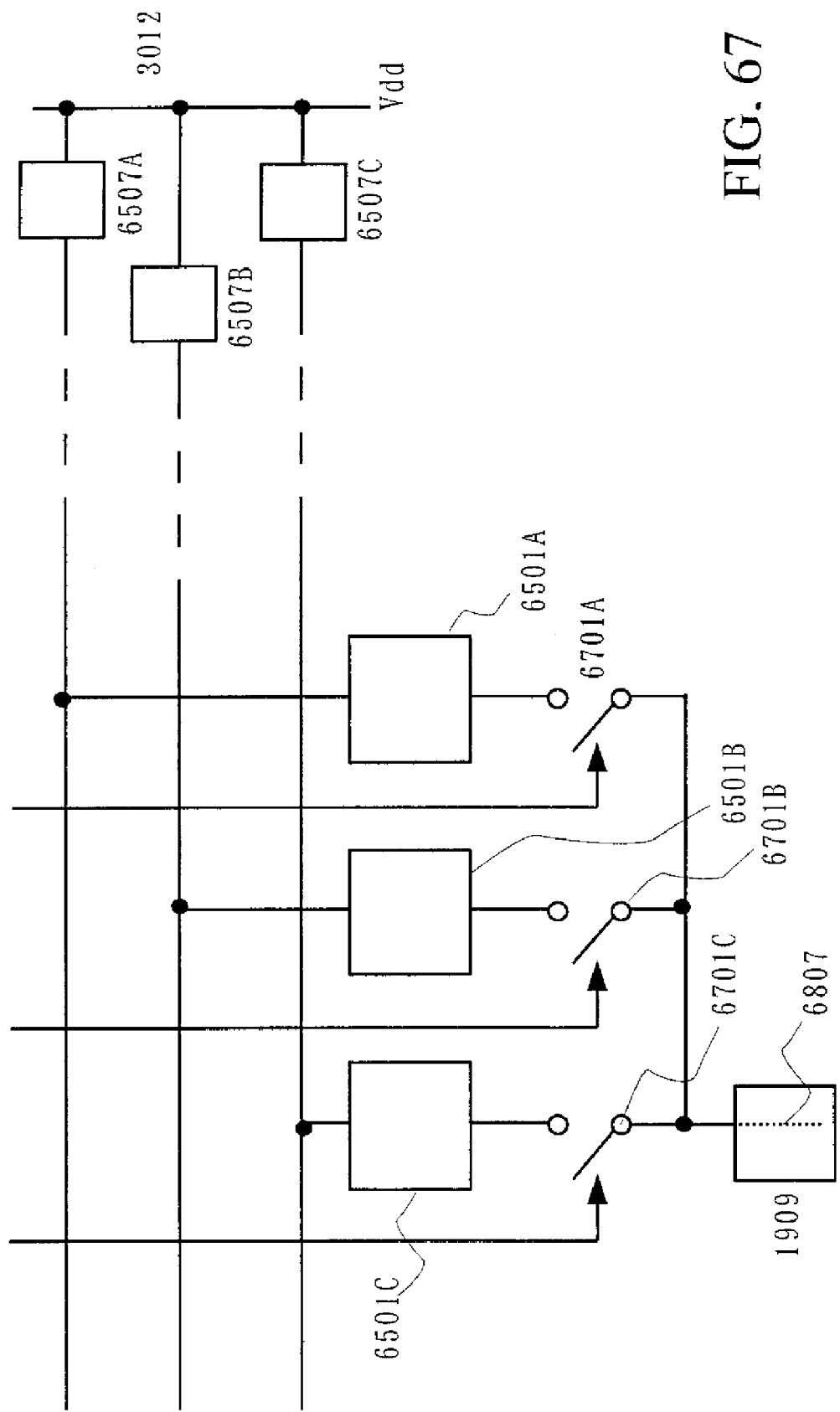
FIG. 67 is a diagram showing a portion of a configuration of the signal line driver circuit of the invention.

In the case of outputting an analog current to the load 1909 (for example, a switch, a signal line, a pixel connected to a signal line and the like), a digital-analog conversion is required to be performed. Therefore, a configuration shown in FIG. 67 in which a plurality of current source circuits are disposed is employed. Note that FIG. 67 shows the case of 3-bit for simplicity. That is, there are basic current source circuits 6507A, 6507B, and 6507C of which size of current in the set operation are Ic, 2×Ic, and 4×Ic respectively. Current source circuits 6501A, 6501B, and 6501C are connected respectively. Note that each of the current source circuits 6501A, 6501B, and 6501C may be the current source circuit 6501 shown in FIG. 65 or the current source circuit 6601 shown in FIG. 66. Therefore, the current source circuits 6501A, 6501B, and 6501C output currents having the size of Ic, 2×Ic, and 4×Ic respectively in the output operation. These switches are controlled by video signals outputted from the second latch circuit (LAT 2) 6305. A sum of the currents outputted from each current source circuit and switch is outputted to the load 1909, namely a signal line and the like. By operating as described above, an analog current is outputted to a pixel and the like as a video signal.

Note that FIG. 67 shows the case of 3-bit for simplicity, however, the invention is not limited to this. By configuring similarly, the number of bits can easily be changed. By disposing the current sources in parallel similarly to the case of FIG. 66, the set operation and the like and the output operation can be performed simultaneously.

Next, the case of FIG. 64 is described. A current source of the reference current source circuit 6314 corresponds to the basic current source circuit 6507 in FIGS. 65 and 66. A current source circuit disposed in the first latch circuit (LAT 1) 6304 corresponds to the current source circuits 6501 and 6601 in FIGS. 65 and 66. Then, the load in FIGS. 65 and 66 corresponds to a current source circuit disposed in the second latch circuit (LAT 2) 6305. In this case, a video signal as a current is outputted from a current source in the reference current source circuit 6314. Note that the current is either a digital value or an analog value.

In the case where the second latch circuit (LAT 2) 6305 is not disposed, the load 1909 in FIGS. 65 and 66 corresponds to a pixel and a signal line.

Further, it can be considered that a current source circuit disposed in the first latch circuit 6304 corresponds to the basic current source circuit 6507 in FIGS. 65 and 66, a current source circuit disposed in the second latch circuit 6305 corresponds to the current source circuits 6501 and 6601 in FIGS. 65 and 66, and a pixel and a signal line correspond to the load 1909 in FIGS. 65 and 66.

Furthermore, the reference current source circuit 6314 shown in FIGS. 63 and 64 can be applied as well. That is, it can be considered that the reference current source circuit 6314 corresponds to the current source circuits 6501 and 6601 in FIGS. 65 and 66, a current source circuit disposed in the first latch circuit 6304 corresponds to the load 1909 in FIGS. 65 and 66, and another current source (a circuit for supplying a current to the reference current source circuit 6314) corresponds to the basic current source circuit 6507 in FIGS. 65 and 66.

It can also be considered that a light emitting element disposed in a pixel corresponds to the load 1909 in FIGS. 65 and 66, a current source circuit disposed in a pixel corresponds to the current source circuits 6501 and 6601 in FIGS. 65 and 66, and a current source circuit for outputting a current to a pixel in the signal line driver circuit 6310 corresponds to the basic current source circuit 6507 in FIGS. 65 and 66. Note that a current is supplied from the current source circuit disposed in a pixel to the light emitting element, thereby the light emitting element emits light.

In this manner, the invention can be applied to various portions.

Note that a digital video signal (current value) corresponding to each bit may be inputted to the first latch circuit 6304. By adding a digital video signal current corresponding to each bit after that, the digital value can be converted into an analog value. In that case, the invention can be more preferably applied to the case of inputting a signal having a small digit number. This is because a current value of a signal becomes small in the case of a signal having a small digit number. The current value of the signal can be large by applying the invention. Therefore, a write speed of a signal can be improved.

Note that a configuration of FIG. 19 (FIG. 1) is used as a configuration of the current source circuit 6501 in FIG. 65, however, the invention is not limited to this. Similarly, a configuration of FIG. 51 (FIG. 37) is used as a configuration of the current source circuit 6601 in FIG. 66, however, the invention is not limited to this. Various configurations according to the invention can be used.

In this manner, by applying the invention to the signal line driver circuit, the set operation can be performed rapidly even with a small current value to be inputted to the signal line driver circuit. Provided that the set operation cannot be performed sufficiently, an accurate current cannot be outputted to a signal line. In that case, the pixel cannot perform an accurate display. Therefore, by applying the invention, an image defect can be prevented.

Note that the contents described in this embodiment mode correspond to the one utilizing the contents described in Embodiment Modes 1 to 5. Therefore, the contents described in Embodiment Modes 1 to 5 can be applied to this embodiment mode as well.

Embodiment Mode 7

In Embodiment Mode 6, a specific configuration of the signal line driver circuit 6310 is described. In this embodiment mode, a specific configuration of the case of applying the invention to pixels arranged in array in the pixel arrangement 6301 is described.

Figure 68:
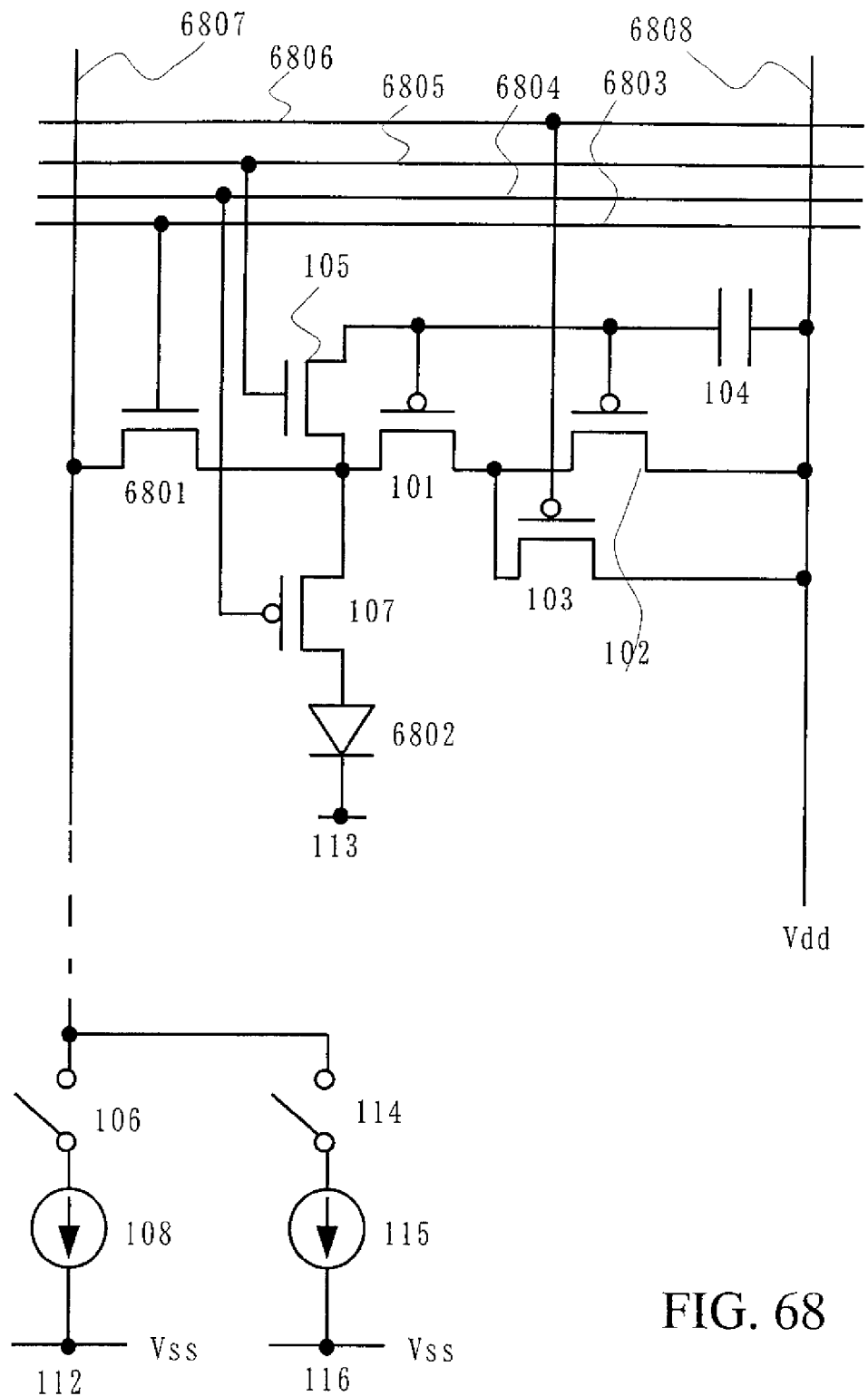
FIG. 68 is a diagram showing a pixel configuration of the invention.

First, FIG. 68 shows the case of applying the configuration shown in FIG. 1 to a pixel. The load 109 shown in FIG. 1 corresponds to an EL element 6802 in FIG. 68. The basic current source 108 and the second basic current source 115 in FIG. 68 correspond to current source circuits disposed in the digital-analog converter circuit 6306 in FIG. 63 and to current source circuits disposed in the second latch circuit 6305 in FIG. 64. In the case where the second latch circuit 6305 is not provided in FIG. 64, they correspond to the current source circuits disposed in the first latch circuit 6304. Note that a plurality of pixels are connected to the wiring 6807 actually. FIG. 68 shows the case where only one pixel is connected for simplicity.

Each switch (transistor in FIG. 68) is controlled to be ON/OFF by using gate lines 6803 to 6806. By turning ON/OFF a selection transistor 6801 by controlling the gate line 6803, a signal is inputted from the signal line 6807. Note that a detailed operation is similar to FIG. 1, therefore, the description is omitted here.

Figure 69:
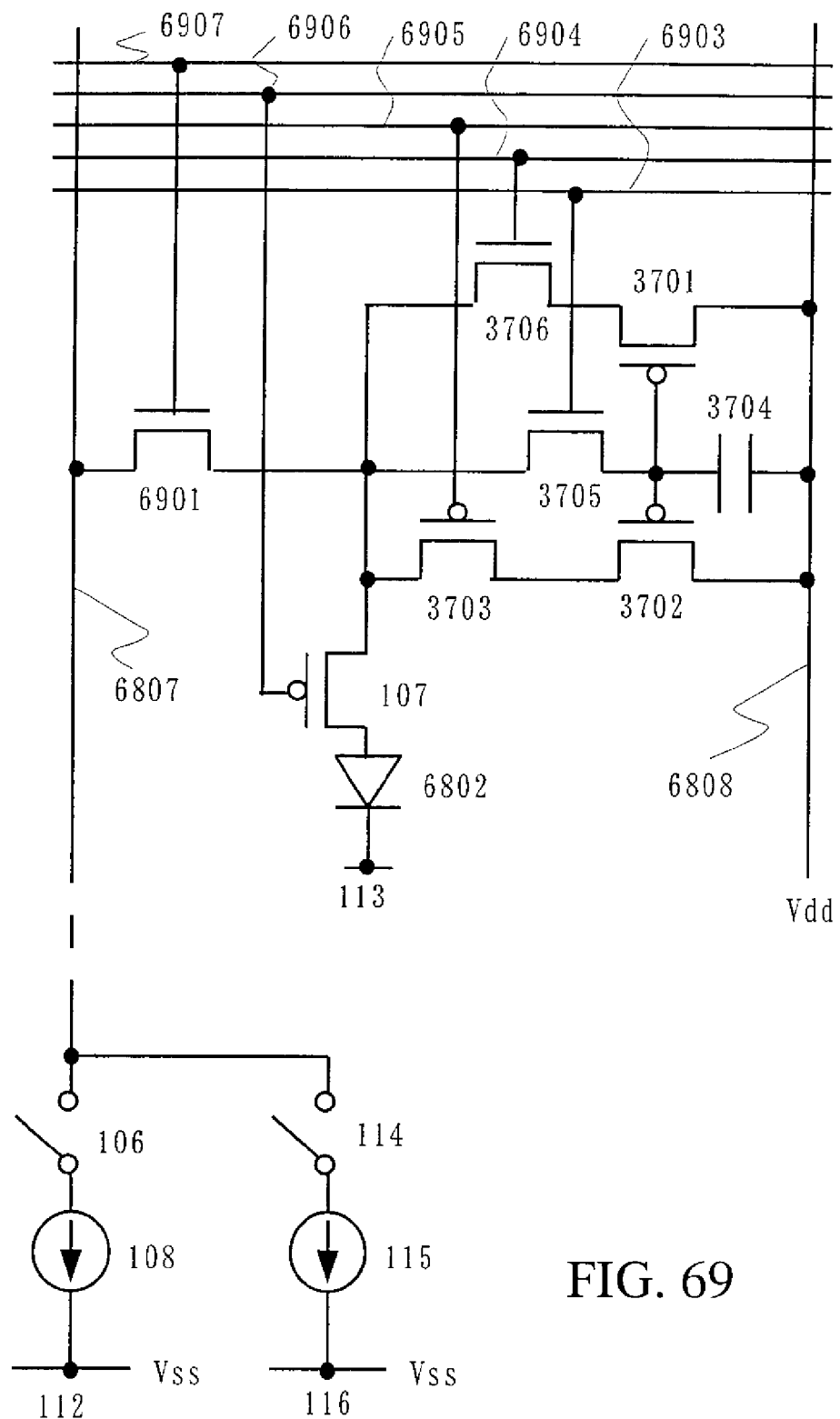
FIG. 69 is a diagram showing a pixel configuration of the invention.

FIG. 69 shows the case of applying the configuration shown in FIG. 37 to a pixel. Each switch (transistor in FIG. 69) is controlled to be ON/OFF by using gate lines 6903 to 6907. A selection transistor 6901 is turned ON/OFF by controlling the gate line 6903 and a signal is inputted from the signal line 6807. Note that a detailed operation is similar to FIG. 37, therefore, the description is omitted here.

Figure 45:
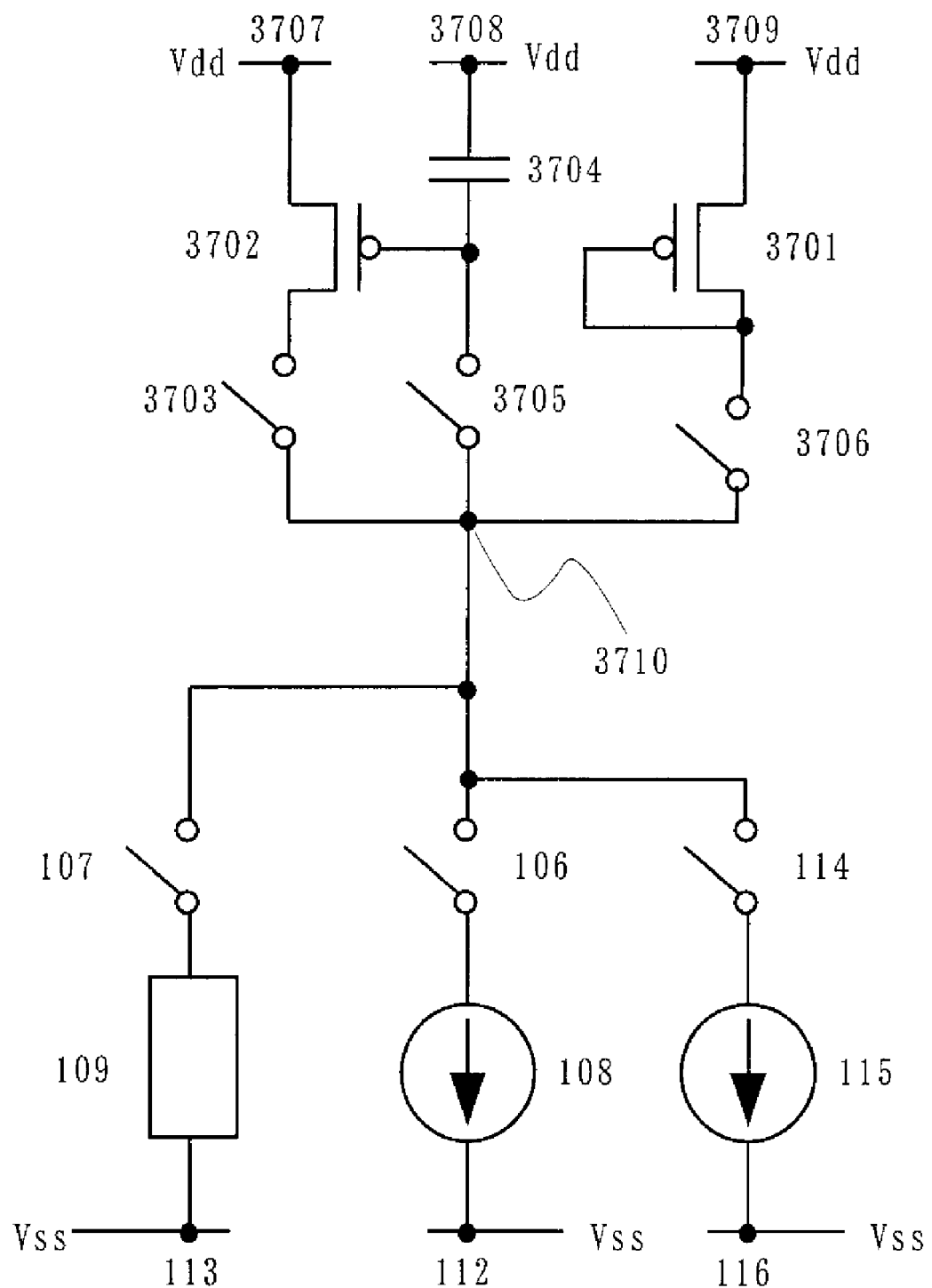
FIG. 45 is a diagram showing a configuration of the current source circuit of the invention.
Figure 77:
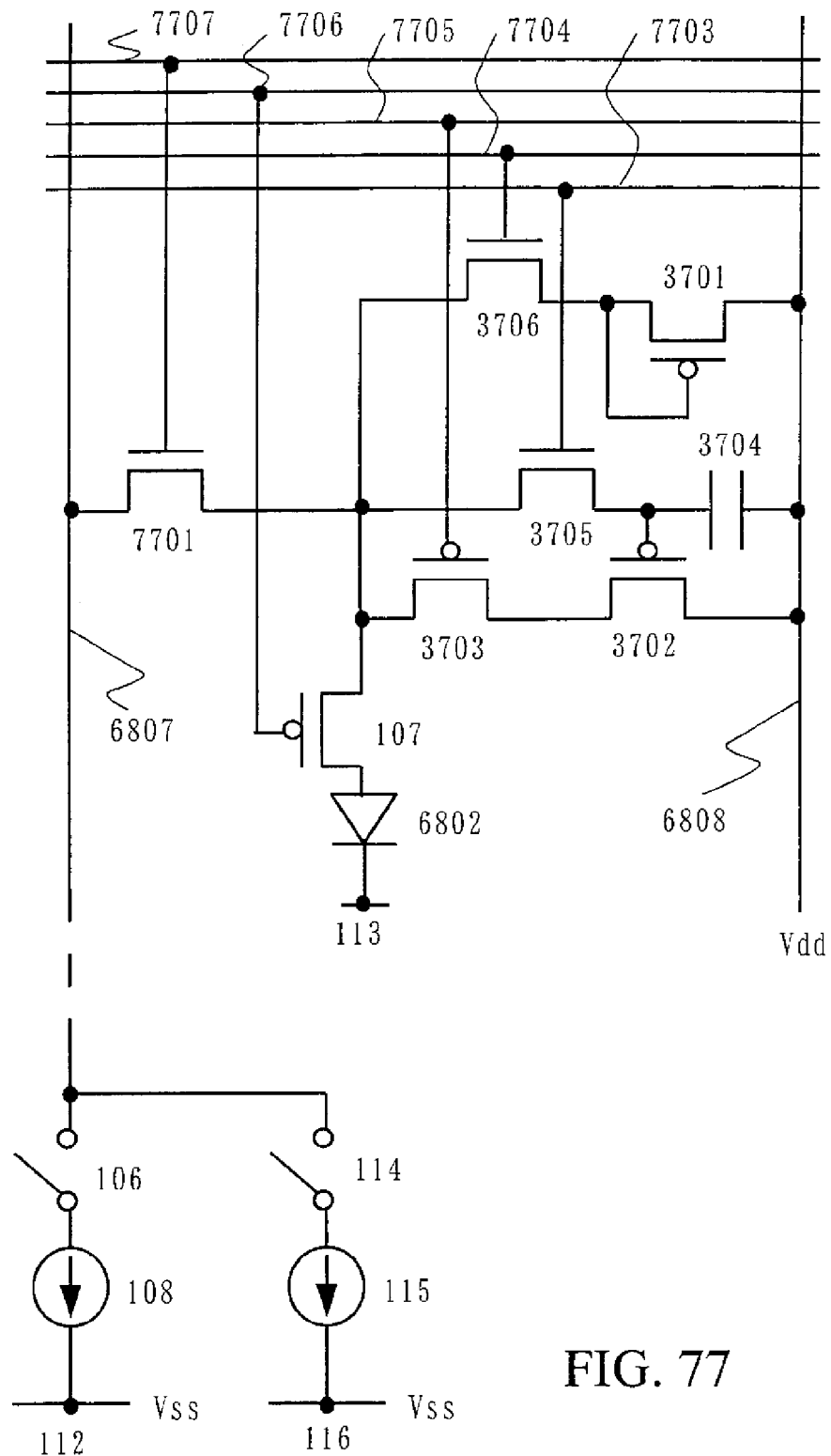
FIG. 77 is a diagram showing a pixel configuration of the invention.

FIG. 77 shows the case of applying the configuration shown in FIG. 45 to a pixel. Each switch (transistor in FIG. 77) is controlled to be ON/OFF by using gate lines 7703 to 7707. A selection transistor 7701 is turned ON/OFF by controlling the gate line 7007 and a signal is inputted from the signal line 6807. Note that a detailed operation is similar to FIG. 45, therefore, the description is omitted here.

Figure 78:
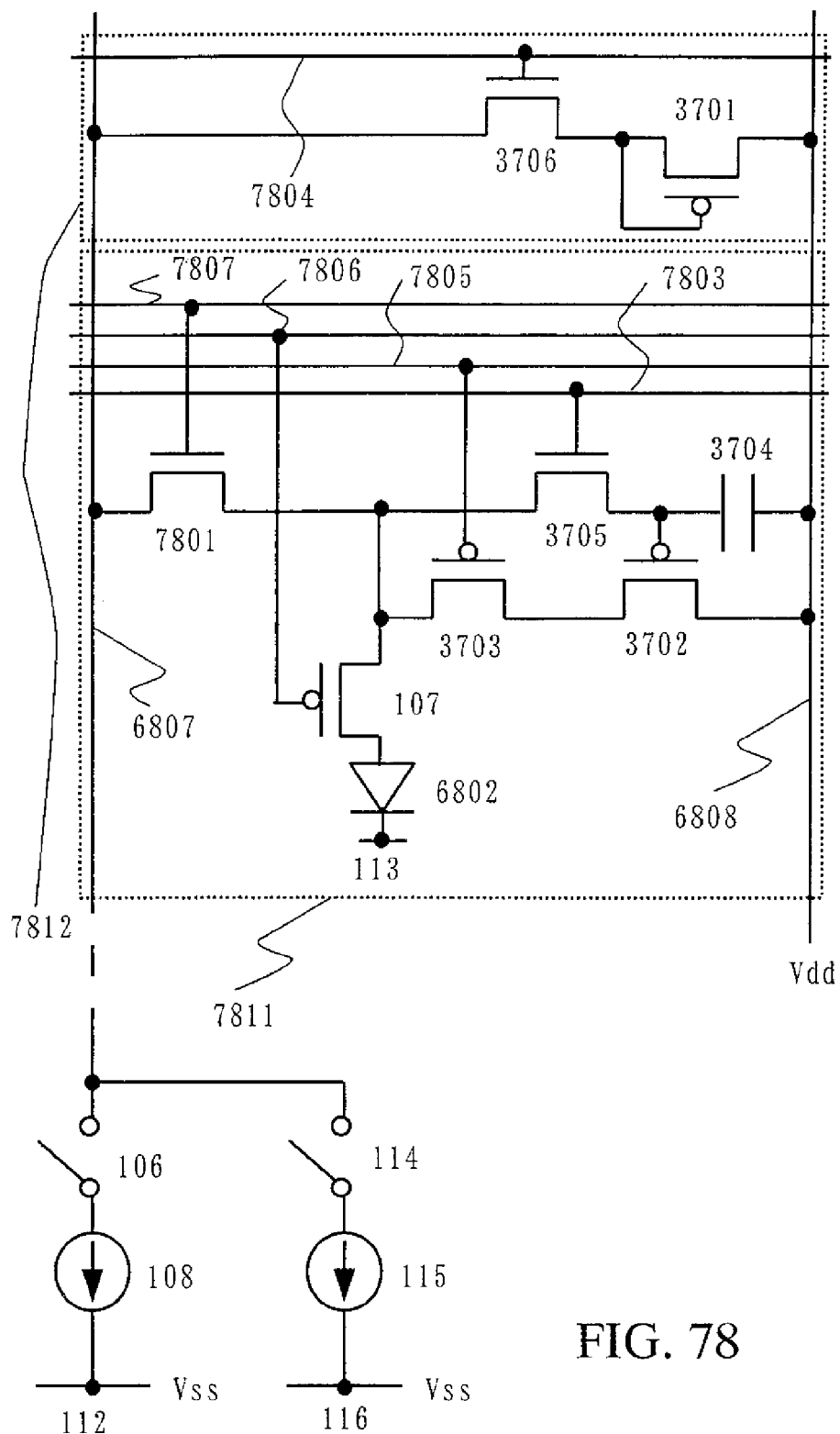
FIG. 78 is a diagram showing a pixel configuration of the invention.

FIG. 78 shows the case where a connection of wirings of the configuration of FIG. 77 is changed. In FIG. 77, the transistor 3701 is connected to the signal line 6807 via the transistor 3706 and the selection transistor 7701. In FIG. 78, on the other hand, the transistor 3701 is connected to the signal line 6807 via the transistor 3706.

Figure 79:
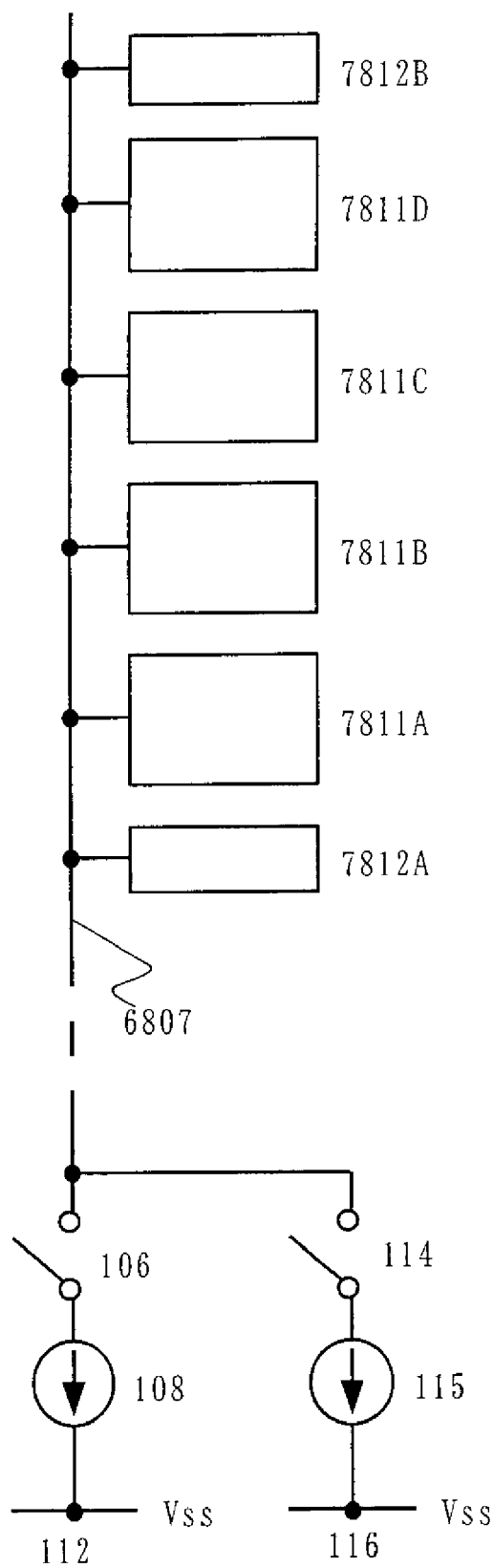
FIG. 79 is a schematic diagram showing a pixel configuration of the invention.

FIG. 78 shows a diagram in which one pixel is connected to the signal line 6807. Here, a circuit 7812 formed of the transistor 3701 and the transistor 3706 and a circuit 7811 formed of the others are considered. In FIG. 78, the circuit 7812 is connected to each pixel. The circuit 7812, however, is not required to be disposed in each pixel. That is, the circuit 7812 may be shared by a plurality of pixels. Further, one pixel may be formed by a circuit 7811. An example of that case is shown in FIG. 79. Pixels 7811A, 7811B, 7811C, and 7811D each formed of the circuit 7811 are connected to the wiring 6807. In this manner, a plurality of pixels each formed of the circuit 7811 may be connected to the wiring 6807 as long as at least one circuit 7812 is connected thereto. In FIG. 79, four pixels each formed of the circuit 7811 and two circuits each formed of the circuit 7812 are connected for simplicity, however, the invention is not limited to this. Each of them may be provided in an arbitrary number.

In this manner, by sharing a circuit formed of the circuit 7812 between pixels, the circuit 7812 is not required to be disposed in each pixel. Therefore, the number of transistors in each pixel can be reduced. As a result, an aperture ratio and the yield in the manufacturing process can be improved.

It is preferable that the circuit 7812 be disposed outside (periphery) of the pixel arrangement like the circuit 7812A and the circuit 7812B. This is because it is inappropriate to dispose the circuit 7812 in the pixel arrangement since pixels are disposed at regular intervals in the pixel arrangement. Therefore, it is preferable to connect between the pixel arrangement and a current source (the basic current source 108, the second basic current source 115 and the like) like the circuit 7812A, or connect at an end of the wiring 6807 like the circuit 7812B. It is more preferable to connect at the end of the wiring 6807 like the circuit 7812B since a current flows through the whole wiring 6807.

Note that sharing the circuit 7812 is not limited in a pixel portion as shown in FIG. 79. It can be applied to a signal line driver circuit as well.

Figure 70:
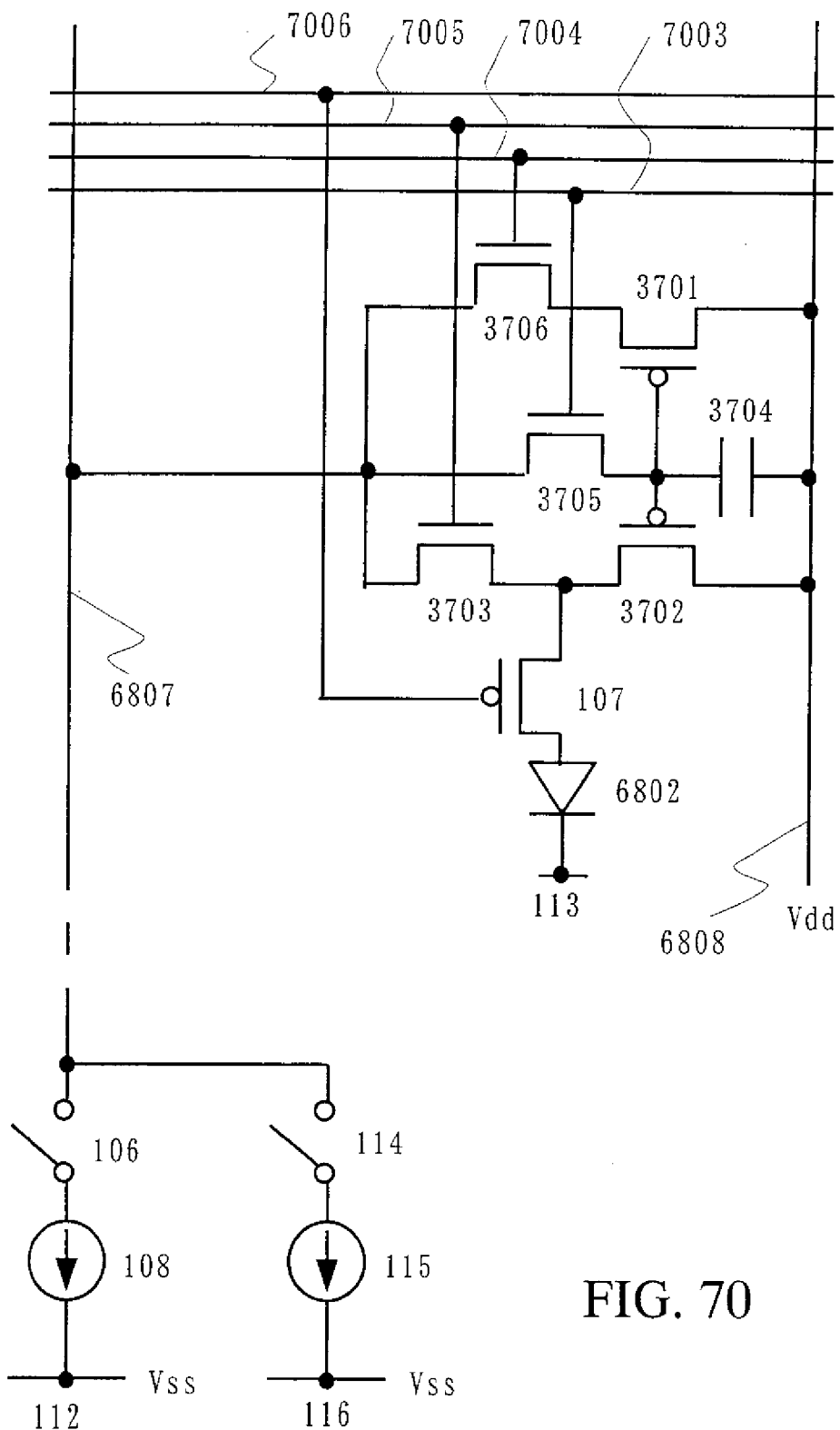
FIG. 70 is a diagram showing a pixel configuration of the invention.

Further, FIG. 70 shows the case of applying the configuration shown in FIG. 47 to a pixel. Each switch (transistor in FIG. 70) is controlled to be ON/OFF by using gate lines 7003 to 7006. Each transistor is turned ON/OFF by controlling the gate lines 7003 to 7005 and a signal is inputted from the signal line 6807. Note that a detailed operation is similar to FIG. 47, therefore, the description is omitted here.

In FIGS. 68, 69, 77, and 78, a plurality of pixels are connected to one signal line 6807, therefore, dedicated switches (selection transistors) 6801, 6901, 7701, and 7801 for selecting a specific pixel are required. In the case of FIG. 70, on the other hand, a normal operation can be obtained by controlling the transistors 3703, 3705, and 3706 even without such switches.

A configuration to be applied to a pixel is not limited to the configurations shown in FIGS. 68 to 70. A pixel can be configured by using various configurations described in Embodiment Modes 1 to 6.

For example, a polarity (conductivity) of the transistors in FIGS. 68 to 70, 77 and 78 is not limited to this. In the case of operating as a switch, in particular, the polarity (conductivity) can be changed without changing the connection.

In FIGS. 68 to 70, 77 and 78, a current flows from a power supply line 6808 to the wiring 113, however, the invention is not limited to this. A current may flow from the wiring 113 to the power supply line 6808 by controlling potentials of the power supply line 6808 and the wiring 113. In that case, however, the EL element 6802 is required to be disposed inversely. This is because a current typically flows from an anode to a cathode in the EL element 6802.

Note that in the EL element, light may emit from either the anode side or the cathode side. Note that in FIGS. 68 to 70, 77 and 78, the gate lines 6803 to 6806, gate lines 6903 to 6907, gate lines 7003 to 7006, gate lines 7703 to 7707, gate lines 7803 to 7807 or the power source line 6808 are used for connecting to each transistor, however, the invention is not limited to this.

Figure 71:
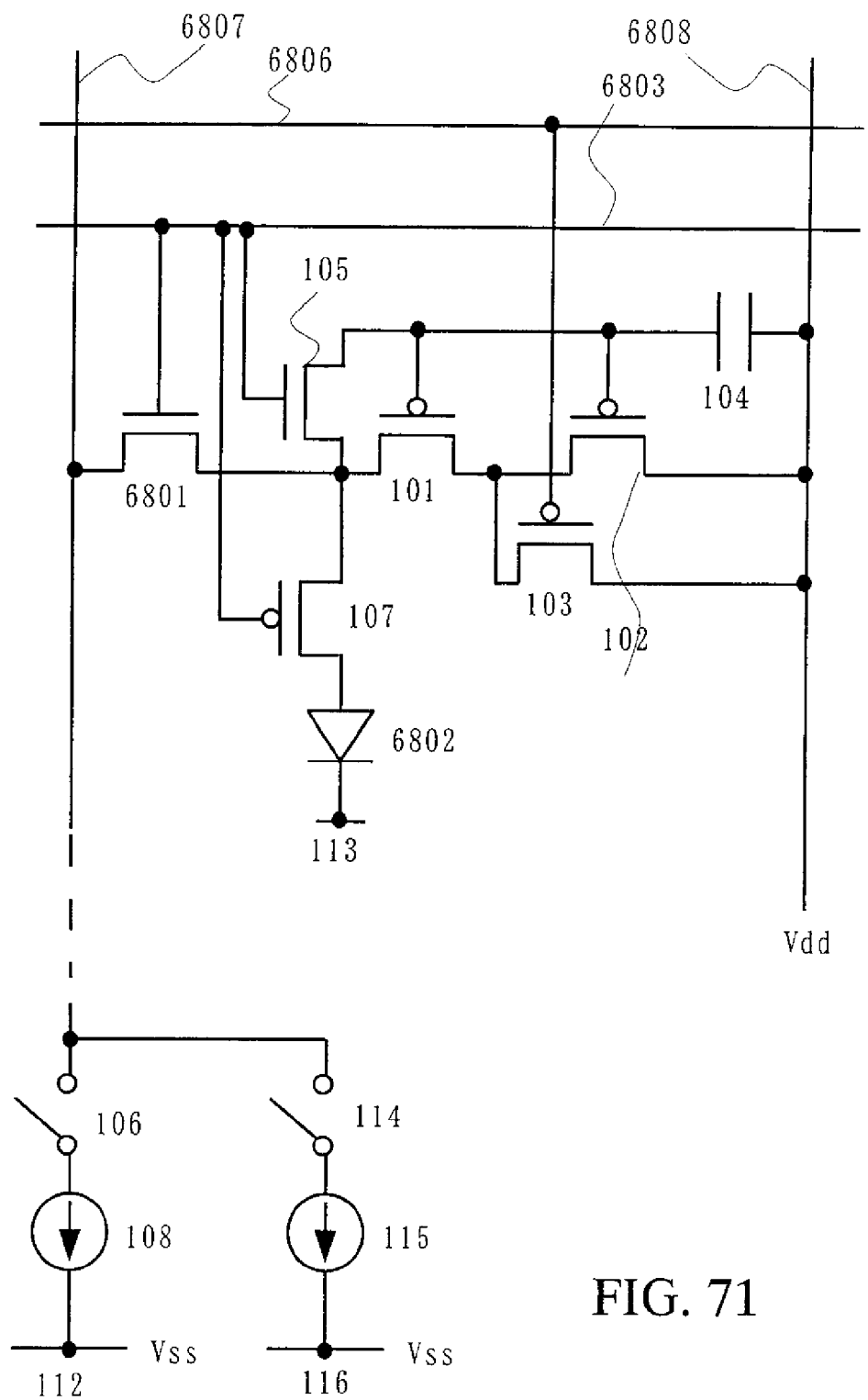
FIG. 71 is a diagram showing a pixel configuration of the invention.
Figure 72:
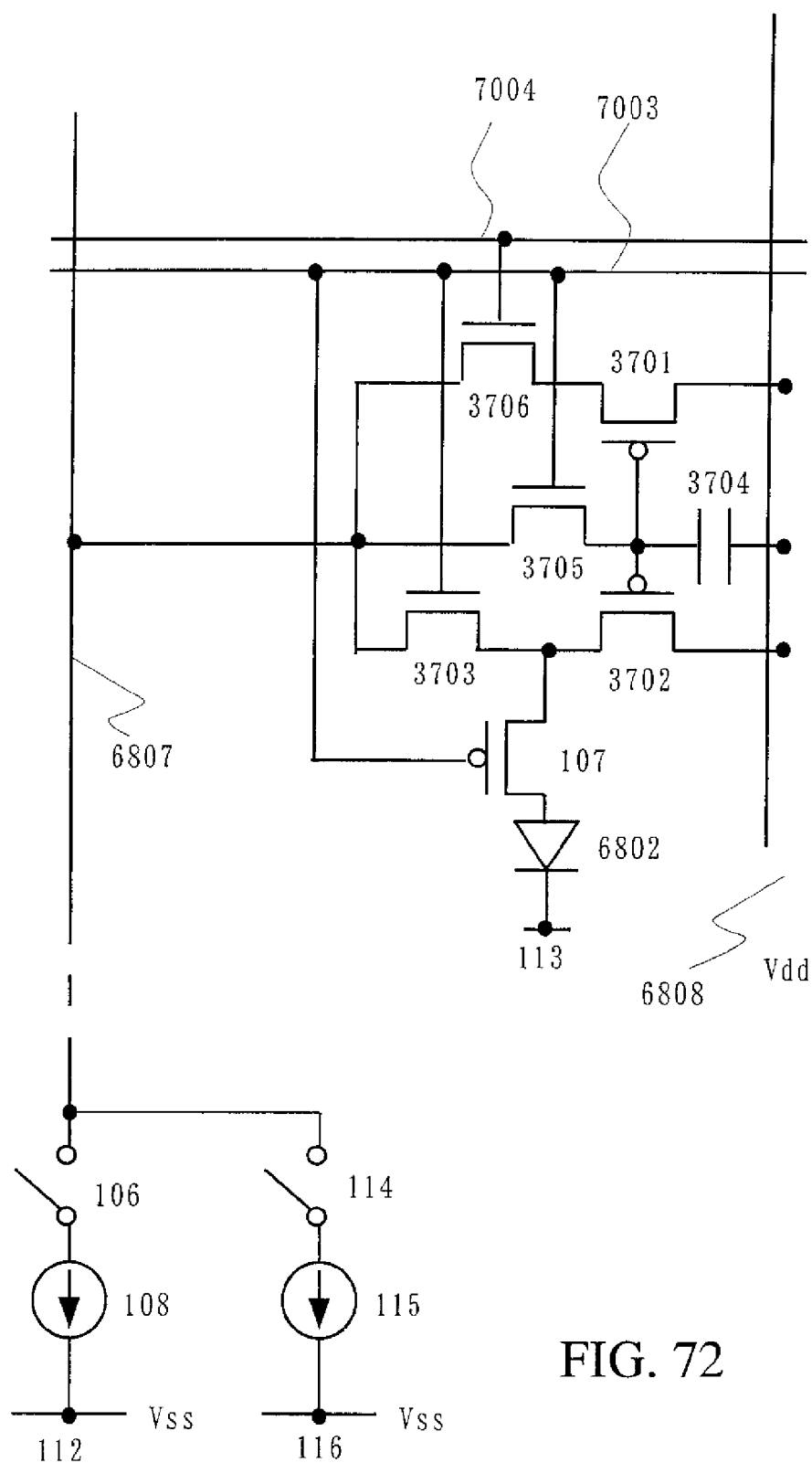
FIG. 72 is a diagram showing a pixel configuration of the invention.

For example, each gate line can be shared by controlling a polarity and operation of a transistor which operates as a switch. By controlling a polarity of each transistor in the circuit of FIG. 68, for example, the number of gate lines can be reduced as shown in FIG. 71. Similarly, the number of gate lines can be reduced as shown in FIG. 72 in the circuit of FIG. 70.

In FIGS. 68 to 70, 77 and 78, the capacitors 104 and 3704 are connected to the power source line 6808, however, they may be connected to another wiring, for example, a gate line of another pixel and the like.

In FIGS. 68 to 70, 77 and 78, the power source line 6808 is disposed, however, it may be removed and substituted by a gate line of another pixel and the like.

In this manner, a pixel can employ various configurations.

In the case of displaying an image by using these pixels, a gray scale can be displayed by using various methods.

For example, an analog video signal (analog current) being inputted from the signal line 6807 to the pixel, a current corresponding to the video signal is supplied to a display element to display a gray scale.

Alternatively, a digital video signal (digital current) being inputted from the signal line 6807 to the pixel, a current corresponding to the video signal is supplied to the display element to display two-level gray scale. In this case, however, a multi-level gray scale is often to be displayed by combining a time gray scale method and an area gray scale method.

For example, when applying the time gray scale method and forcibly making the display element not to emit light, a current is not to be supplied to the display element. Therefore, for example, the transistor 107 is to be turned OFF. Otherwise, by controlling a charge in the capacitors 104 and 3704, a current is not to flow to the display element as a result. In order to realize the aforementioned, a switch and the like may be provided additionally.

In the case where the number of gate lines is to be reduced as shown in FIGS. 71 and 72, the transistor 107 which is to be controlled for forcibly making the display element not to emit light is preferably controlled by a dedicated gate line. Further, in the case of controlling a charge in the capacitors 104 and 3704, a transistor which is capable of changing a charge in the capacitors 104 and 3704 is preferably controlled by a dedicated gate line.

A detailed description on the time gray scale method is omitted here, however, the methods described in Japanese Patent Application No. 2001-5426 and Japanese Patent Application No. 2000-86968 can be referred to.

Figure 73:
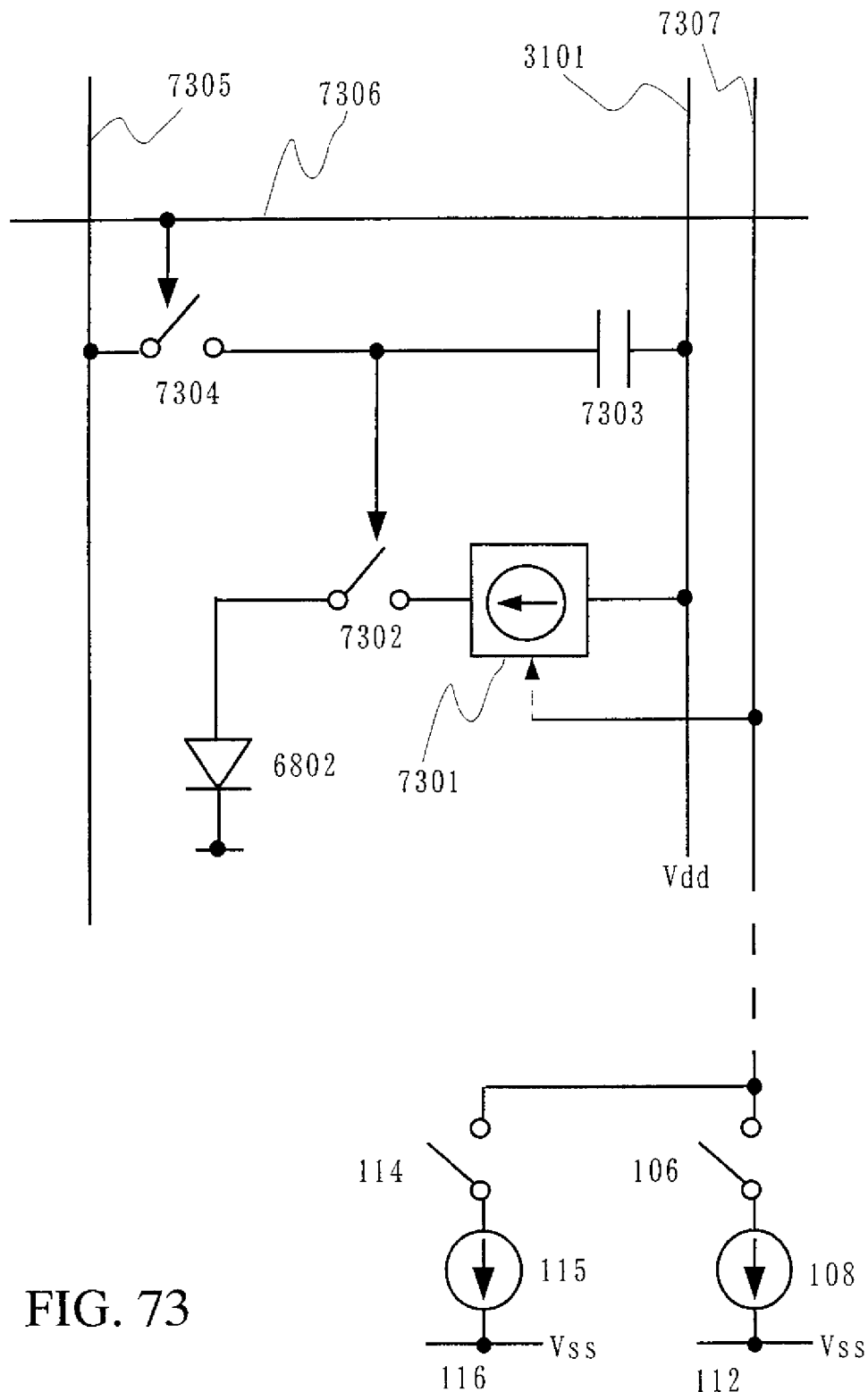
FIG. 73 is a diagram showing a pixel configuration of the invention.

Further, a digital video signal (digital voltage) being inputted from a signal line to a pixel, a current is controlled to be supplied to a display element or not in accordance with the video signal, thereby a two-level gray scale may be displayed. Accordingly, in this case also, a multi-level gray scale is often to be displayed as well by combining the time gray scale method, the area gray scale method and the like. FIG. 73 shows a schematic diagram. A switch 7304 is turned ON/OFF by controlling a gate line 7306, thereby a voltage is inputted from a signal line 7305 to a capacitor 7303. According to that value, a switch 7302 disposed in series to a current source circuit 7301 is controlled to determine to supply a current to the EL element 6802 or not. The invention can be applied to the current source circuit 7301. That is, a current is supplied from the basic current source 108 and the second basic current source 115 to the current source circuit 7301 to perform the precharge operation and the set operation, thereby a current is supplied from the current source circuit 7301 to the EL element 6802 as a load.

Furthermore, by flowing a current from another current source to the basic current source 108 or the second basic current source 115 to perform the precharge operation and the set operation, a current may flow from the basic current source 108 and the second basic current source 115 to the current source circuit 7301 as a load.

Figure 74:
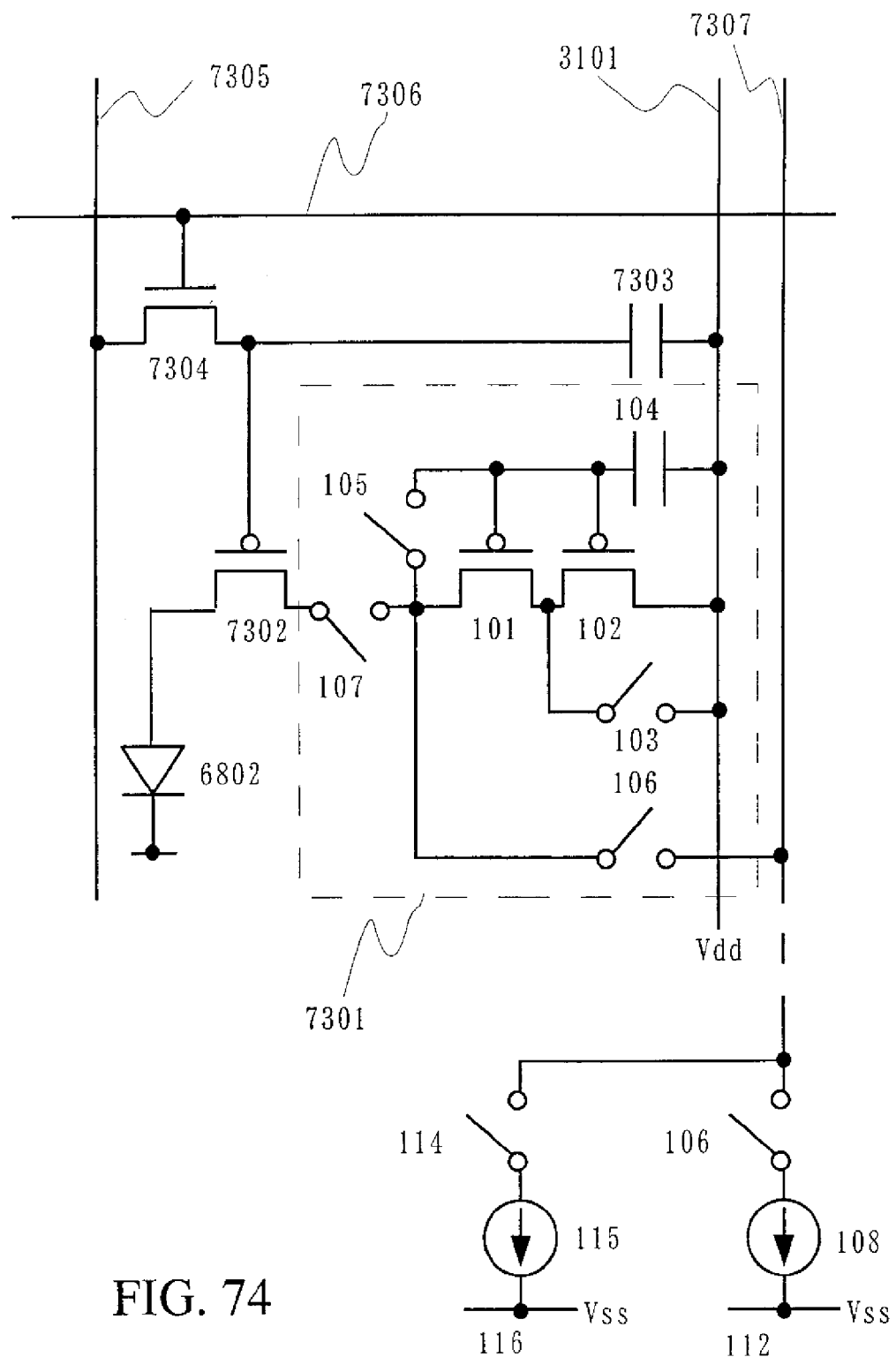
FIG. 74 is a diagram showing a pixel configuration of the invention.
Figure 75:
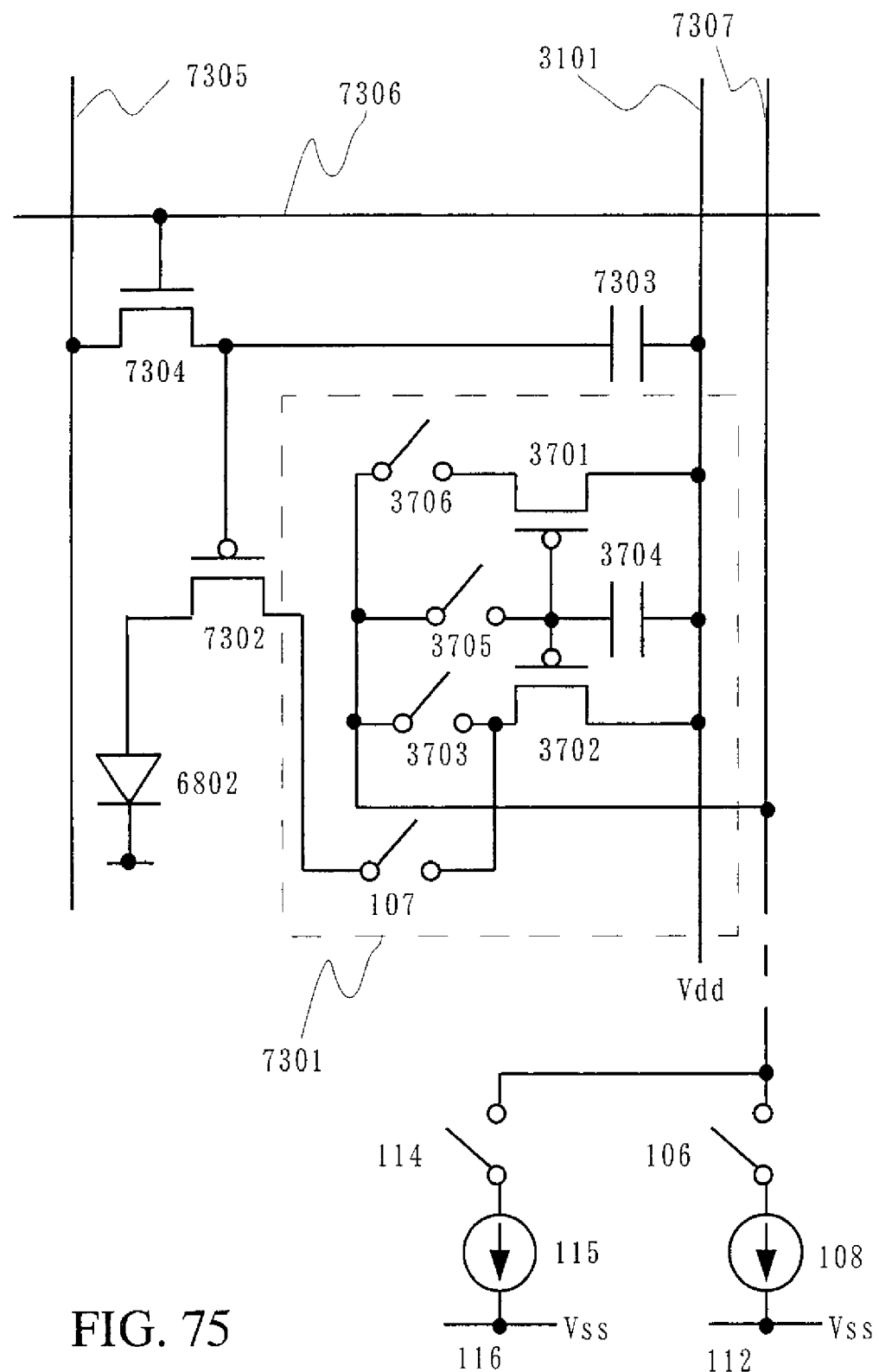
FIG. 75 is a diagram showing a pixel configuration of the invention.

FIG. 74 shows an example of applying the circuit shown in FIG. 1 as the current source circuit 7301 to a pixel and FIG. 75 shows an example of applying the circuit shown in FIG. 47 to a pixel.

Detailed descriptions on the circuits shown in FIGS. 74 and 75 are omitted, however, the configurations and methods described in International Publication WO03/027997, Japanese Patent Application No. 2002-143882, Japanese Patent Application No. 143885, Japanese Patent Application No. 2002-143886, Japanese Patent Application No. 2002-143887, Japanese Patent Application No. 2002-143888 and the like may be applied to.

Note that the configuration is not limited to the circuits shown in FIGS. 74 and 75. Various configurations described in this invention can be applied.

In this manner, by applying the invention to a pixel, the set operation can be performed rapidly even with a small current value to be inputted to the pixel. Provided that the set operation cannot be performed sufficiently, an image cannot be displayed accurately. Therefore, by applying the invention, an image defect can be prevented.

Note that the contents described in this embodiment mode corresponds to the one which utilizes the contents described in Embodiment Modes 1 to 6. Therefore, the contents described in Embodiment Modes 1 to 6 can be applied to this embodiment mode as well.

Embodiment Mode 8

Figure 76:
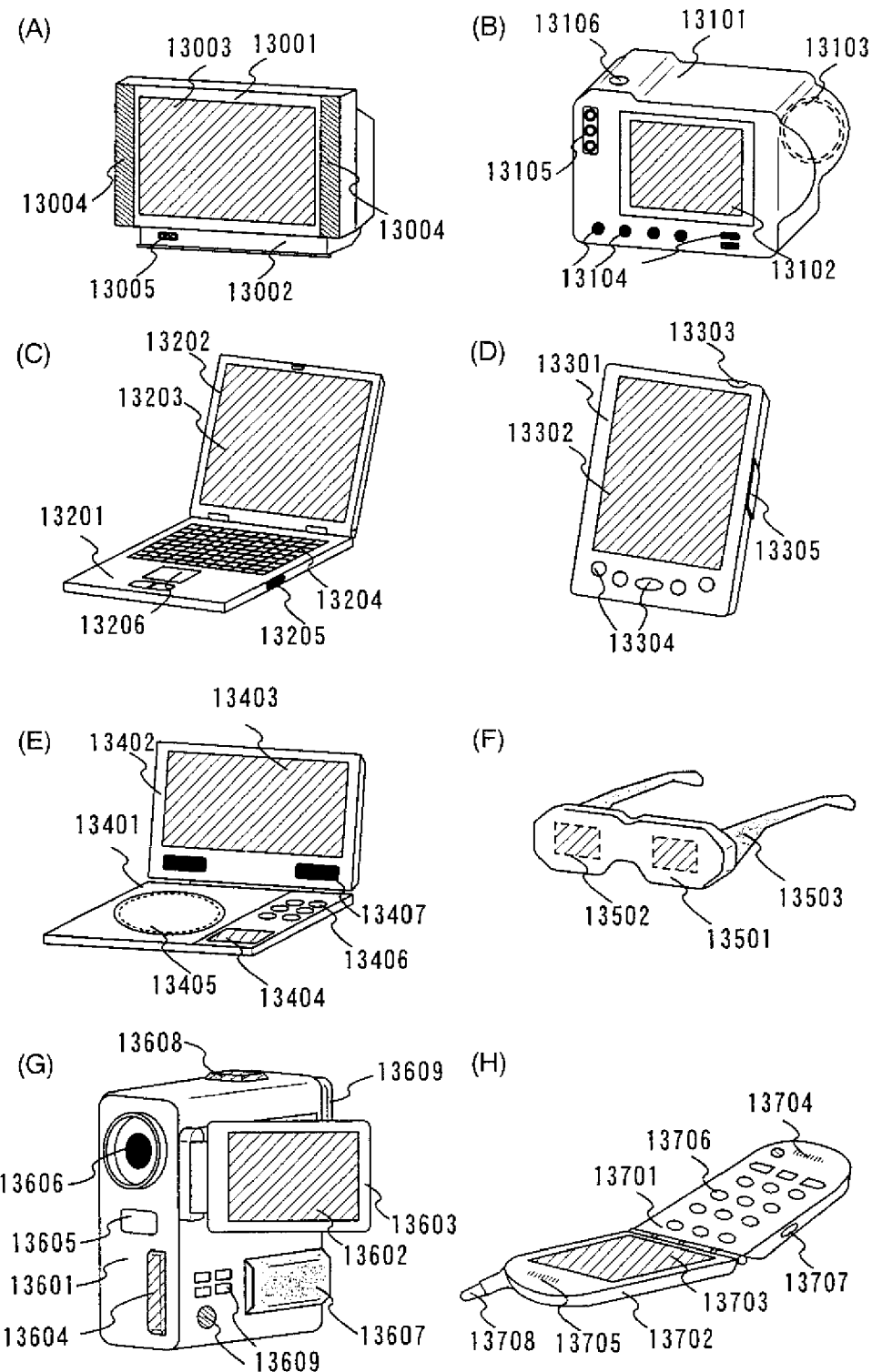
FIGS. 76(A)-76(H) show views of electronic apparatuses to which the invention is applied.

Electronic apparatuses using the invention include a video camera, a digital camera, a goggle type display (head mounted display), a navigation system, an audio reproducing device (car audio, audio component system and the like), a notebook type personal computer, a game machine, a portable information terminal (mobile computer, portable phone, portable game machine, electronic book or the like), an image reproducing device provided with a recording medium (specifically, a device which reproduces a recording medium such as a Digital Versatile Disc (DVD) and has a display to display the image) and the like. Specific examples of those electronic apparatuses are shown in FIG. 76.

FIG. 76(A) illustrates a light emitting device including a housing 13001, a support base 13002, a display portion 13003, speaker portions 13004, a video input terminal 13005 and the like. The invention can be used in an electronic circuit which forms the display portion 13003. According to the invention, the light emitting device shown in FIG. 76(A) is completed. The light emitting device is self-luminous type, therefore, no backlight is required and a thinner display portion than a liquid crystal display can be obtained. Note that the light emitting device refers to all light emitting devices for displaying information, including ones for personal computers, for TV broadcasting reception, and for advertisement.

FIG. 76(B) illustrates a digital still camera including a main body 13101, a display portion 13102, an image receiving portion 13103, operating keys 13104, an external connecting port 13105, a shutter 13106 and the like. The invention can be used in an electronic circuit which forms the display portion 13102. According to the invention, the digital still camera shown in FIG. 76(B) is completed.

FIG. 76(C) illustrates a notebook type personal computer including a main body 13201, a housing 13202, a display portion 13203, a keyboard 13204, an external connecting port 13205, a pointing mouse 13206 and the like. The invention can be used in an electronic circuit which forms the display portion 13203. According to the invention, the notebook type personal computer shown in FIG. 76(C) is completed.

FIG. 76(D) illustrates a mobile computer including a main body 13301, a display portion 13302, a switch 13303, operating keys 13304, an infrared port 13305 and the like. The invention can be used in an electronic circuit which forms the display portion 13302. According to the invention, the mobile computer shown in FIG. 76(D) is completed.

FIG. 76(E) illustrates a portable image reproducing device provided with a recording medium (specifically a DVD reproducing device), including a main body 13401, a housing 13402, a display portion A 13403, a display portion B 13404, a recording medium (such as a DVD) reading portion 13405, an operating key 13406, a speaker portion 13407 and the like. The display portion A 13403 mainly displays image data while the display portion B 13404 mainly displays text data. The invention can be used in an electronic circuit which forms the display portions A 13403 and B 13404. Note that an image reproducing device provided with a recording medium includes a home game machine and the like. According to the invention, a DVD reproducing device shown in FIG. 76(E) is completed.

FIG. 76(F) illustrates a goggle type display (head mounted display) including a main body 13501, a display portion 13502, and an arm portion 13503. The invention can be used in an electronic circuit which forms the display portion 13502. According to the invention, the goggle type display shown in FIG. 76(F) is completed.

FIG. 76(G) illustrates a video camera including a 13601, a display portion 13602, a housing 13603, an external connecting port 13604, a remote control receiving portion 13605, an image receiving portion 13606, a battery 13607, an audio input portion 13608, operating keys 13609 and the like. The invention can be used in an electronic circuit which forms the display portion 13602. According to the invention, the video camera shown in FIG. 76(G) is completed.

FIG. 76(H) illustrates a portable phone including a main body 13701, a housing 13702, a display portion 13703, au audio input portion 13704, an audio output portion 13705, an operating key 13706, an external connecting port 13707, an antenna 13708 and the like. The invention can be used in an electronic circuit which forms the display portion 13703. Note that power consumption of the portable phone can be suppressed by displaying white text on a black background in the display portion 13703. According to the invention, the portable phone shown in FIG. 76(H) is completed.

Provided that a light emission luminance of a light emitting material becomes high in the future, the light including outputted image data can be expanded and projected by using a lens and the like to be used for a front or rear type projector.

Furthermore, the aforementioned electronic apparatuses are becoming to be more used for displaying information distributed through a telecommunication path such as Internet, a CATV (cable television system), and in particular for displaying moving picture information. The display device is suitable for displaying moving pictures since the light emitting material can exhibit high response speed.

It is preferable to display data with as small light emitting portion as possible because the light emitting device consumes power in the light emitting portion. Therefore, in the case of using the light emitting device in the display portions of the portable information terminal, in particular a portable phone or an audio reproducing device which mainly displays text data, it is preferable to drive so that the text data is formed by a light emitting portion with a non-light emitting portion as a background.

As described above, the application range of the invention is so wide that the invention can be used in various fields of electronic apparatuses. The electronic apparatuses described in this embodiment can use any configuration of the semiconductor device described in Embodiment Modes 1 to 6.

What is claimed is:

1. A semiconductor device comprising:
   a load;
   a first constant current source;
   a second constant current source;
   a first transistor;
   a second transistor;
   a first switch electrically connected between the load and the first transistor;
   a second switch electrically connected between the first constant current source and the first transistor;
   a third switch electrically connected between the second constant current source and the first transistor;
   a fourth switch electrically connected between a gate electrode of the first transistor and a drain region of the first transistor;
   a fifth switch electrically connected between the gate electrode of the first transistor and a gate electrode of the second transistor; and
   a sixth switch, electrically connected between the gate electrode of the second transistor and a third power source,
   wherein the load, the first transistor and the second transistor are electrically connected in series between a first power source and a second power source,
   wherein the load, the first constant current source and the second constant current source are electrically connected in parallel between the first power source and the first transistor,
   wherein the gate electrode of the first transistor is electrically connected to the second power source.

2. The semiconductor device according to claim 1, wherein the load is a display element.

3. The semiconductor device according to claim 1, wherein the load is a signal line.

4. The semiconductor device according to claim 1, further comprising a capacitor electrically connected between the gate electrode of the first transistor and the second power source.

5. The semiconductor device according to claim 1, wherein a potential of the third power source and a potential of the first power source are the same potential.

6. The semiconductor device according to claim 1, wherein a potential of the second power source is higher than a potential of the third power source.

7. The semiconductor device according to claim 1, wherein widths of channel regions of the first and the second transistors are equal to each other.

8. The semiconductor device according to claim 1, wherein a length of a channel region of the first transistor is longer than a length of a channel region of the second transistor.

9. The semiconductor device according to claim 1, wherein the first to sixth switches include any one of a transistor, a diode, a CMOS circuit and a logic circuit.

10. A semiconductor device comprising:
    a load electrically connected to a first power source;
    a first constant current source electrically connected to the first power source;
    a second constant current source electrically connected to the first power source;
    a first transistor electrically connected to a second power source;
    a second transistor electrically connected to a third power source;
    a first switch electrically connected between the load and the first transistor;
    a second switch electrically connected between the first constant current source and the first transistor;
    a third switch electrically connected between the second constant current source and the first transistor;
    a fourth switch electrically connected between the first transistor and the load;
    a fifth switch electrically connected between the second transistor and the load; and
    a sixth switch electrically connected between the load and a gate electrode of the first transistor,
    wherein a gate electrode of the second transistor is electrically connected to the gate electrode of the first transistor, and
    wherein the load, the first constant current source and the second constant current source are electrically connected in parallel between the first power source and the first transistor.

11. The semiconductor device according to claim 10, wherein the load is a display element.

12. The semiconductor device according to claim 10, wherein the load is a signal line.

13. The semiconductor device according to claim 10, further comprising a capacitor electrically connected between the gate electrode of the first transistor and the second power source.

14. The semiconductor device according to claim 10, wherein a potential of the second power source and a potential of the third power source are the same potential.

15. The semiconductor device according to claim 10, wherein a potential of the second power source is higher than a potential of the first power source.

16. The semiconductor device according to claim 10, wherein widths of channel regions of the first and the second transistors are equal to each other.

17. The semiconductor device according to claim 10, wherein a length of a channel region of the first transistor is longer than a length of a channel region of the second transistor.

18. The semiconductor device according to claim 10, wherein the first to sixth switches include any one of a transistor, a diode, a CMOS circuit and a logic circuit.

19. A semiconductor device comprising:
    a load electrically connected to a first power source;
    a first constant current source electrically connected to the first power source;
    a second constant current source electrically connected to the first power source;
    a first transistor electrically connected to a second power source;
    a second transistor electrically connected to a third power source;
    a first switch electrically connected between the load and the first transistor;
    a second switch electrically connected between the first constant current source and the first transistor;
    a third switch electrically connected between the second constant current source and the first transistor;

a fourth switch electrically connected between the first transistor and the load;
a fifth switch electrically connected between the second transistor and the load; and
a sixth switch electrically connected between the load and a gate electrode of the first transistor,
wherein a gate electrode of the second transistor is electrically connected to a drain region of the second transistor, and
wherein the load, the first constant current source and the second constant current source are electrically connected in parallel between the first power source and the first transistor.

20. The semiconductor device according to claim 19, wherein the load is a display element.

21. The semiconductor device according to claim 19, wherein the load is a signal line.

22. The semiconductor device according to claim 19, further comprising a capacitor electrically connected between the gate electrode of the first transistor and the second power source.

23. The semiconductor device according to claim 19, wherein a potential of the second power source and a potential of the third power source are the same potential.

24. The semiconductor device according to claim 19, wherein a potential of the first power source is higher than a potential of the second power source.

25. The semiconductor device according to claim 19, wherein widths of channel regions of the first and the second transistors are equal to each other.

26. The semiconductor device according to claim 19, wherein a length of a channel region of the first transistor is longer than a length of a channel region of the second transistor.

27. The semiconductor device according to claim 19, wherein the first to sixth switches include any one of a transistor, a diode, a CMOS circuit and a logic circuit.

* * * * *